(12) United States Patent
Yamaguchi et al.

(10) Patent No.: US 8,410,418 B2
(45) Date of Patent: Apr. 2, 2013

(54) SOLID-STATE IMAGING DEVICE, METHOD FOR MANUFACTURING THE SAME, AND IMAGING APPARATUS

(75) Inventors: Tetsuji Yamaguchi, Kanagawa (JP); Yuko Ohgishi, Tokyo (JP); Takashi Ando, Kanagawa (JP); Harumi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 601 days.

(21) Appl. No.: 12/598,691

(22) PCT Filed: Aug. 20, 2007

(86) PCT No.: PCT/JP2007/066116
§ 371 (c)(1),
(2), (4) Date: Feb. 11, 2010

(87) PCT Pub. No.: WO2008/139644
PCT Pub. Date: Nov. 20, 2008

(65) Prior Publication Data
US 2010/0193669 A1     Aug. 5, 2010

(30) Foreign Application Priority Data

May 7, 2007   (JP) ................................. 2007-122370

(51) Int. Cl.
*H01L 27/146* (2006.01)
*H01L 31/18* (2006.01)
(52) U.S. Cl. ..................................... 250/214.1; 257/432
(58) Field of Classification Search ............... 250/214.1, 250/214 R; 257/431–432, 291
See application file for complete search history.

(56) References Cited

U.S. PATENT DOCUMENTS

| | | | |
|---|---|---|---|
| 6,147,390 A | 11/2000 | Nakano et al. | |
| 2003/0201495 A1* | 10/2003 | Doderer et al. | ............... 257/347 |
| 2005/0287739 A1* | 12/2005 | Mouli | ........................... 438/257 |
| 2006/0033827 A1 | 2/2006 | Kanbe et al. | |
| 2006/0244088 A1 | 11/2006 | Inagaki et al. | |

FOREIGN PATENT DOCUMENTS

| | | |
|---|---|---|
| JP | 01-256168 | 10/1989 |
| JP | 1992-038872 | 10/1992 |
| JP | 1993-335546 | 12/1993 |
| JP | 06-268243 | 9/1994 |
| JP | 2005-093897 | 4/2005 |
| JP | 2006-054263 | 2/2006 |

(Continued)

OTHER PUBLICATIONS

Japanese Office Action issued on Aug. 9, 2011 in connection with counterpart JP Application No. 2010-146816.

(Continued)

*Primary Examiner* — Seung C Sohn
(74) *Attorney, Agent, or Firm* — SNR Denton US LLP

(57) ABSTRACT

Realization of an adequate hole accumulation layer and reduction in dark current are allowed to become mutually compatible. A solid-state imaging device 1 having a light-receiving portion 12 to photoelectrically convert incident light is characterized by including a film 21, which is disposed on a light-receiving surface 12s of the above-described light-receiving portion 12 and which lowers an interface state, and a film 22, which is disposed on the above-described film 21 to lower the interface state and which has a negative fixed charge, wherein a hole accumulation layer 23 is disposed on the light-receiving surface 12s side of the light-receiving portion 12.

16 Claims, 37 Drawing Sheets

FOREIGN PATENT DOCUMENTS

| | | |
|---|---|---|
| JP | 2006-269789 | 10/2006 |
| JP | 2006-270292 | 10/2006 |
| JP | 2007-088305 | 4/2007 |

OTHER PUBLICATIONS

Japanese Patent Office; JP Application No. 2010-146814; Office Action issued Feb. 8, 2011, 2 pages.

Japanese Patent Office; JP Application No. 2010-146815; Office Action issued Feb. 8, 2011, 2 pages.

Japanese Patent Office; JP Application No. 2010-146816; Office Action issued Feb. 8, 2011, 2 pages.

International Search Report dated May 7, 2007 in connection with PCT/JP2007/066116.

* cited by examiner

FIG. 2
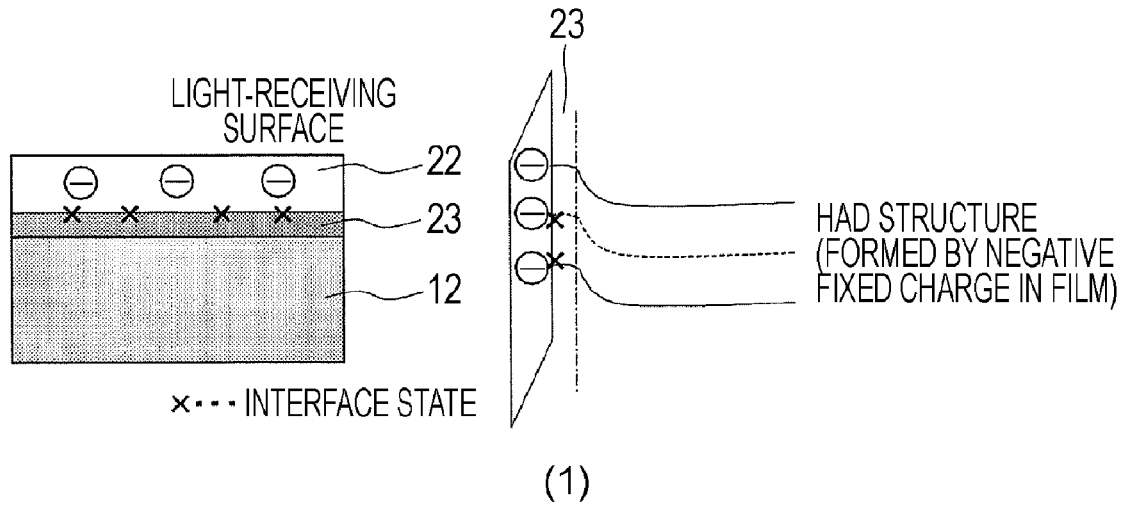
(1)
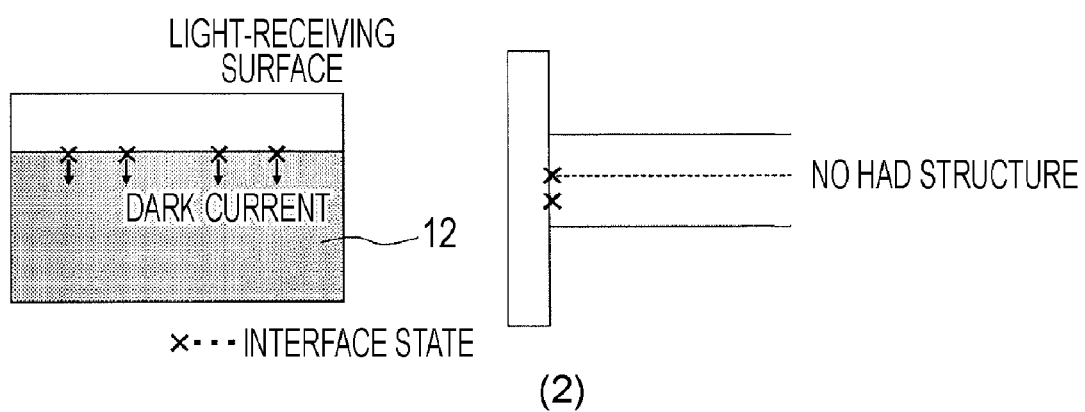
(2)
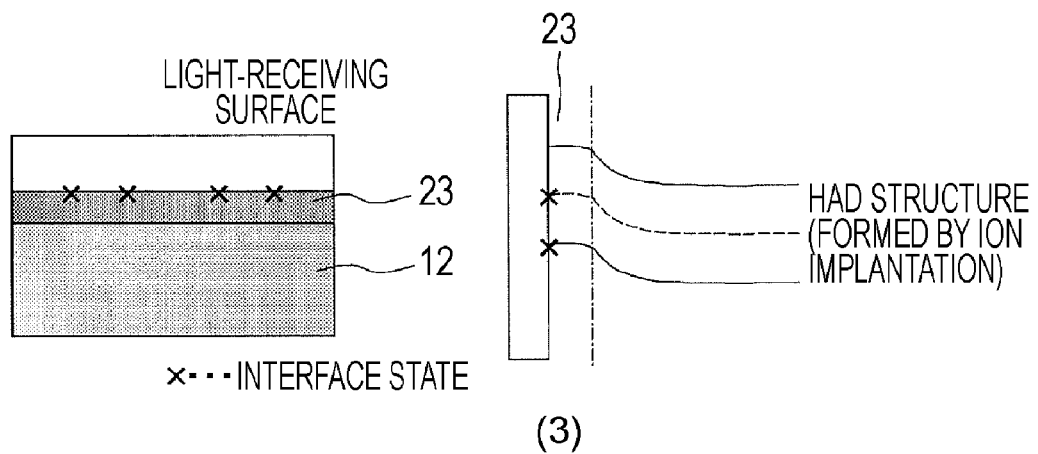
(3)

NEGATIVE VOLTAGE

FIG. 8
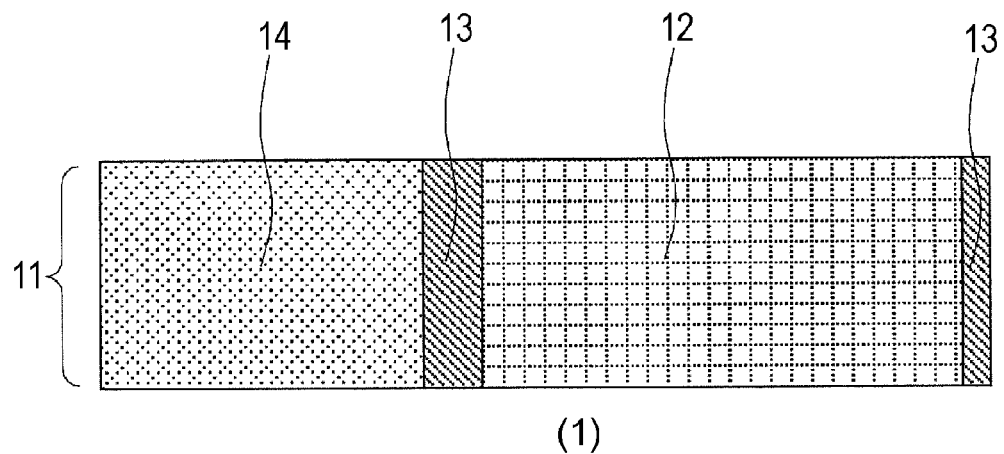
(1)
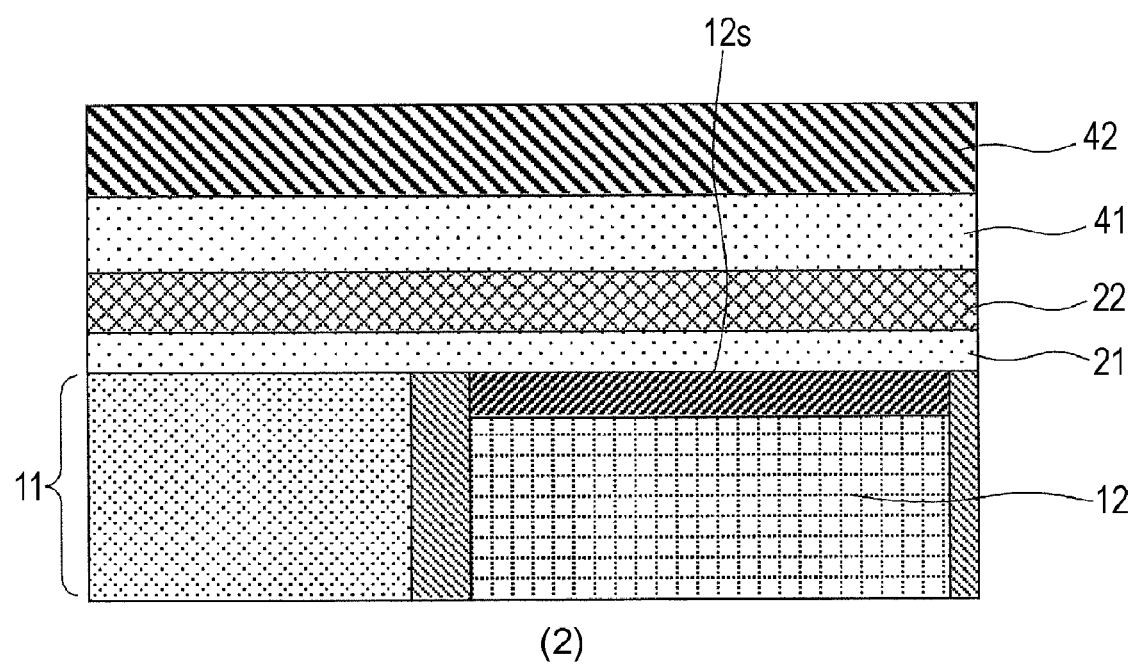
(2)

FIG. 9
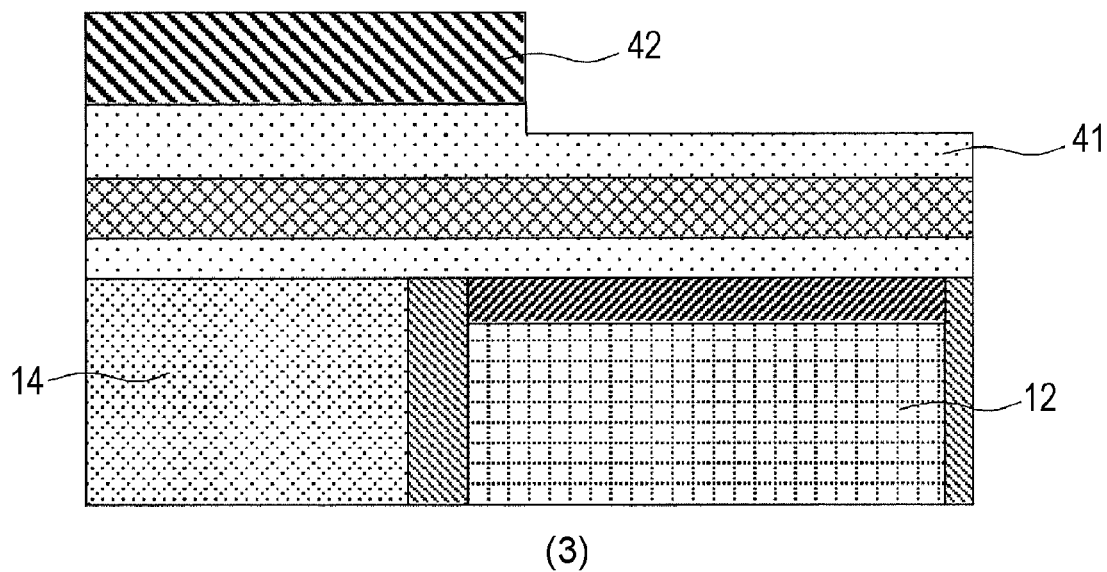
(3)
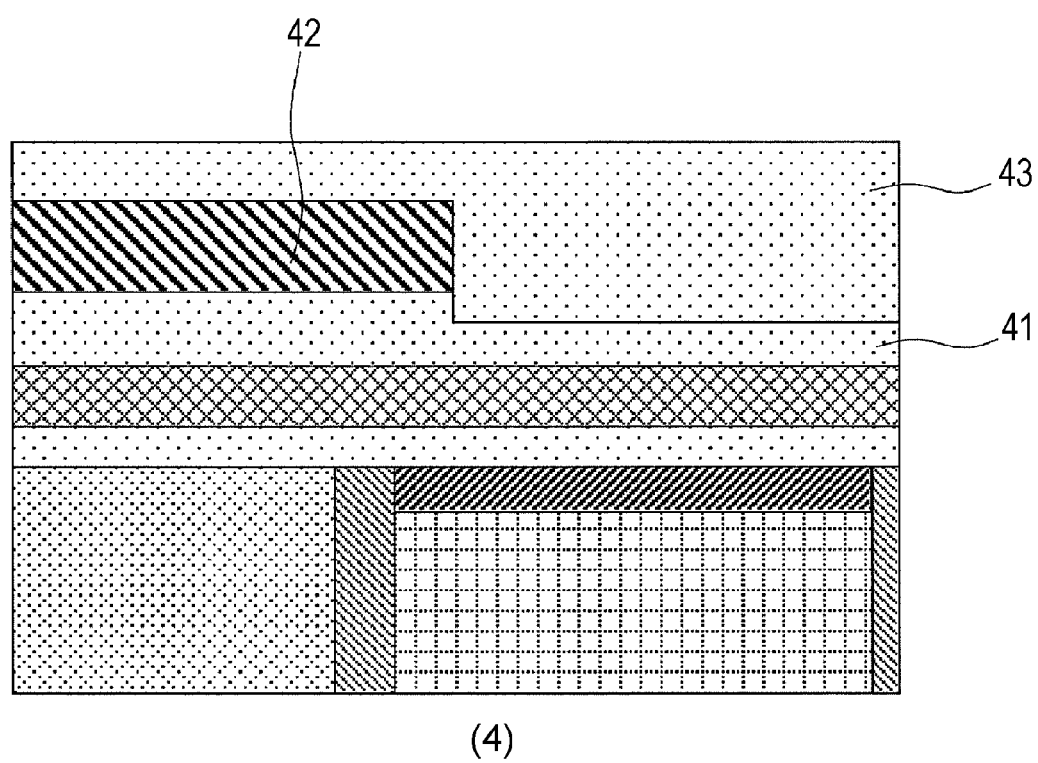
(4)

(5)

FIG. 11
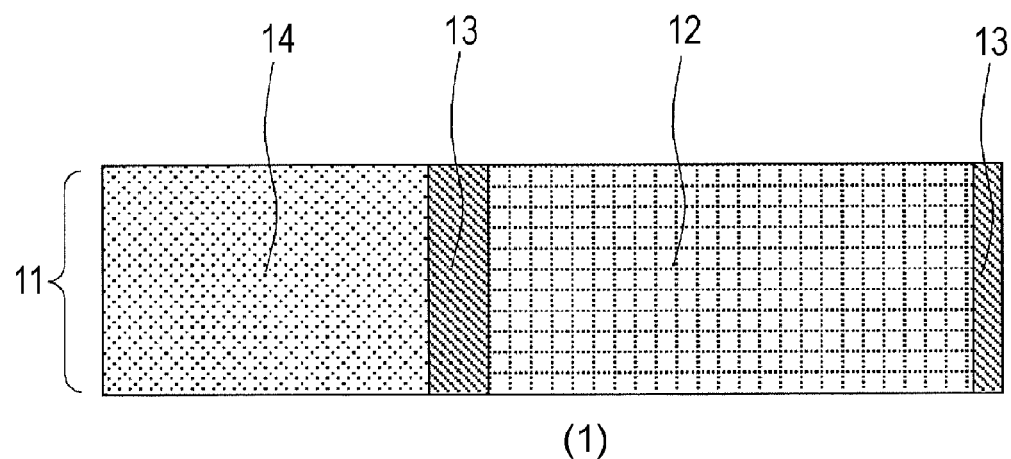
(1)
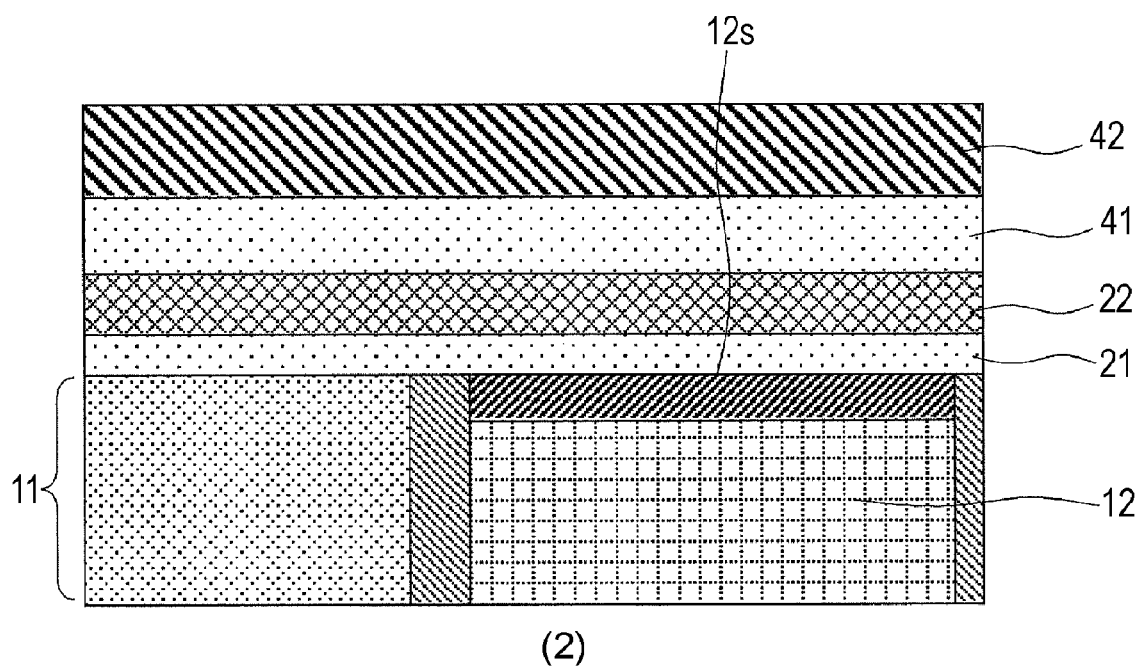
(2)

FIG. 12
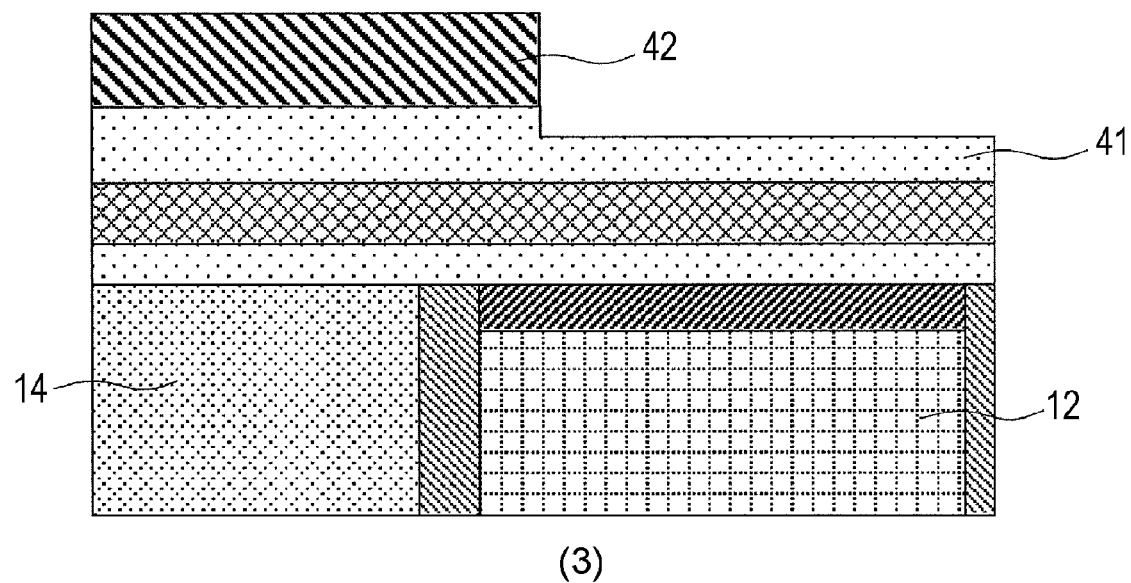
(3)
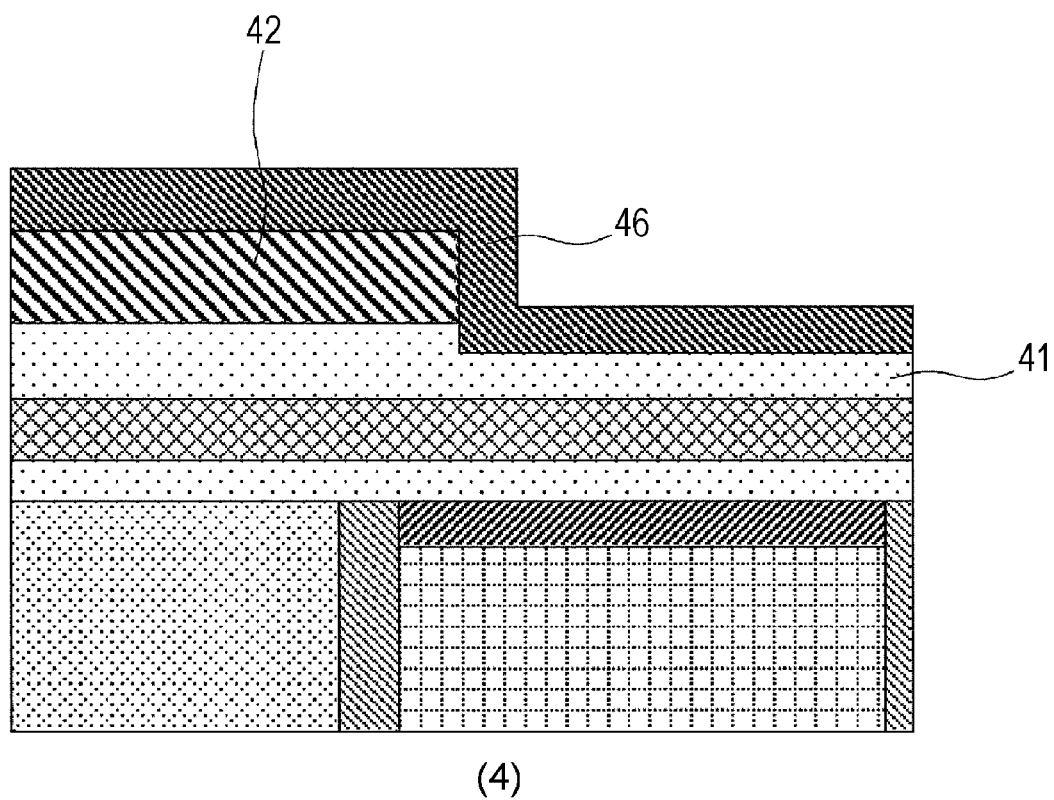
(4)

(5)

FIG. 14
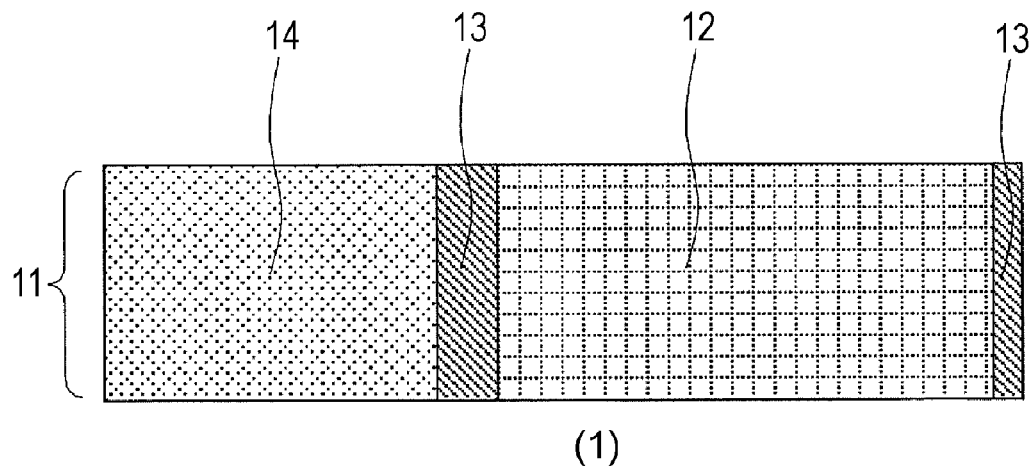
(1)
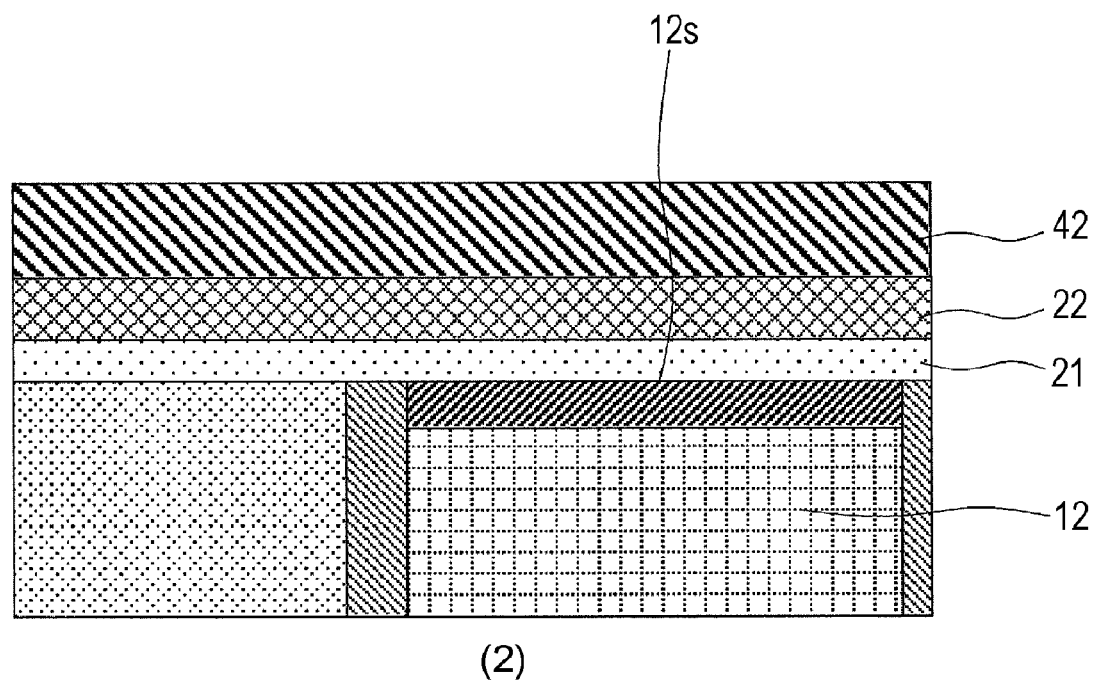
(2)

FIG. 15
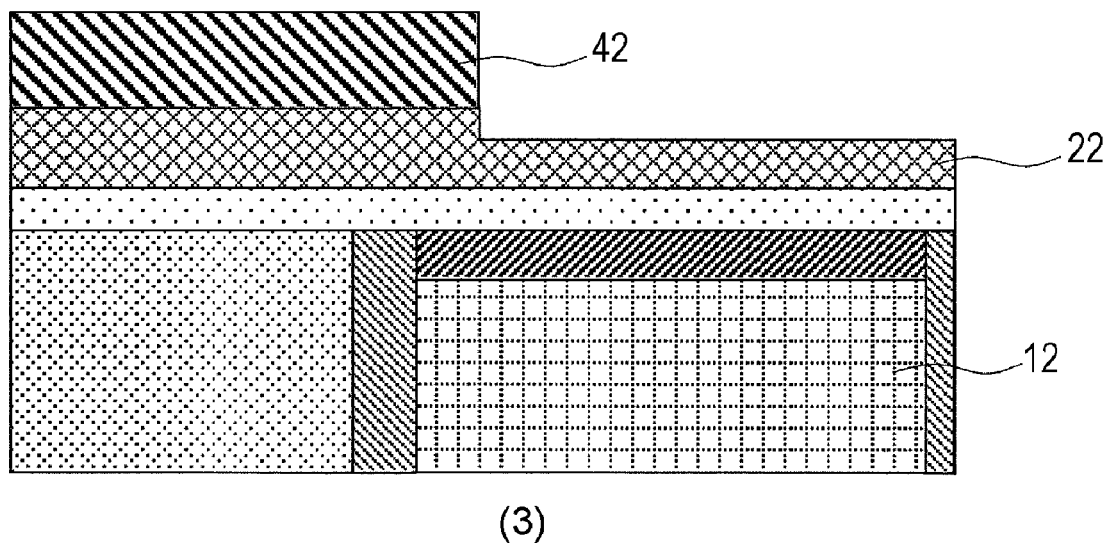
(3)
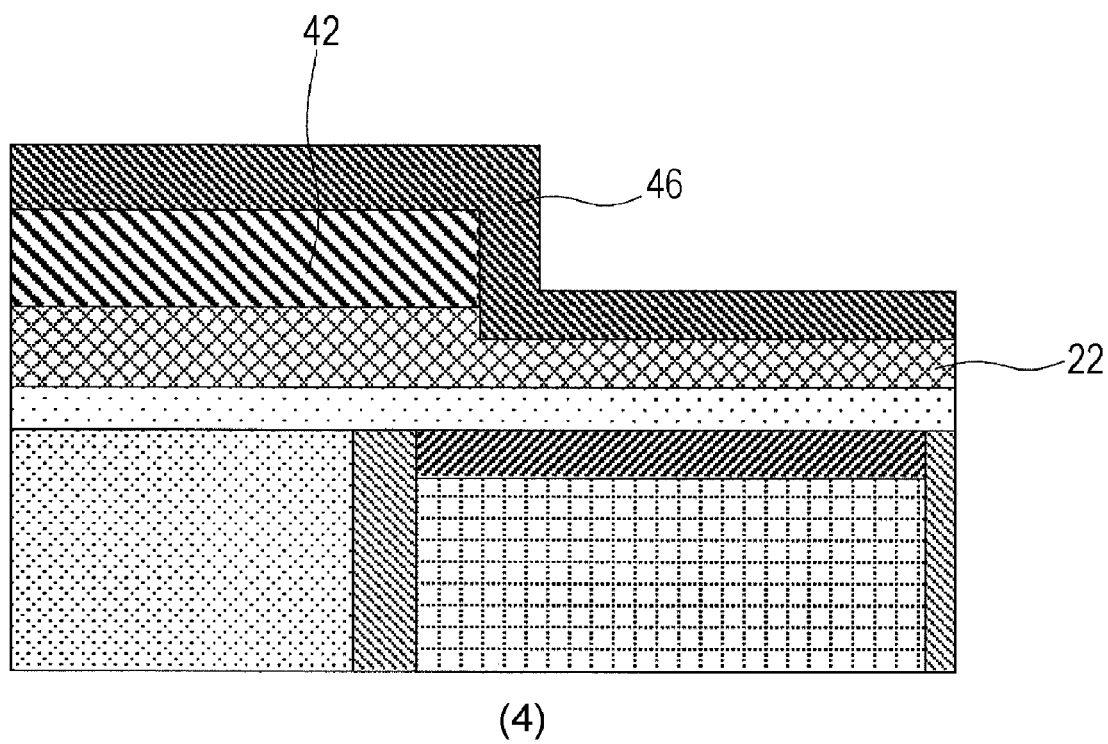
(4)

(5)

FIG. 17
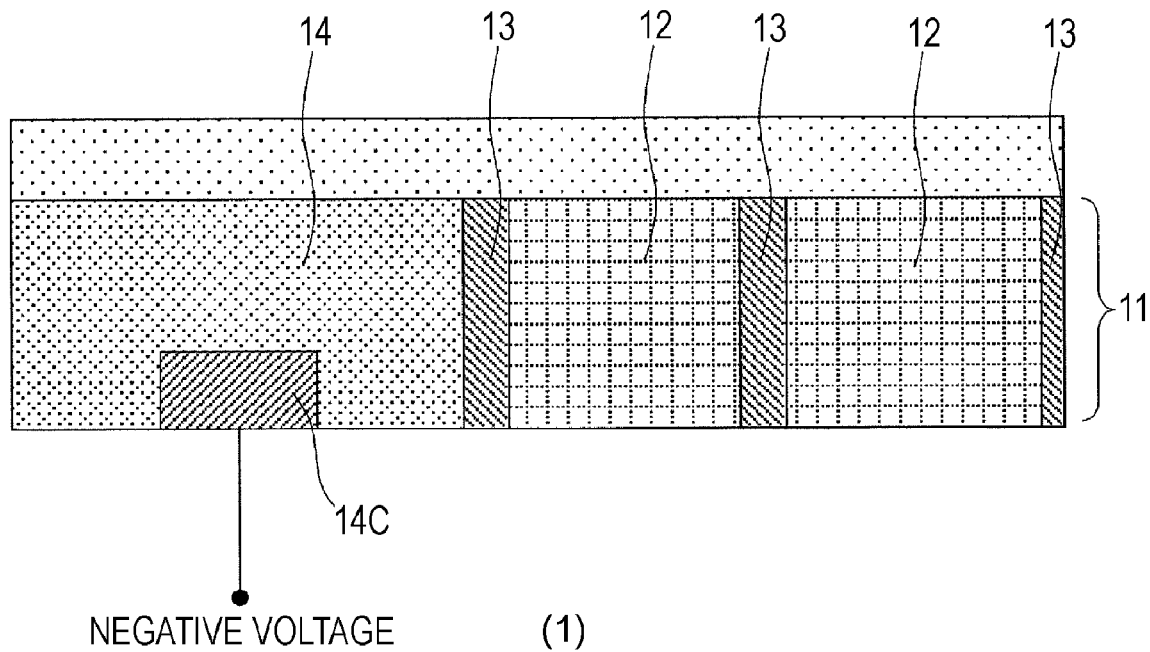
(1)
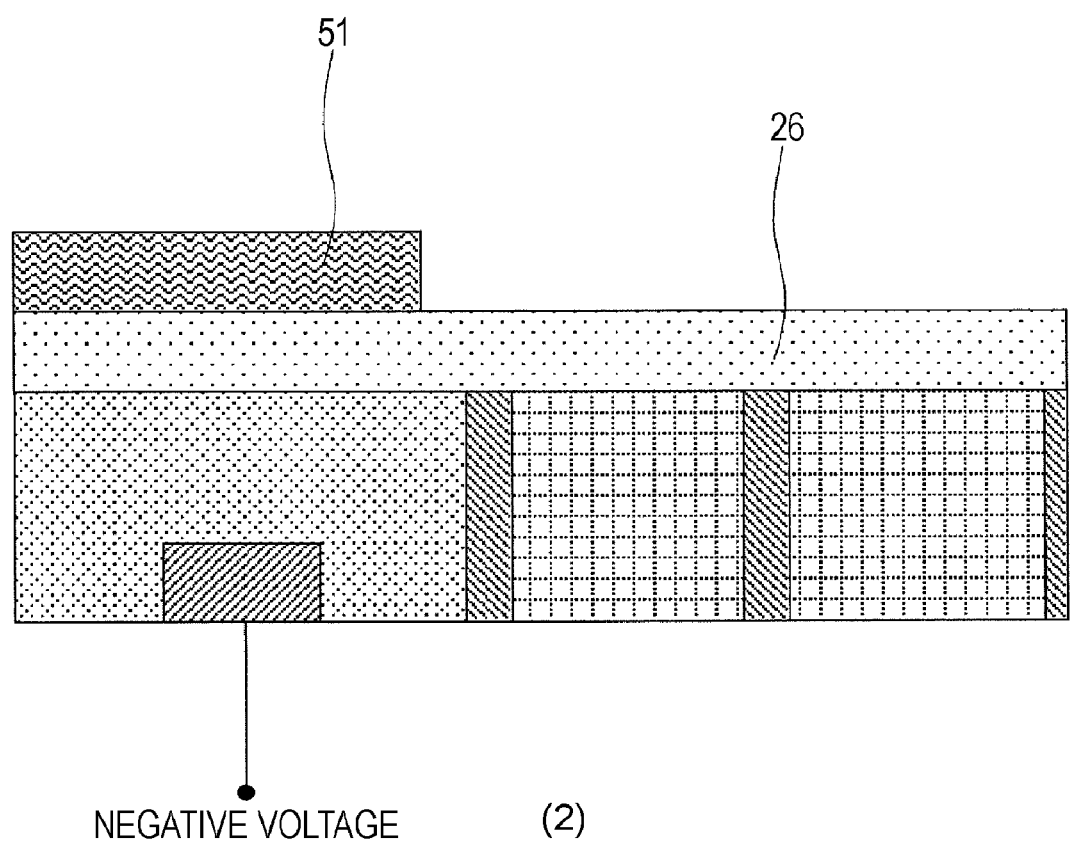
(2)

FIG. 18
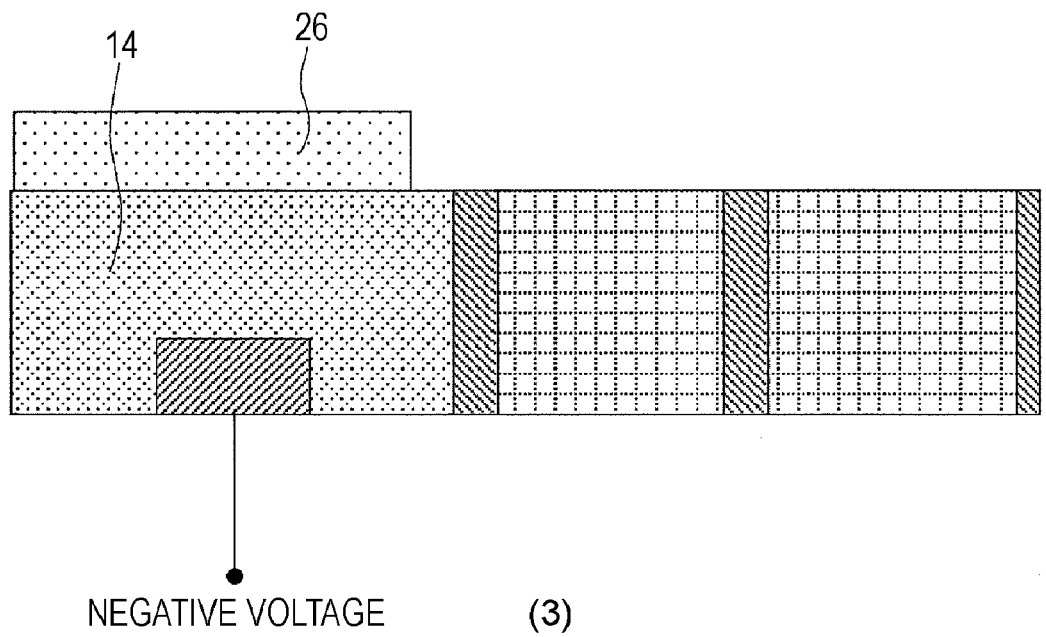
NEGATIVE VOLTAGE (3)
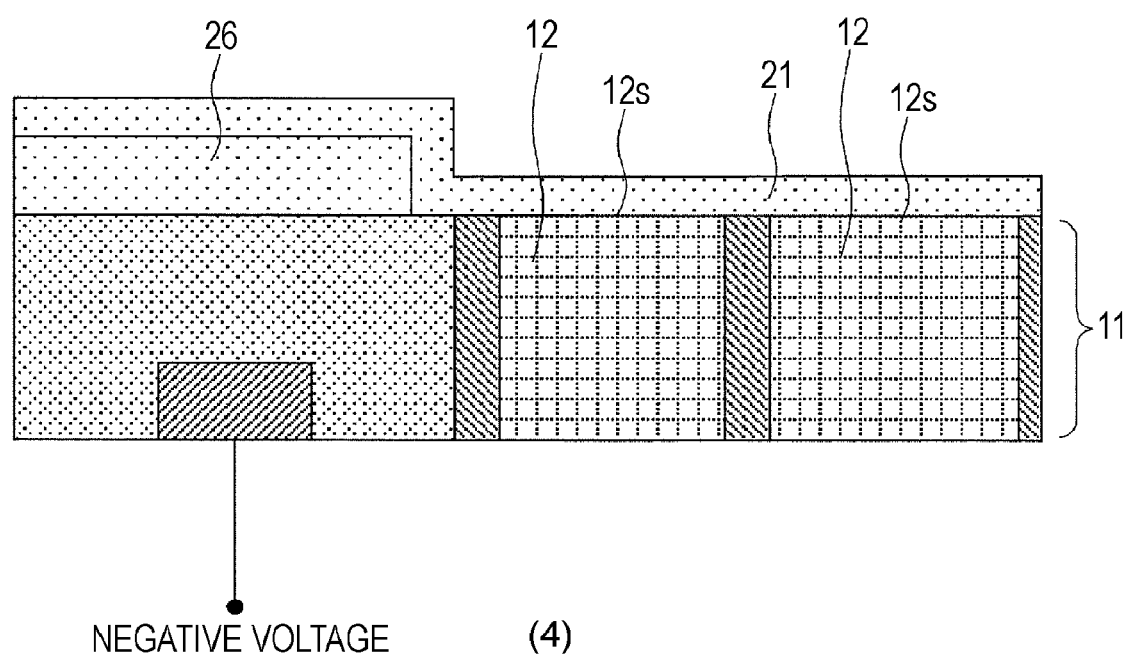
NEGATIVE VOLTAGE (4)

FIG. 20
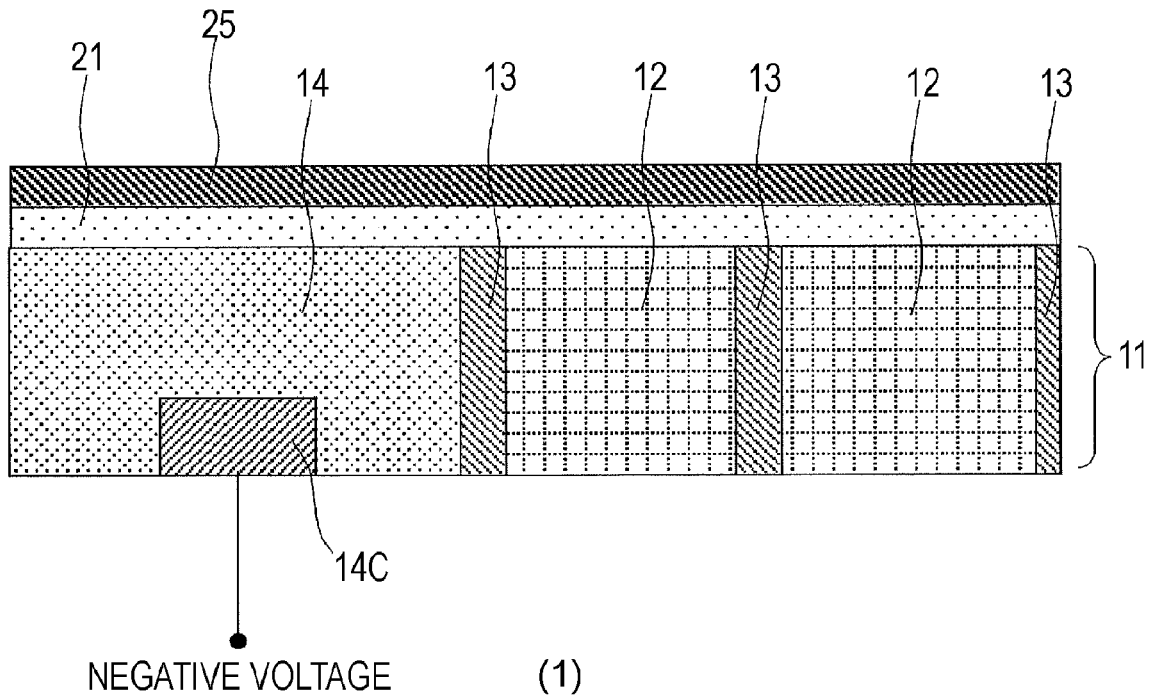
(1)
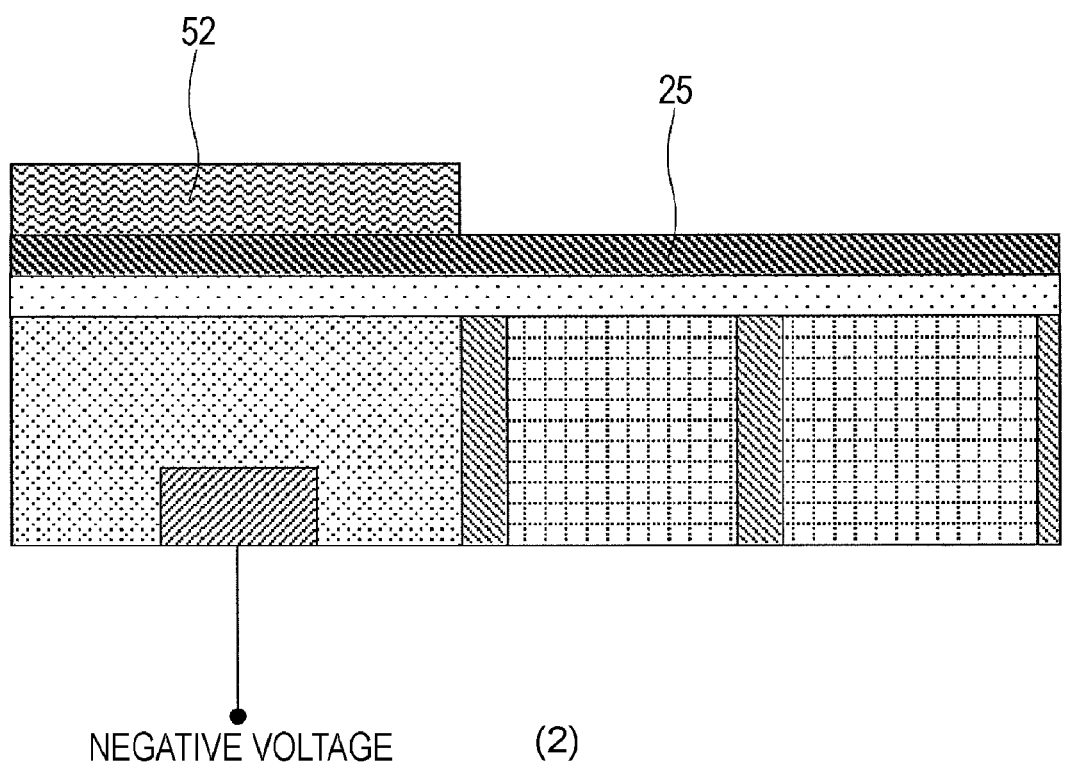
(2)

FIG. 21
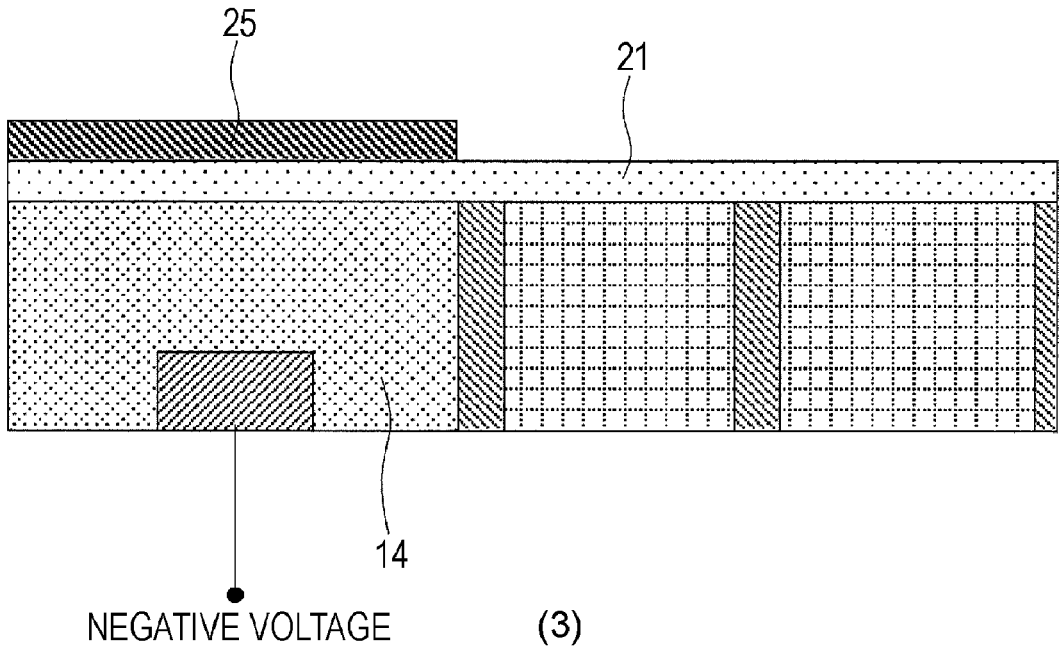
NEGATIVE VOLTAGE　　　(3)
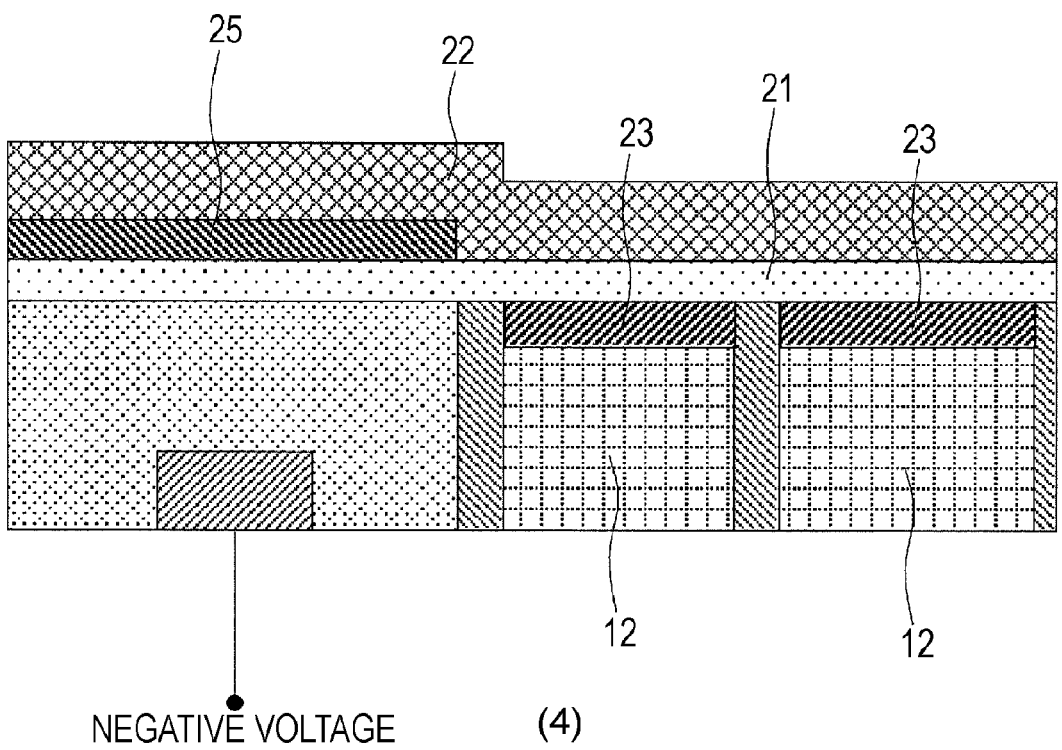
NEGATIVE VOLTAGE　　　(4)

FIG. 27
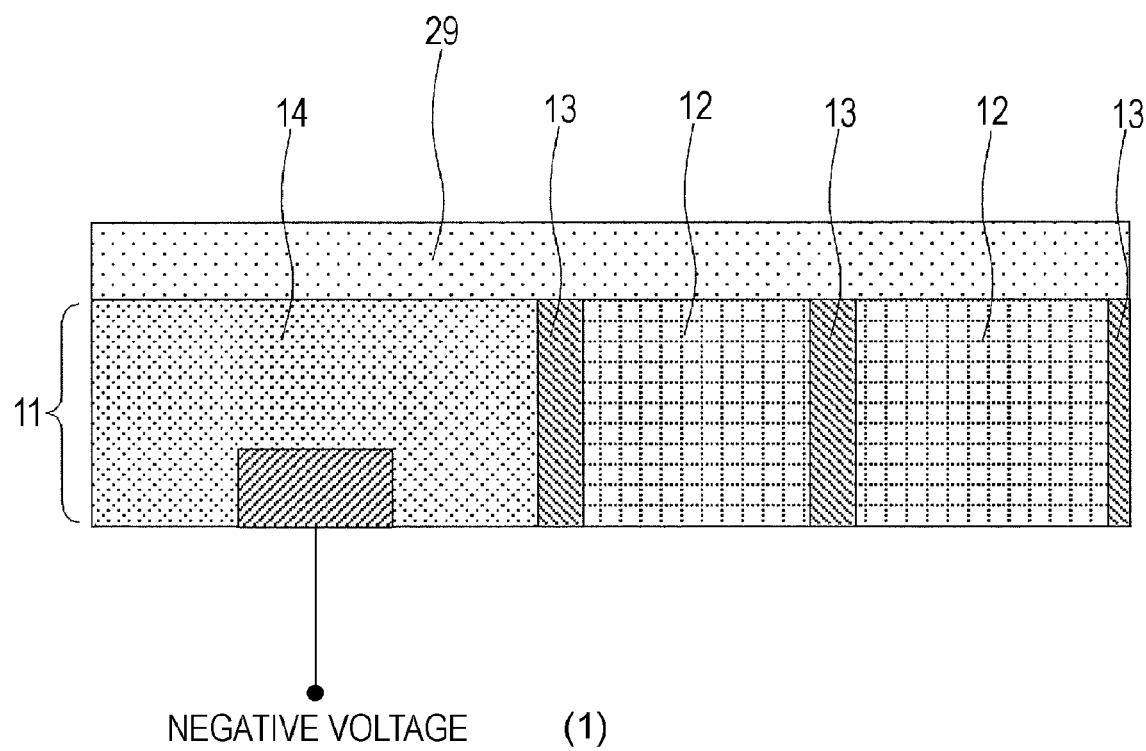
NEGATIVE VOLTAGE (1)
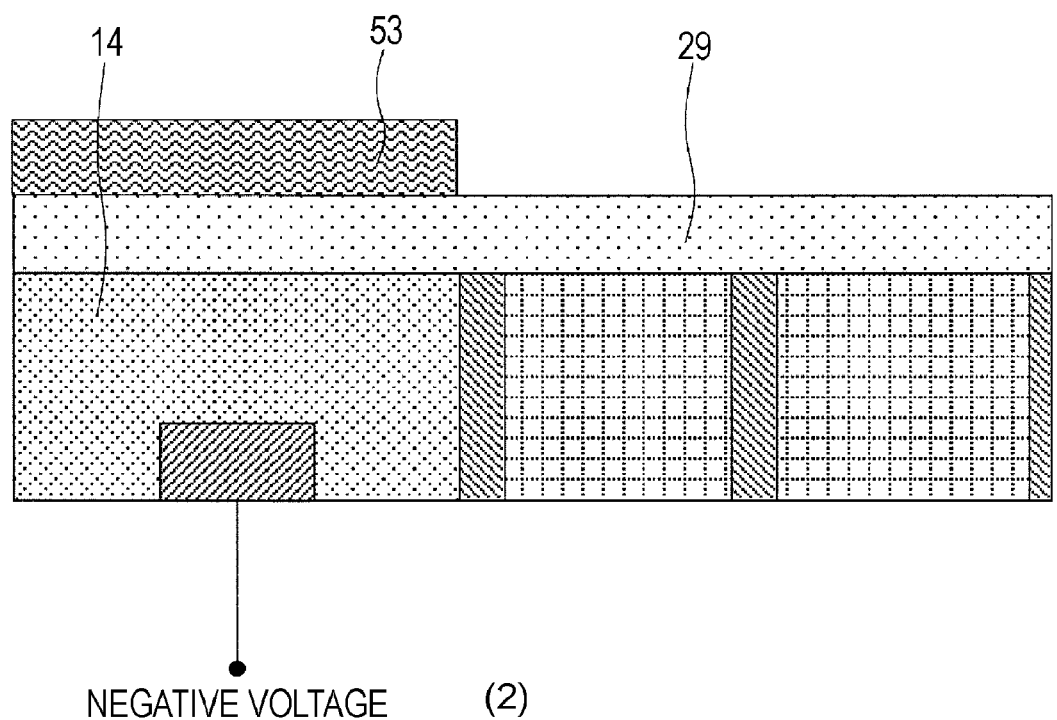
NEGATIVE VOLTAGE (2)

FIG. 28
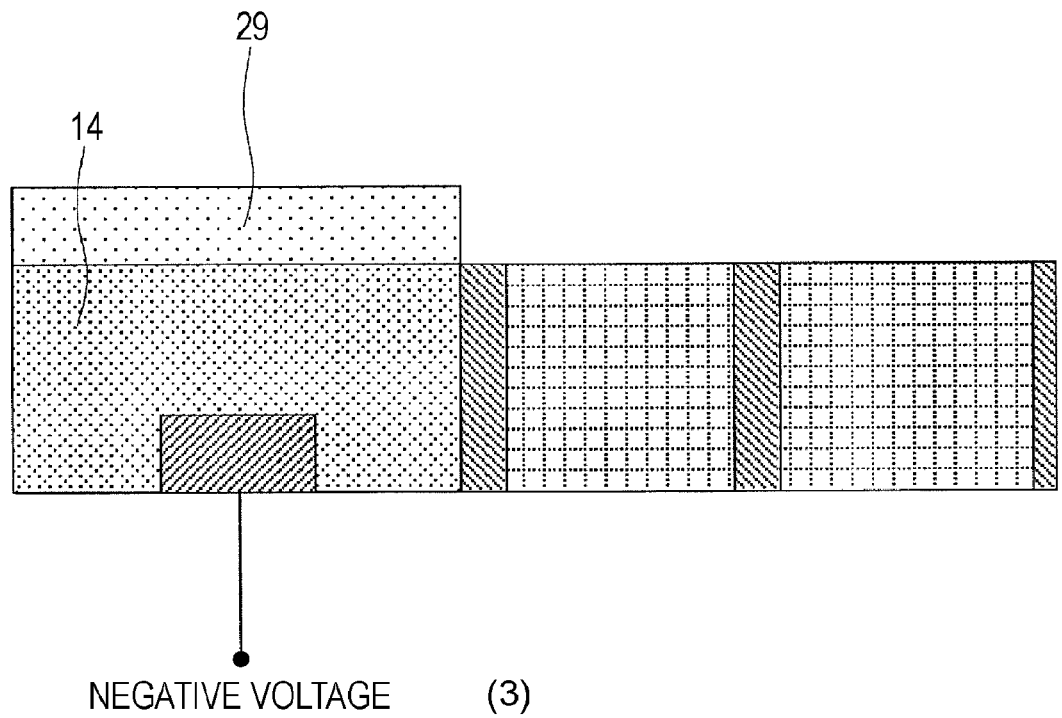
NEGATIVE VOLTAGE (3)
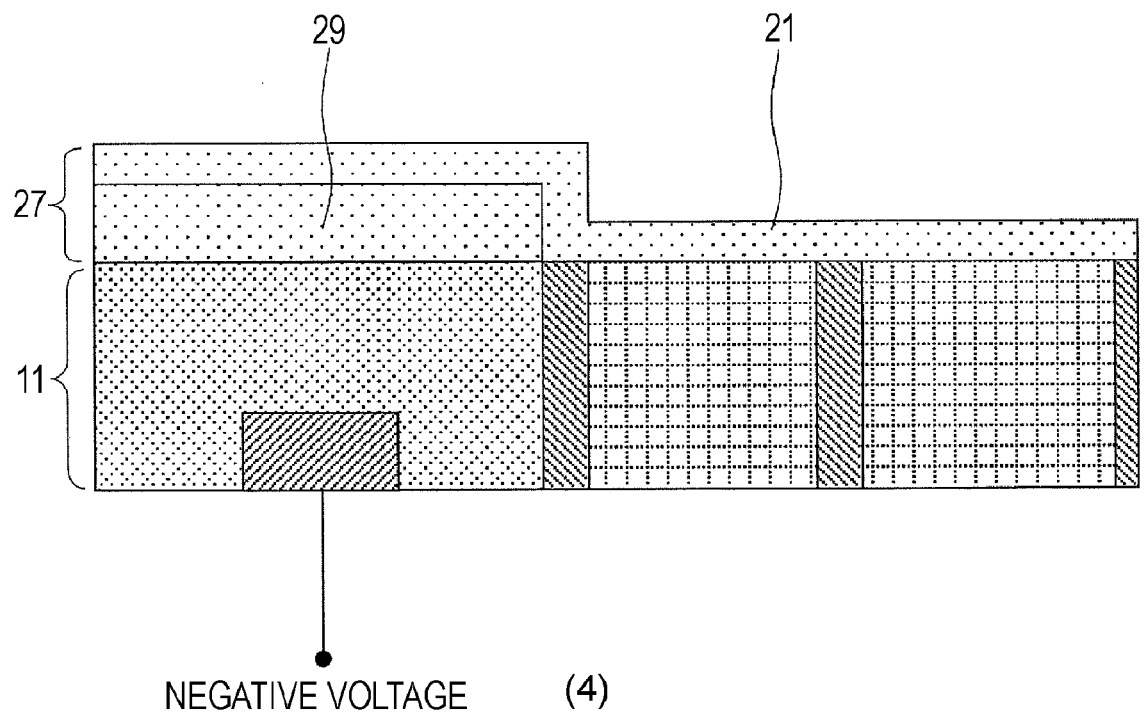
NEGATIVE VOLTAGE (4)

FIG. 30
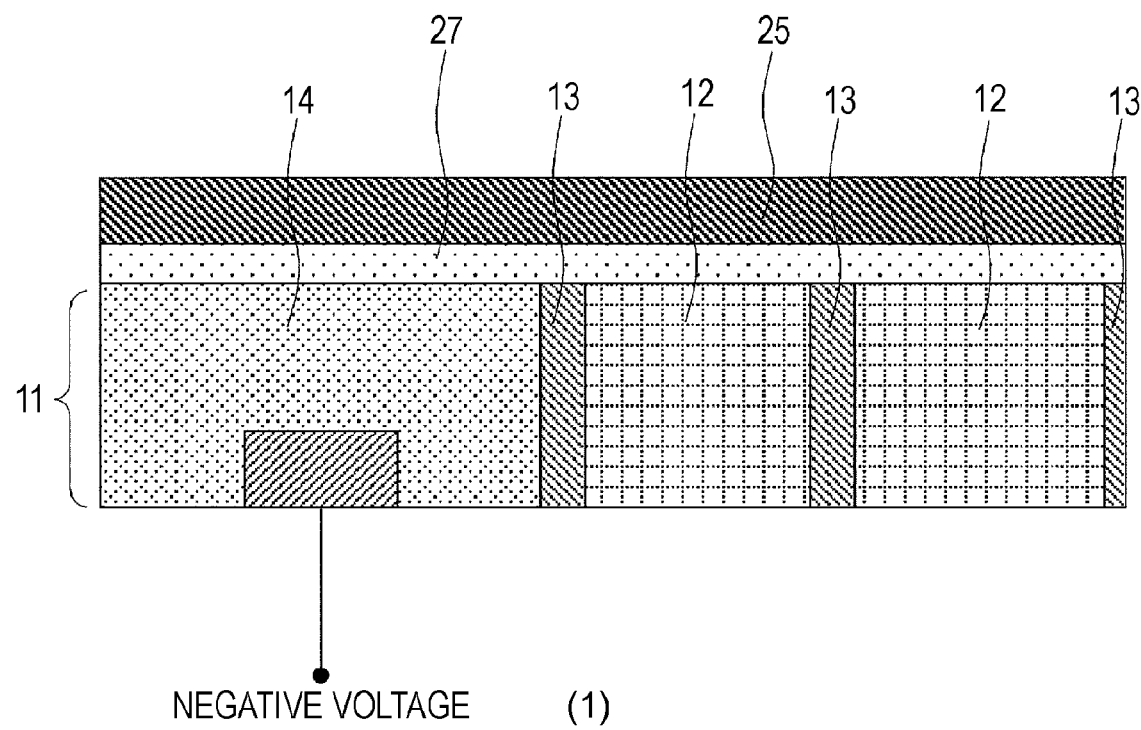
NEGATIVE VOLTAGE (1)
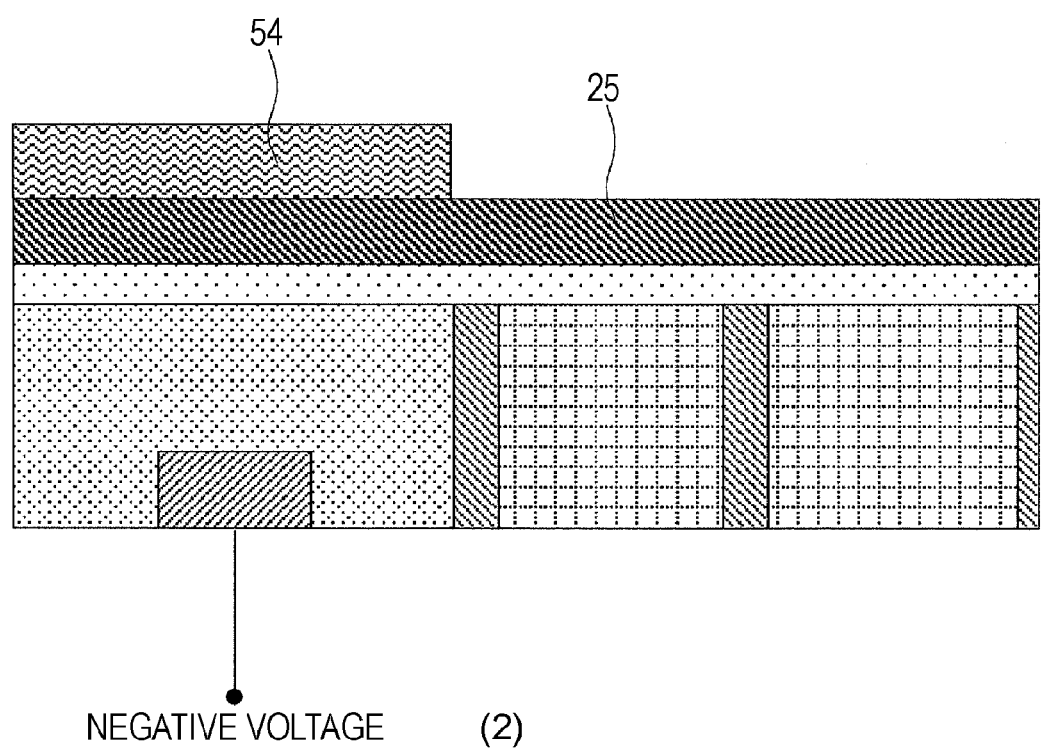
NEGATIVE VOLTAGE (2)

FIG. 31
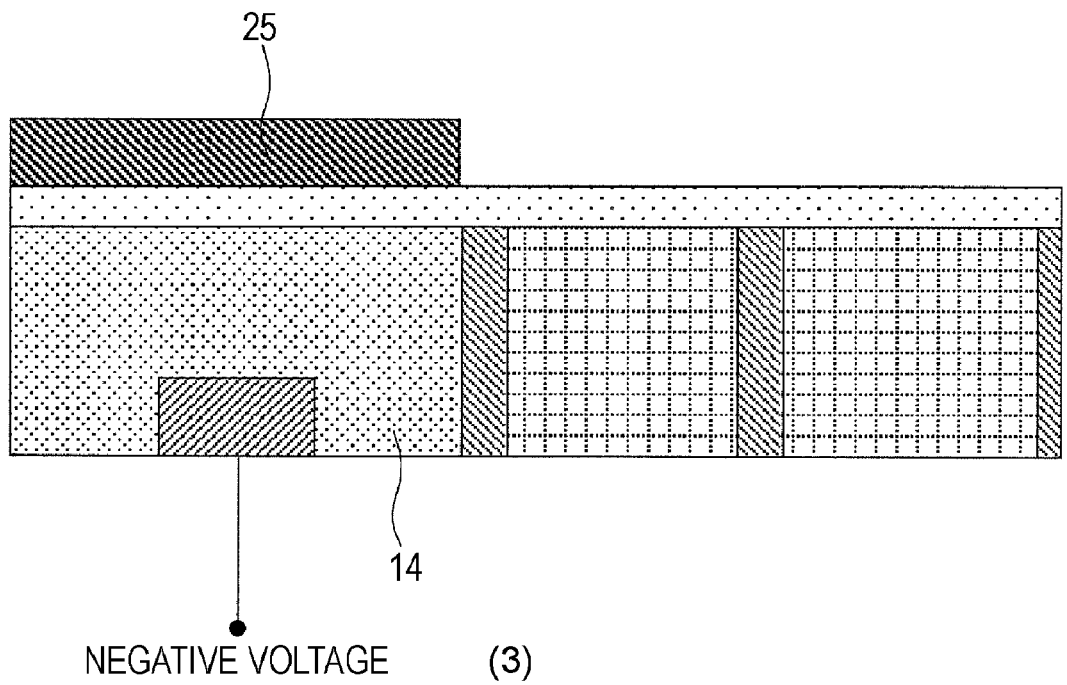
NEGATIVE VOLTAGE (3)
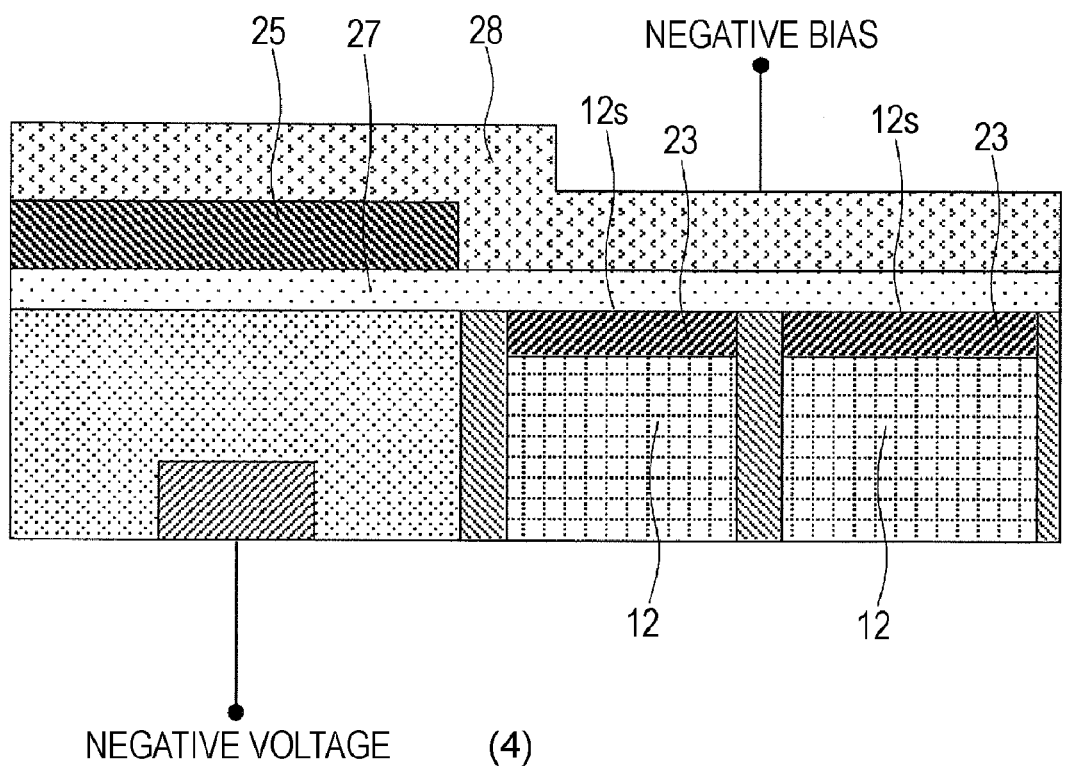
NEGATIVE VOLTAGE (4)

FIG. 36
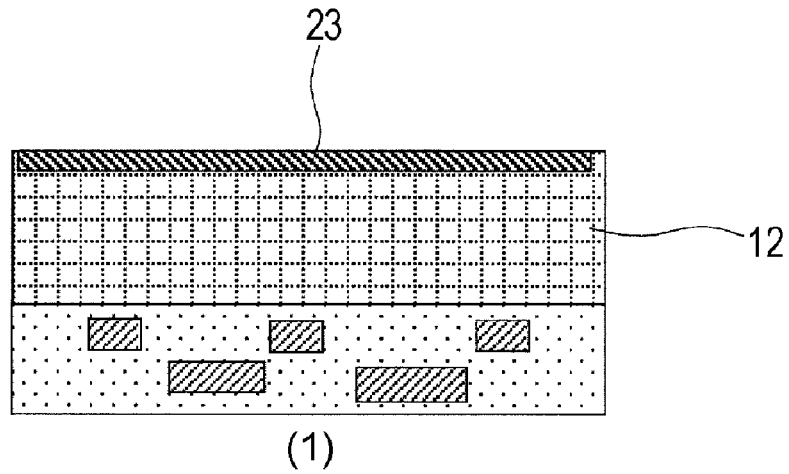
(1)
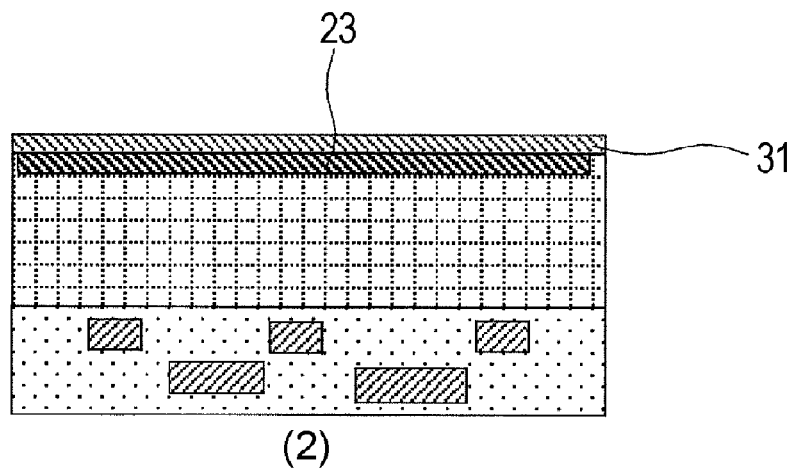
(2)
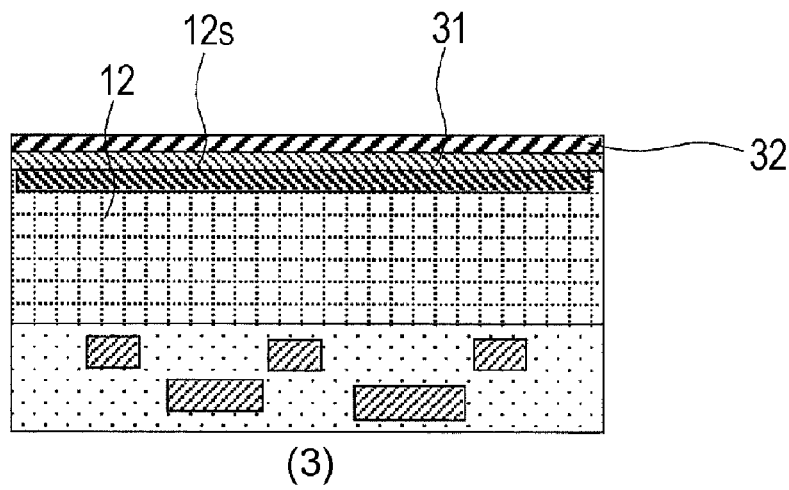
(3)

FIG. 38
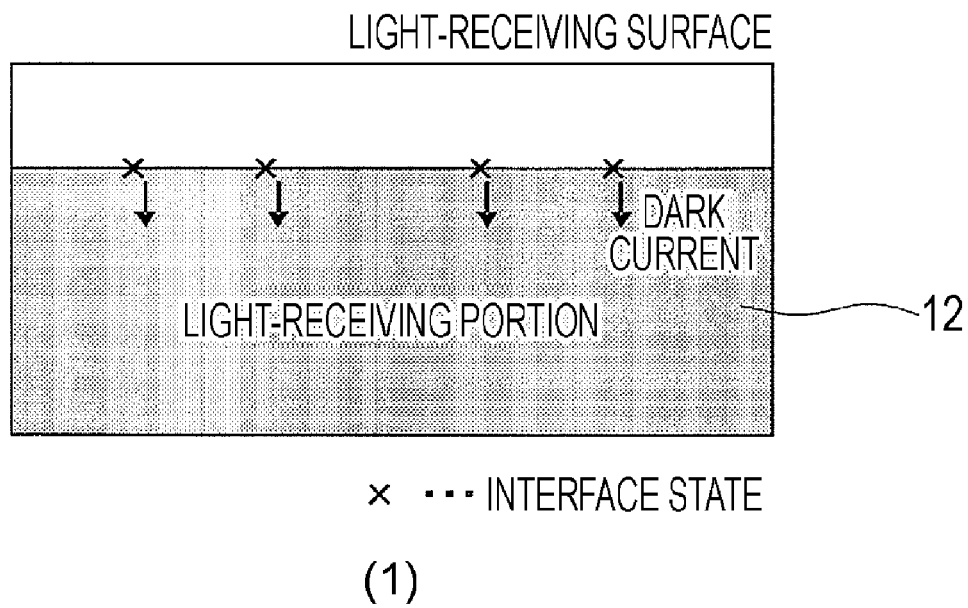
(1)
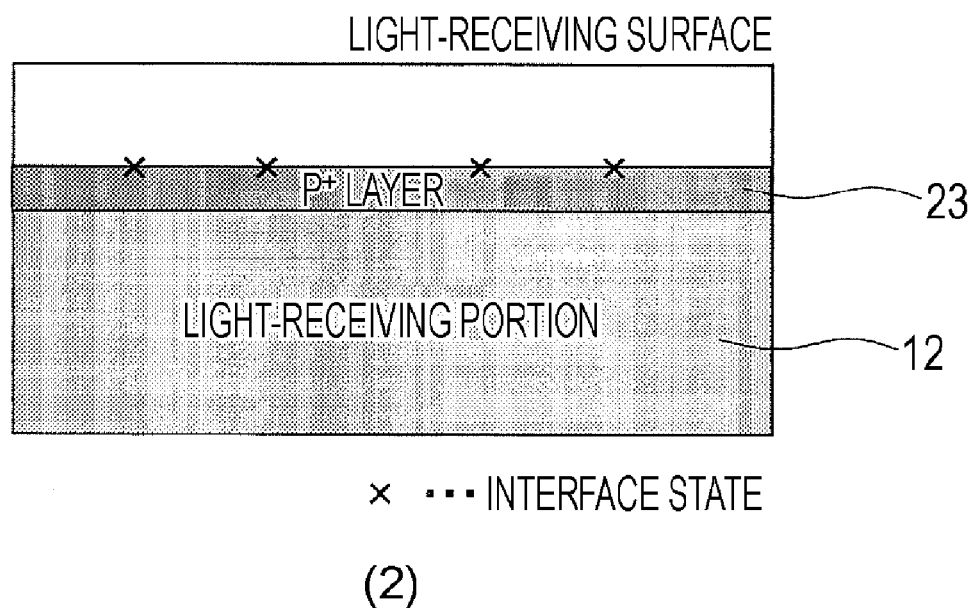
(2)

SOLID-STATE IMAGING DEVICE, METHOD FOR MANUFACTURING THE SAME, AND IMAGING APPARATUS

TECHNICAL FIELD

The present invention relates to a solid-state imaging device in which an occurrence of dark current is suppressed, a method for manufacturing the same, and an imaging apparatus.

BACKGROUND ART

Solid-state imaging devices formed from a CCD (Charge Coupled Device) and a CMOS image sensor have been previously widely used in video cameras, digital steel cameras, and the like. Noise reduction, as well as sensitivity improvement, is an important issue common to these solid-state imaging devices.

In particular, a dark current, wherein electric charges (electrons) generated from fine defects present at a substrate interface of a light-receiving surface are taken in as signals so as to serve as a micro-current and be detected in spite of the fact that there is no incident light and, therefore, there is no pure signal charge generated through photoelectric conversion of the incident light or a dark current, a source of which is an interface state at an interface between a light-receiving portion and an upper layer film, is a noise to be reduced with respect to a solid-state imaging device.

As for a technique to suppress generation of a dark current resulting from the interface state, for example, a buried photodiode structure having a hole accumulation (hole accumulation) layer 23 formed from a P$^+$ layer on a light-receiving portion (for example, photodiode) 12, as shown in FIG. 38 (2), is used. In this regard, in the present specification, the above-described buried photodiode structure is referred to as an HAD (Hole Accumulated Diode) structure. As shown in FIG. 38 (1), regarding a structure including no HAD structure, electrons which are generated on the basis of the interface state and which serve as a dark current flow into the photodiode. On the other hand, as shown in FIG. 38 (2), regarding the HAD structure, generation of electrons from the interface is suppressed by the hole accumulation layer 23 formed at the interface. Furthermore, even when electric charges (electrons) resulting from the interface are generated, the electric charges flow in the hole accumulation layer 23 of the P$^+$ layer, in which many holes are present, and can be extinguished without flowing into a charge accumulation portion, which is a N$^+$ layer in a light-receiving portion 12 and which serves as a potential well. Consequently, it can be prevented that the electric charges resulting from the interface serve as a dark current and are detected and, thereby, a dark current resulting from the interface state can be suppressed.

As for a method for producing this HAD structure, in general, an impurity, e.g., boron (B) or boron difluoride (BF$_2$), which forms a P$^+$ layer, is ion-implanted through a thermal oxide film or a CVD oxide film disposed on a substrate and, thereafter, the implanted impurity is activated through annealing so as to produce a P-type region in the vicinity of the interface. However, a heat treatment at a high temperature of 700° C. or higher is indispensable to activate the doping impurity and, therefore, it is difficult to form a hole accumulation layer through ion implantation by a low-temperature process at 400° C. or lower. Moreover, in the case where it is desired to avoid activation at high temperatures for a long period in order to suppress diffusion of dopants, a method for forming a hole accumulation layer, wherein ion implantation and annealing are conducted, is not preferable.

In addition, if silicon oxide or silicon nitride disposed as an upper layer of the light-receiving portion is formed by a technique of low-temperature plasma CVD or the like, the interface state deteriorates as compared with the interface between a film formed at high temperatures and a light-receiving surface. This deterioration in interface state causes an increase in dark current.

As described above, in the case where it is desirable to avoid the ion implantation and the annealing treatment at high temperatures, it is not possible to form the hole accumulation layer through ion implantation in the related art, and the dark current tends to further deteriorate. In order to solve it, the need for forming the hole accumulation layer by another technique not employing ion implantation in the related art arises.

For example, a technology has been disclosed, wherein charged particles having the same polarity as the conduction type opposite to the conduction type of a semiconductor region are embedded into an insulating film, which is formed from silicon oxide, on a photoelectric conversion element, which is disposed in a semiconductor region and which has the opposite conduction type, so as to increase the potential of a surface of the photoelectric conversion portion, and an inversion layer is formed on the surface so as to prevent depletion in the surface and reduce generation of the dark current (refer to, for example, Japanese Unexamined Patent Application Publication No. 1-256168). In the above-described technology, a technology to embed charged particles into the insulating layer is needed. However, it is not clear what embedding technology is employed. Furthermore, electrodes are needed for charge injection in order to inject the electric charge from the outside into the insulating layer, as is employed in non-volatile memory in general. Even if the electric charge can be injected from the outside in a non-contact manner without employing an electrode, it is necessary that the electric charge trapped in the insulating film is not detrapped, so that a charge retention characteristic becomes a problem in any event. For that purpose, an insulating film having a high charge retention characteristic and high quality has been demanded, but realization has been difficult.

A problem to be solved is that in the case where formation of an adequate hole accumulation layer through high concentration ion implantation into a light-receiving portion (photoelectric conversion portion) is intended, since the light-receiving portion is damaged because of the ion implantation, an annealing treatment at high temperatures is indispensable and, at that time, diffusion of impurities occurs and the photoelectric conversion characteristic deteriorates. On the other hand, in the case where the ion implantation is conducted at a low concentration in order to reduce the damage due to the ion implantation, a problem is that the concentration of the hole accumulation layer is reduced and a function as a hole accumulation layer is not adequately provided. That is, the problem is that it is difficult to allow realization of an adequate hole accumulation layer and reduction in dark current to become mutually compatible while diffusion of impurities is suppressed and a desired photoelectric conversion characteristic is provided.

It is an object of the present invention to allow realization of an adequate hole accumulation layer and reduction in dark current to become mutually compatible.

DISCLOSURE OF INVENTION

A solid-state imaging device (first solid-state imaging device) according to the present invention is characterized in that the solid-state imaging device having a light-receiving portion to photoelectrically convert incident light includes a film, which is disposed on a light-receiving surface of the above-described light-receiving portion and which lowers an interface state, and a film, which is disposed on the above-described film to lower the interface state and which has a negative fixed charge, wherein a hole accumulation layer is disposed on the light-receiving surface side of the above-described light-receiving portion.

In the above-described first solid-state imaging device, since the film, which has a negative fixed charge, is disposed on the film, which lowers the interface state, the hole accumulation (hole accumulation) layer is formed adequately at the interface on the light-receiving surface side of the light-receiving portion by an electric field resulting from the negative fixed charge. Therefore, generation of electric charges (electrons) from the interface is suppressed and, in addition, even when electric charges (electrons) are generated, the electric charges do not flow into a charge storage portion serving as a potential well in the light-receiving portion, flow through the hole accumulation layer, in which many holes are present, and can be extinguished. Consequently, it can be prevented that the electric charges resulting from the interface serve as a dark current and are detected by the light-receiving portion, and a dark current resulting from the interface state can be suppressed. Furthermore, since the film, which lowers the interface state, is disposed on the light-receiving surface of the light-receiving portion, generation of electrons resulting from the interface state is further suppressed, so that flowing of electrons, which serve as a dark current, resulting from the interface state into the light-receiving portion is suppressed.

A solid-state imaging device (second solid-state imaging device) according to the present invention is characterized in that the solid-state imaging device having a light-receiving portion to photoelectrically convert incident light includes an insulating film, which is disposed on a light-receiving surface of the above-described light-receiving portion and which transmits the above-described incident light, and a film, which is disposed on the above-described insulating film and which applies a negative voltage, wherein a hole accumulation layer is disposed on the light-receiving surface side of the above-described light-receiving portion.

In the above-described second solid-state imaging device, since the film, which applies a negative voltage, is disposed on the insulating film disposed on the light-receiving surface of the light-receiving portion, the hole accumulation (hole accumulation) layer is formed adequately at the interface on the light-receiving surface side of the light-receiving portion by an electric field generated through application of a negative voltage to the film, which applies a negative voltage. Therefore, generation of electric charges (electrons) from the interface is suppressed and, in addition, even when electric charges (electrons) are generated, the electric charges do not flow into a charge storage portion serving as a potential well in the light-receiving portion, flow through the hole accumulation layer, in which many holes are present, and can be extinguished. Consequently, it can be prevented that the electric charges resulting from the interface serve as a dark current and are detected by the light-receiving portion and a dark current resulting from the interface state can be suppressed.

A solid-state imaging device (third solid-state imaging device) according to the present invention is characterized in that the solid-state imaging device having a light-receiving portion to photoelectrically convert incident light includes an insulating film, which is disposed as an upper layer on the light-receiving surface side of the above-described light-receiving portion, and a film, which is disposed on the above-described insulating film and which has a value of work function larger than that of the interface on the light-receiving surface side of the above-described light-receiving portion to conduct photoelectric conversion.

In the above-described third solid-state imaging device, since the film, which has a value of work function larger than that of the interface on the light-receiving surface side of the light-receiving portion to conduct photoelectric conversion, is included on the insulating film disposed on the light-receiving portion, holes can be accumulated at the interface on the light-receiving surface side of the light-receiving portion. Consequently, a dark current is reduced.

A method for manufacturing a solid-state imaging device (first manufacturing method) according to the present invention is characterized in that the method for manufacturing a solid-state imaging device having a light-receiving portion, which photoelectrically converts incident light and which is disposed on a semiconductor substrate, includes the steps of forming a film, which lowers an interface state, on the above-described semiconductor substrate provided with the above-described light-receiving portion and forming a film, which has a negative fixed charge, on the above-described film, which lowers the interface state, wherein a hole accumulation layer is formed on the light-receiving surface side of the above-described light-receiving portion by the above-described film, which has a negative fixed charge.

In the above-described method for manufacturing a solid-state imaging device (first manufacturing method), since the film, which has a negative fixed charge, is disposed on the film, which lowers the interface state, the hole accumulation (hole accumulation) layer is formed adequately at the interface on the light-receiving surface side of the light-receiving portion by an electric field resulting from the negative fixed charge. Therefore, generation of electric charges (electrons) from the interface is suppressed and, in addition, even when electric charges (electrons) are generated, the electric charges do not flow into a charge storage portion serving as a potential well in the light-receiving portion, flow through the hole accumulation layer, in which many holes are present, and can be extinguished. Consequently, it can be prevented that a dark current due to the electric charges resulting from the interface is detected by the light-receiving portion and a dark current resulting from the interface state can be suppressed. Furthermore, since the film, which lowers the interface state, is disposed on the light-receiving surface of the light-receiving portion, generation of electrons resulting from the interface state is further suppressed, so that flowing of electrons, which serve as a dark current, resulting from the interface state into the light-receiving portion is suppressed. Moreover, since the film, which has a negative fixed charge, is used, the HAD structure can be formed without conducting ion implantation and annealing.

A method for manufacturing a solid-state imaging device (second manufacturing method) according to the present invention is characterized in that the method for manufacturing a solid-state imaging device having a light-receiving portion, which photoelectrically converts incident light and which is disposed on a semiconductor substrate, includes the steps of forming an insulating film, which transmits the above-described incident light, on a light-receiving surface of the above-described light-receiving portion and forming a film, which applies a negative voltage, on the above-described insulating film, wherein a hole accumulation layer is formed on the light-receiving surface side of the above-described light-receiving portion by applying a negative voltage to the above-described film which applies a negative voltage.

In the above-described method for manufacturing a solid-state imaging device (second manufacturing method), since the film which applies a negative voltage, is disposed on the insulating film disposed on the light-receiving surface of the light-receiving portion, the hole accumulation (hole accumulation) layer is formed adequately at the interface on the light-receiving surface side of the light-receiving portion by an electric field generated through application of a negative voltage to the film, which applies a negative voltage. Therefore, generation of electric charges (electrons) from the interface is suppressed and, in addition, even when electric charges (electrons) are generated, the electric charges do not flow into a charge storage portion serving as a potential well in the light-receiving portion, flow through the hole accumulation layer, in which many holes are present, and can be extinguished. Consequently, it can be prevented that a dark current due to the electric charges resulting from the interface is detected by the light-receiving portion and a dark current resulting from the interface state can be suppressed. Moreover, since the film, which has a negative fixed charge, is used, the HAD structure can be formed without conducting ion implantation and annealing.

A method for manufacturing a solid-state imaging device (third manufacturing method) according to the present invention is characterized in that the method for manufacturing a solid-state imaging device having a light-receiving portion, which photoelectrically converts incident light and which is disposed on a semiconductor substrate, includes the steps of forming an insulating film as an upper layer on the light-receiving surface side of the above-described light-receiving portion and forming a film, which has a value of work function larger than that of the interface on the light-receiving surface side of the above-described light-receiving portion to conduct photoelectric conversion, on the above-described insulating film.

In the above-described method for manufacturing a solid-state imaging device (third manufacturing method), since the film, which has a value of work function larger than that of the interface on the light-receiving surface side of the light-receiving portion to conduct photoelectric conversion, is formed on the insulating film disposed on the light-receiving portion, a hole accumulation layer disposed at the interface on the light-receiving side of the light-receiving portion can be formed. Consequently, a dark current is reduced.

An imaging apparatus (first imaging apparatus) according to the present invention is characterized by including an light-condensing optical portion, which condenses incident light, a solid-state imaging device, which receives and photoelectrically converts the above-described incident light condensed in the above-described light-condensing optical portion, and a signal processing portion, which processes a photoelectrically converted signal charge, wherein the above-described solid-state imaging device includes a film, which is disposed on a light-receiving surface of a light-receiving portion of the above-described solid-state imaging device to photoelectrically convert the above-described incident light and which lowers an interface state, and a film, which is disposed on the above-described film to lower the interface state and which has a negative fixed charge, wherein a hole accumulation layer is disposed on the light-receiving surface of the above-described light-receiving portion.

In the above-described first imaging apparatus, since the above-described first solid-state imaging device according to the present invention is used, the solid-state imaging device, in which a dark current is reduced, is used.

An imaging apparatus (second imaging apparatus) according to the present invention is characterized by including an light-condensing optical portion, which condenses incident light, a solid-state imaging device, which receives and photoelectrically converts the above-described incident light condensed in the above-described light-condensing optical portion, and a signal processing portion, which processes a photoelectrically converted signal charge, wherein the above-described solid-state imaging device includes an insulating film, which is disposed on a light-receiving surface of a light-receiving portion of the above-described solid-state imaging device to photoelectrically convert the above-described incident light, and a film, which is disposed on the above-described insulating film and which applies a negative voltage, the above-described insulating film is formed from an insulating film, which transmits the above-described incident light, and a hole accumulation layer is disposed on the light-receiving surface of the above-described light-receiving portion.

In the above-described second imaging apparatus, since the above-described second solid-state imaging device according to the present invention is used, the solid-state imaging device, in which a dark current is reduced, is used.

An imaging apparatus (third imaging apparatus) according to the present invention is characterized by including an light-condensing optical portion, which condenses incident light, a solid-state imaging device, which receives and photoelectrically converts the above-described incident light condensed in the above-described light-condensing optical portion, and a signal processing portion, which processes a photoelectrically converted signal charge, wherein the above-described solid-state imaging device includes an insulating film, which is disposed as an upper layer on a light-receiving surface side of a light-receiving portion to photoelectrically convert the incident light to a signal charge, and a film, which is disposed on the above-described insulating film and which has a value of work function larger than that of the interface on the light-receiving surface side of the light-receiving portion to conduct photoelectric conversion.

In the above-described third imaging apparatus, since the above-described third solid-state imaging device according to the present invention is used, the solid-state imaging device, in which a dark current is reduced, is used.

According to the solid-state imaging device of the present invention, a dark current can be suppressed and, thereby, noise in an image acquired through imaging can be reduced. Therefore, there is an advantage that an image having high image quality can be obtained. In particular, an occurrence of white point (point of a primary color in color CCD) due to a dark current in long-time exposure with a small amount of exposure can be reduced.

According to the method for manufacturing a solid-state imaging device of the present invention, a dark current can be suppressed and, thereby, noise in an image acquired through imaging can be reduced. Therefore, there is an advantage that a solid-state imaging device capable of obtaining an image having high image quality can be realized. In particular, a solid-state imaging device capable of reducing an occurrence of white point (point of a primary color in color CCD) due to a dark current in long-time exposure with a small amount of exposure can be realized.

According to the imaging apparatus of the present invention, since the solid-state imaging device capable of suppressing a dark current is used, noise in an image acquired through imaging can be reduced. Therefore, there is an advantage that an image having high image quality can be obtained. In particular, an occurrence of white point (point of a primary color in color CCD) due to a dark current in long-time exposure with a small amount of exposure can be reduced.

BRIEF DESCRIPTION OF DRAWINGS

FIG. 2 is an energy band diagram for explaining effects of the solid-state imaging device (first solid-state imaging device) according to the present invention.

FIG. 8 is a production step sectional view showing an embodiment (first example) of a method for manufacturing a solid-state imaging device (first manufacturing method) according to the present invention.

FIG. 9 is a production step sectional view showing an embodiment (first example) of the method for manufacturing a solid-state imaging device (first manufacturing method) according to the present invention.

FIG. 11 is a production step sectional view showing an embodiment (second example) of the method for manufacturing a solid-state imaging device (first manufacturing method) according to the present invention.

FIG. 12 is a production step sectional view showing an embodiment (second example) of the method for manufacturing a solid-state imaging device (first manufacturing method) according to the present invention.

FIG. 14 is a production step sectional view showing an embodiment (third example) of the method for manufacturing a solid-state imaging device (first manufacturing method) according to the present invention.

FIG. 15 is a production step sectional view showing an embodiment (third example) of the method for manufacturing a solid-state imaging device (first manufacturing method) according to the present invention.

FIG. 17 is a production step sectional view showing an embodiment (fourth example) of the method for manufacturing a solid-state imaging device (first manufacturing method) according to the present invention.

FIG. 18 is a production step sectional view showing an embodiment (fourth example) of the method for manufacturing a solid-state imaging device (first manufacturing method) according to the present invention.

FIG. 20 is a production step sectional view showing an embodiment (fifth example) of the method for manufacturing a solid-state imaging device (first manufacturing method) according to the present invention.

FIG. 21 is a production step sectional view showing an embodiment (fifth example) of the method for manufacturing a solid-state imaging device (first manufacturing method) according to the present invention.

FIG. 27 is a production step sectional view showing an embodiment (first example) of a method for manufacturing a solid-state imaging device (second manufacturing method) according to the present invention.

FIG. 28 is a production step sectional view showing an embodiment (first example) of the method for manufacturing a solid-state imaging device (second manufacturing method) according to the present invention.

FIG. 30 is a production step sectional view showing an embodiment (second example) of the method for manufacturing a solid-state imaging device (second manufacturing method) according to the present invention.

FIG. 31 is a production step sectional view showing an embodiment (second example) of the method for manufacturing a solid-state imaging device (second manufacturing method) according to the present invention.

FIG. 36 is a production step sectional view showing an embodiment (third example) of the method for manufacturing a solid-state imaging device (third manufacturing method) according to the present invention.

FIG. 38 is a schematic configuration sectional view of a light-receiving portion, showing a technique to suppress generation of a dark current resulting from an interface state.

BEST MODES FOR CARRYING OUT THE INVENTION

An embodiment (first example) of a solid-state imaging device (first solid-state imaging device) according to the present invention will be described with reference to a key portion configuration sectional view shown in FIG. 1.

Figure 1:
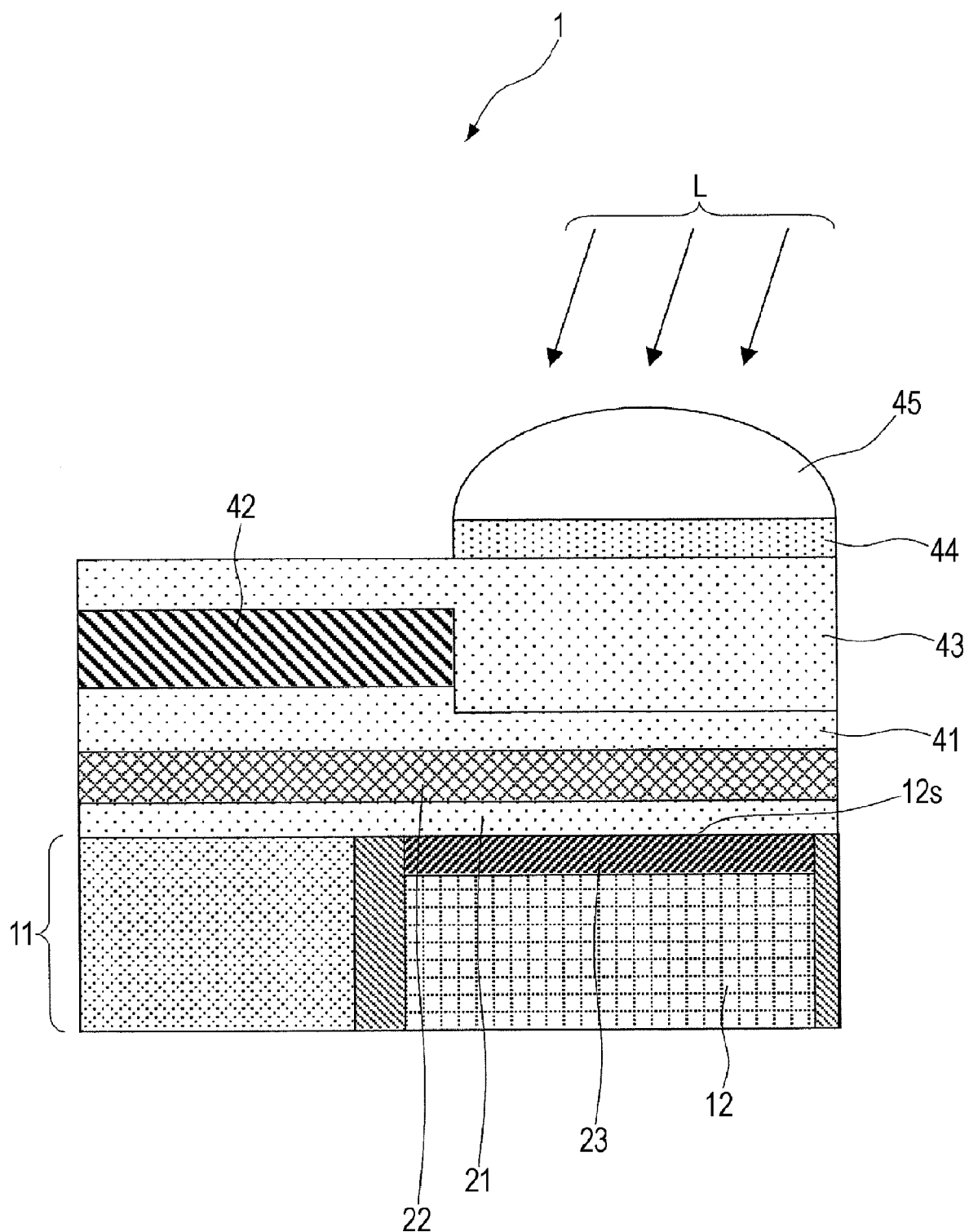
FIG. 1 is a key portion configuration sectional view showing an embodiment (first example) of a solid-state imaging device (first solid-state imaging device) according to the present invention.

As shown in FIG. 1, a solid-state imaging device 1 has a light-receiving portion 12, which photoelectrically converts incident light L, on a semiconductor substrate (or a semiconductor layer) 11 and has a peripheral circuit portion 14 provided with a peripheral circuit (not specifically shown in the drawing) in the portion beside this light-receiving portion 12 with a pixel isolation region 13 therebetween. In this regard, in the following explanation, the explanation is made on the semiconductor substrate 11. A film 21, which lowers an interface state, is disposed on a light-receiving surface 12s of the above-described light-receiving portion (including a hole accumulation layer 23 described later) 12. This film 21, which lowers an interface state, is formed from, for example, a silicon oxide ($SiO_2$) film. A film 22, which has a negative fixed charge, is disposed on the above-described film 21, which lowers an interface state. The hole accumulation layer 23 is formed thereby on the light-receiving surface side of the above-described light-receiving portion 12. Therefore, at least on the light-receiving portion 12, the above-described film 21, which lowers an interface state, is disposed having such a film thickness that allows the hole accumulation layer 23 to be formed on the light-receiving surface 12s side of the above-described light-receiving portion 12 because of the above-described film 22, which has a negative fixed charge. The film thickness thereof is specified to be, for example, 1 atomic layer or more, and 100 nm or less.

In the case where the above-described solid-state imaging device 1 is a CMOS image sensor, examples of peripheral circuits of the above-described peripheral circuit portion 14 include pixel circuits composed of transistors, e.g., a transfer transistor, a reset transistor, an amplifying transistor, and a selection transistor. Furthermore, a drive circuit to effect an operation to read signals of lines to be read in a pixel array portion composed of a plurality of light-receiving portions 12, a vertical scanning circuit to transfer the signals read, a shift register or an address decoder, a horizontal scanning circuit, and the like are included.

Alternatively, in the case where the above-described solid-state imaging device 1 is a CCD image sensor, examples of peripheral circuits of the above-described peripheral circuit portion 14 include a read gate, which reads photoelectrically converted signal charges from the light-receiving portion to a vertical transfer gate, and a vertical charge transfer portion, which transfers read signal charges in the vertical direction. Furthermore, a horizontal charge transfer portion and the like are included.

The above-described film 22, which has a negative fixed charge, is formed from, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described films of the types mentioned above have a track record in being used for gate insulating films or the like of insulated gate type field-effect transistors. Therefore, the film formation method has been established, and film formation can be conducted easily. Examples of film formation methods include a chemical vapor deposition method, a sputtering method, and an atomic layer deposition method. However, use of the atomic layer deposition method is favorable because about 1 nm of $SiO_2$ layer, which reduces an interface state, can be formed at the same time during film formation. In this regard, examples of the materials other than those described above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Moreover, the above-described film 22, which has a negative fixed charge, may also be formed from a hafnium nitride film, an aluminum nitride film, a hafnium oxynitride film, or an aluminum oxynitride film.

Regarding the above-described film 22, which has a negative fixed charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and the capability of preventing ion implantation during a process.

An insulating film 41 is disposed on the above-described film 22, which has a negative fixed charge, and a light-shield film 42 is disposed on the above-described insulating film 41 above the above-described peripheral circuit portion 14. A region, into which no light enters, is formed in the light-receiving portion 12 by this light-shield film 42, and a black level of the image is determined on the basis of an output of the light-receiving portion 12. Moreover, since entrance of light into the peripheral circuit portion 14 is prevented, variations in characteristics due to entrance of light into the peripheral circuit portion are suppressed. In addition, an insulating film 43, which has a transmission property with respect to the above-described incident light is disposed. It is preferable that the surface of this insulating film 43 is flattened. Furthermore, a color filter layer 44 and a condenser lens 45 are disposed on the insulating film 43.

In the above-described solid-state imaging device (first solid-state imaging device) 1, the film 22, which has a negative fixed charge, is disposed on the film 21, which lowers an interface state. Therefore, an electric field is applied to the surface of the light-receiving portion 12 by the negative fixed charge in the film of the film 22, which has a negative fixed charge, through the film 21, which lowers an interface state, and thereby, the hole accumulation (hole accumulation) layer 23 is formed on the surface of the light-receiving portion 12.

Then, as shown in FIG. 2 (1), the vicinity of the interface can be made into the hole accumulation layer 23 because of an electric field due to the negative fixed charge present in the film 22, which has a negative fixed charge, from immediately after formation of the film. Consequently, a dark current generated because of the interface state at the interface between the light-receiving portion 12 and the film 21, which lowers an interface state, can be suppressed. That is, electric charges (electrons) generated from the interface are reduced and, in addition, even when electric charges (electrons) are generated from the interface, the electric charges flow in the hole accumulation layer 23, in which many holes are present, and can be extinguished without flowing into a charge accumulation portion, which serves as a potential well in the light-receiving portion 12. Consequently, it can be prevented that a dark current due to the electric charges resulting from the interface is detected by the light-receiving portion 12 and, thereby, a dark current resulting from the interface state can be suppressed.

On the other hand, as shown in FIG. 2 (2), in the configuration in which a hole accumulation layer is not disposed, a problem occurs in that a dark current is generated because of the interface state and the resulting dark current flows into the light-receiving portion 12. Furthermore, as shown in FIG. 2 (3), in the configuration in which the hole accumulation layer 23 is formed through ion implantation, as is described above, although the hole accumulation layer 23 is formed, a heat treatment at a high temperature of 700° C. or higher is indispensable to activate the doping impurity in ion implantation, so that diffusion of impurities occurs, the hole accumulation layer at the interface is extended, a region for photoelectric conversion is reduced, and it becomes difficult to obtain desired photoelectric conversion characteristics.

Furthermore, in the above-described solid-state imaging device 1, since the film 21, which lowers the interface state, is disposed on the light-receiving surface 12s of the light-receiving portion 12, generation of electrons resulting from the interface state is further suppressed, so that flowing of electrons, which serve as a dark current, resulting from the interface state into the light-receiving portion 12 is suppressed.

Moreover, in the case where a hafnium oxide film is used as the film 22, which has a negative fixed charge, since the refractive index of the hafnium oxide film is about 2, it is possible to not only form the HAD structure, but also obtain an antireflection effect at the same time by optimizing the film thickness. Regarding materials other than the hafnium oxide film as well, as for materials having high refractive indices, it is possible to obtain an antireflection effect by optimizing the film thickness thereof.

In this regard, it is known that in the case where silicon oxide or silicon nitride, which have been previously used in solid-state imaging devices, is formed at low temperatures, the fixed charge in the film becomes positive, and it is not possible to form the HAD structure by a negative fixed charge.

Next, a modified example of the above-described solid-state imaging device (first solid-state imaging device) 1 will be described with reference to a key portion configuration sectional view shown in FIG. 3.

Figure 3:
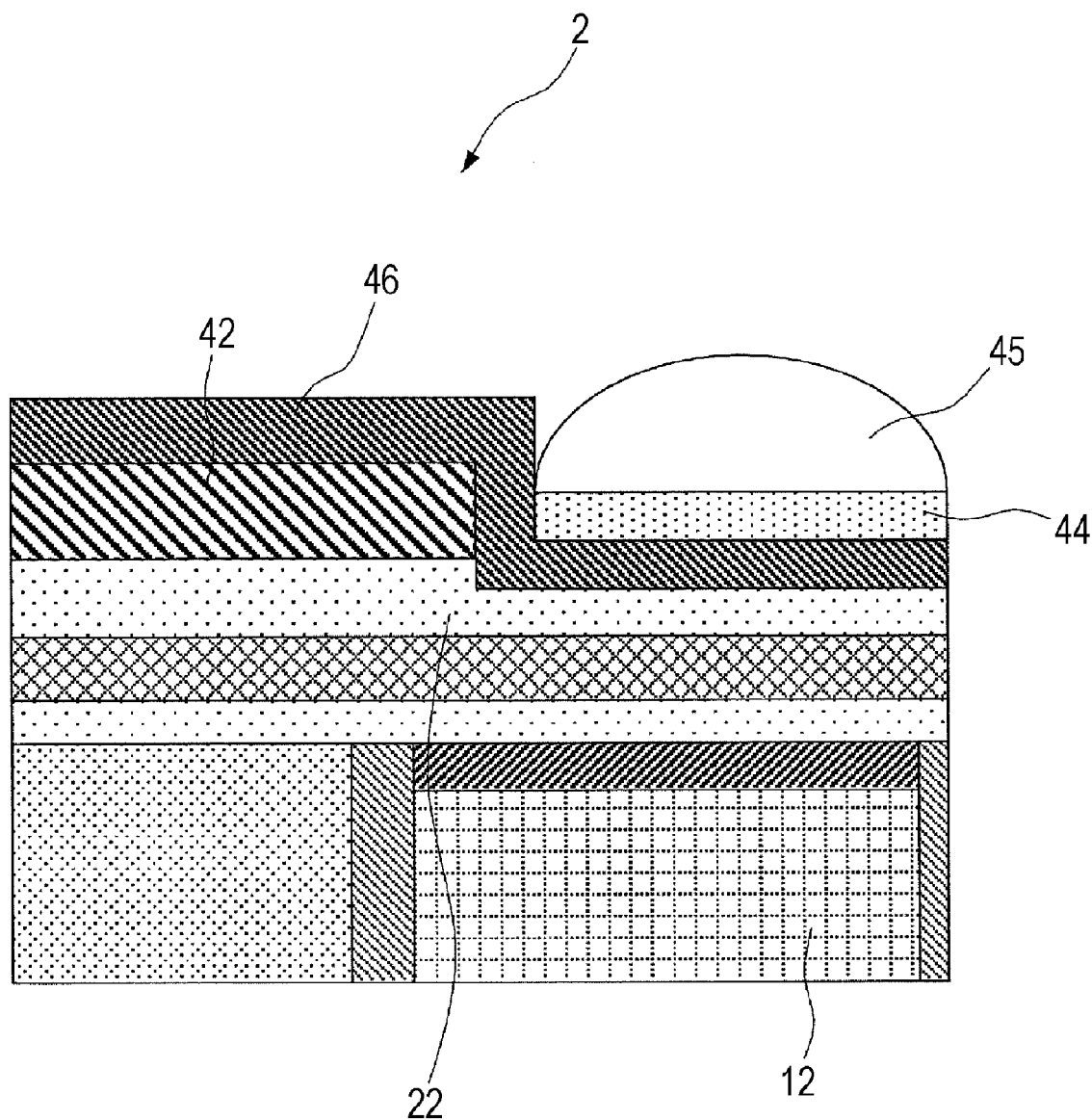
FIG. 3 is a key portion configuration sectional view showing a modified example of the above-described solid-state imaging device (first solid-state imaging device) 1.

In the case where regarding the above-described solid-state imaging device 1, the antireflection effect on the light-receiving portion 12 by only the film 22, which has a negative fixed charge, is inadequate, regarding a solid-state imaging device 2, as shown in FIG. 3, an antireflection film 46 is disposed on the film 22, which has a negative fixed charge. This antireflection film 46 is formed from, for example, a silicon nitride film. In this connection, the insulating film 43, which is formed in the above-described solid-state imaging device 1, is not disposed. Consequently, a color filter 44 and a condenser lens 45 are disposed on the antireflection film 46. As described above, the antireflection effect can be maximized by forming a silicon nitride film additionally. This configuration can be applied to a solid-state imaging device 3 described next.

In the case where the antireflection film 46 is disposed as described above, reflection before entrance into the light-receiving portion 12 can be reduced and, thereby, the amount of light incident on the light-receiving portion 12 can be increased, so that the sensitivity of the solid-state imaging device 2 can be improved.

Next, a modified example of the above-described solid-state imaging device (first solid-state imaging device) 1 will be described with reference to a key portion configuration sectional view shown in FIG. 4.

Figure 4:
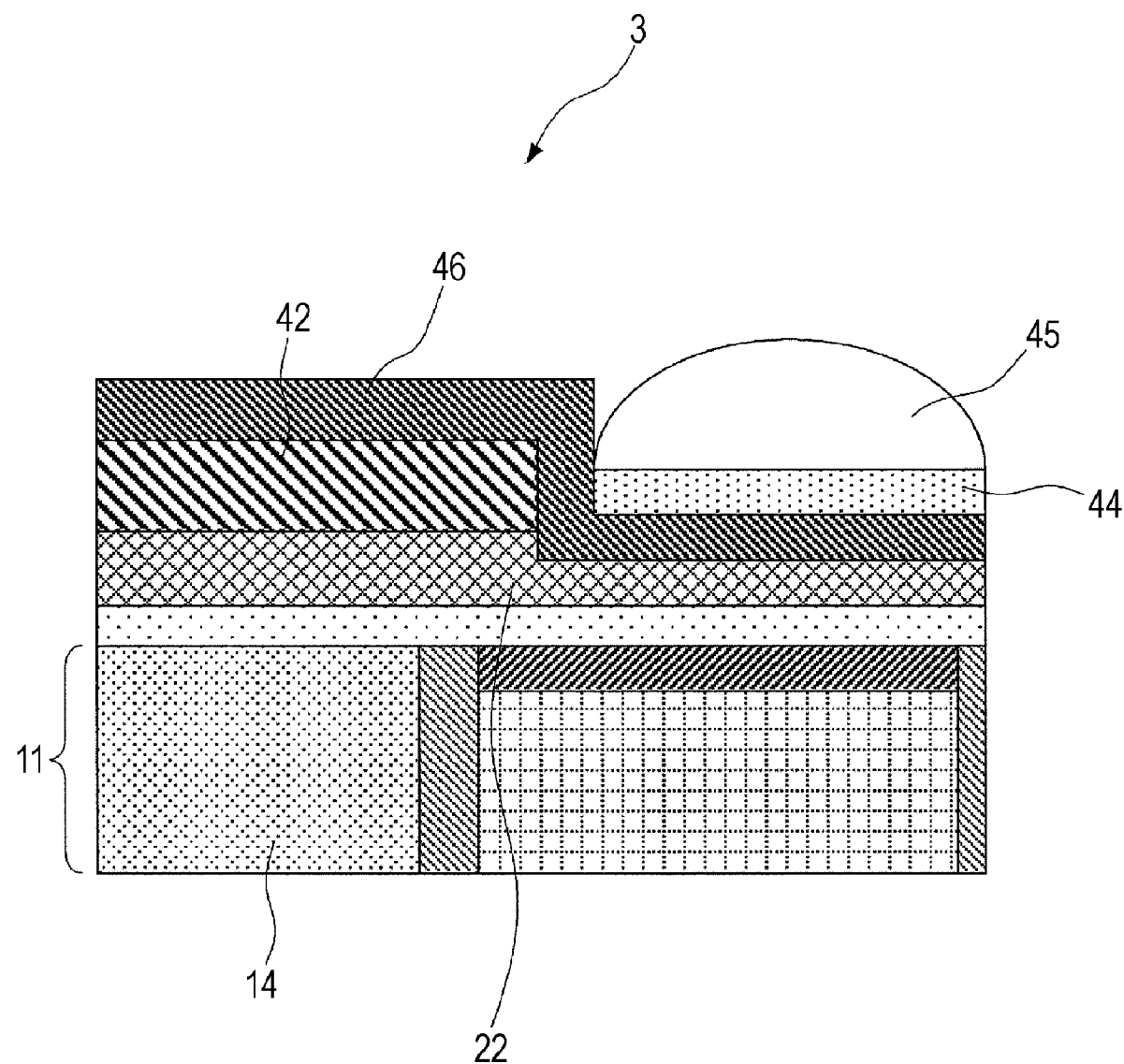
FIG. 4 is a key portion configuration sectional view showing a modified example of the above-described solid-state imaging device (first solid-state imaging device) 1.

Regarding a solid-state imaging device 3, as shown in FIG. 4, the above-described insulating film 41, which is disposed in the above-described solid-state imaging device 1, is not disposed, and the above-described light-shield film 42 is disposed directly on the film 22, which has a negative fixed charge. Furthermore, the antireflection film 46 is disposed without disposing the insulating film 43.

In the case where the light-shield film 42 is disposed directly on the film 22, which has a negative fixed charge, as described above, the light-shield film 42 can be made close to the surface of the semiconductor substrate 11 and, thereby, the distance between the light-shield film 42 and the semiconductor substrate 11 is reduced, so that components of light incident slantingly from an upper layer of an adjacent light-receiving portion (photodiode), that is, optical color mixture components, can be reduced.

Figure 5:
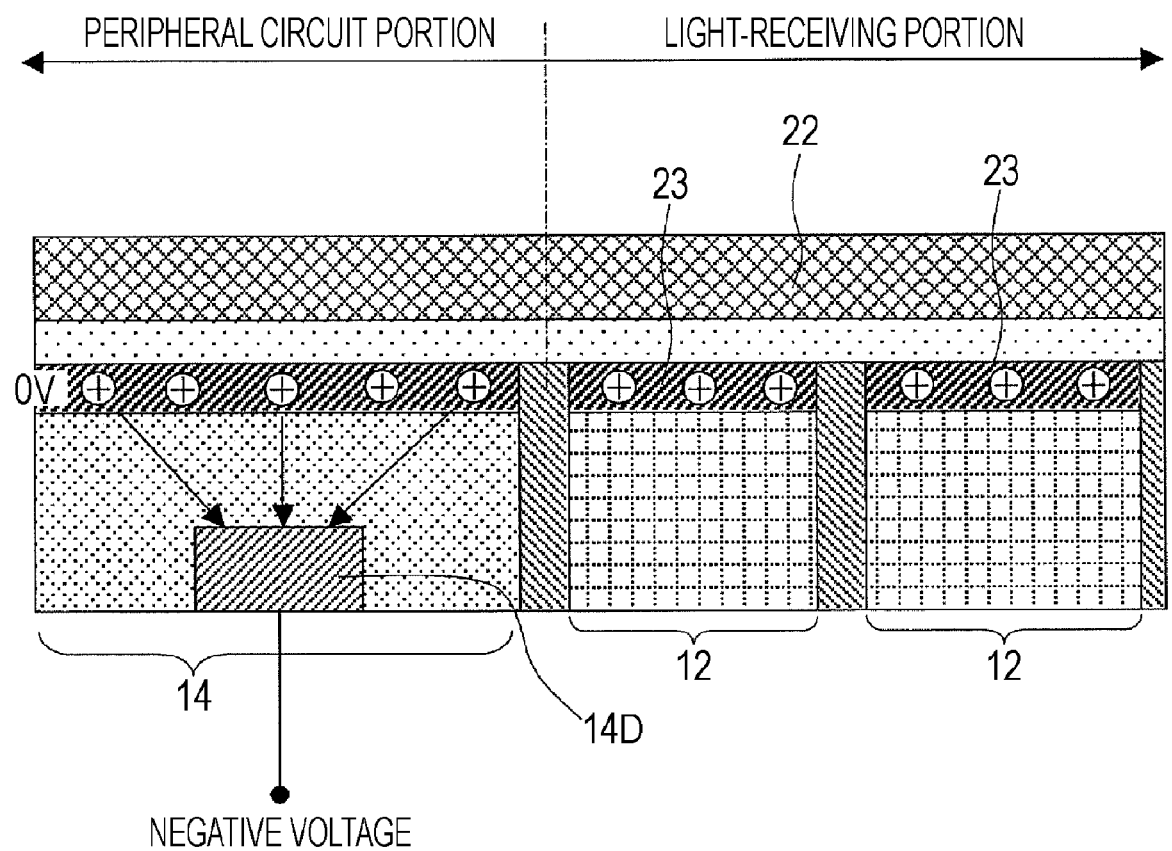
FIG. 5 is a key portion configuration sectional view for explaining the action of a negative fixed charge in the case where a film, which has the negative fixed charge, is present in the vicinity of a peripheral circuit portion.

Furthermore, as shown in FIG. 5, in the case where the film 22, which has a negative fixed charge, is disposed in the vicinity on the peripheral circuit portion 14, a dark current resulting from the interface state on the surface of the light-receiving portion 12 can be suppressed by the hole accumulation layer 23 formed from the negative fixed charge of the film 22, which has a negative fixed charge. However, in the peripheral circuit portion 14, a potential difference is allowed to be generated between the light-receiving portion 12 side and an element 14D present on the surface side, and unexpected carriers flow from the surface of the light-receiving portion 12 into the element 14D present on the surface side, so as to cause a malfunction of the peripheral circuit portion 14. A configuration to avoid such a malfunction will be described with reference to the following second example and third example.

Next, an embodiment (second example) of the solid-state imaging device (first solid-state imaging device) according to the present invention will be described with reference to a key portion configuration sectional view shown in FIG. 6. In this regard, in FIG. 6, a light-shield film to shield a part of the light-receiving portion and the peripheral circuit portion from light, a color filter layer to disperse the light incident on the light-receiving portion, a condenser lens to condense the incident light on the light-receiving portion, and the like are not shown in the drawing.

Figure 6:
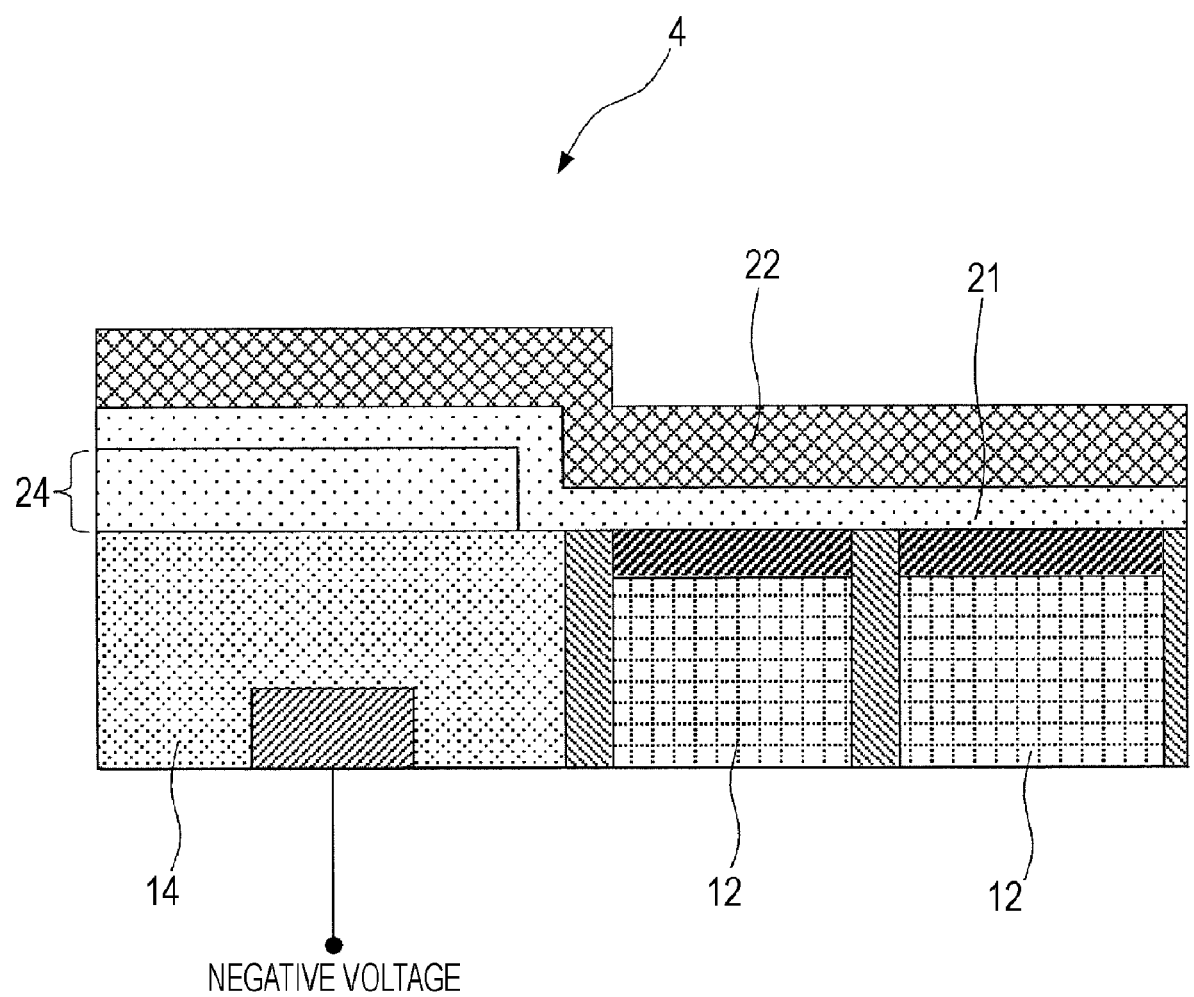
FIG. 6 is a key portion configuration sectional view showing an embodiment (second example) of the solid-state imaging device (first solid-state imaging device) according to the present invention.

As shown in FIG. 6, in the solid-state imaging device 4, an insulating film 24 is disposed between the surface of the above-described peripheral circuit portion 14 and the above-described film 22, which has a negative fixed charge, in such a way that the distance of the above-described film 22, which has a negative fixed charge, from the surface of the above-described peripheral circuit portion 14 in the above-described solid-state imaging device 1 becomes larger than the distance from the surface of the above-described light-receiving portion 12. In the case where the above-described film 21, which lowers an interface state, is formed from a silicon oxide film, this insulating film 24 may be formed from the film 21, which lowers an interface state and which has a thickness thereof on the peripheral circuit portion 14 larger than the thickness thereof on the light-receiving portion 12.

As described above, the insulating film 24 is disposed between the surface of the above-described peripheral circuit portion 14 and the above-described film 22, which has a negative fixed charge, in such a way that the distance of the above-described film 22, which has a negative fixed charge, from the surface of the above-described peripheral circuit portion 14 becomes larger than the distance from the surface of the above-described light-receiving portion 12. Therefore, in the peripheral circuit portion 14, the influence of the electric field of a negative fixed charge in the film 22, which has a negative fixed charge, is not exerted on the peripheral circuit. Consequently, a malfunction of the peripheral circuit due to the negative fixed charge can be prevented.

Next, an embodiment (third example) of the solid-state imaging device (first solid-state imaging device) will be described with reference to a key portion configuration sectional view shown in FIG. 7. In this regard, in FIG. 7, a light-shield film to shield a part of the light-receiving portion and the peripheral circuit portion from light, a color filter layer to disperse the light incident on the light-receiving portion, a condenser lens to condense the incident light on the light-receiving portion, and the like are not shown in the drawing.

Figure 7:
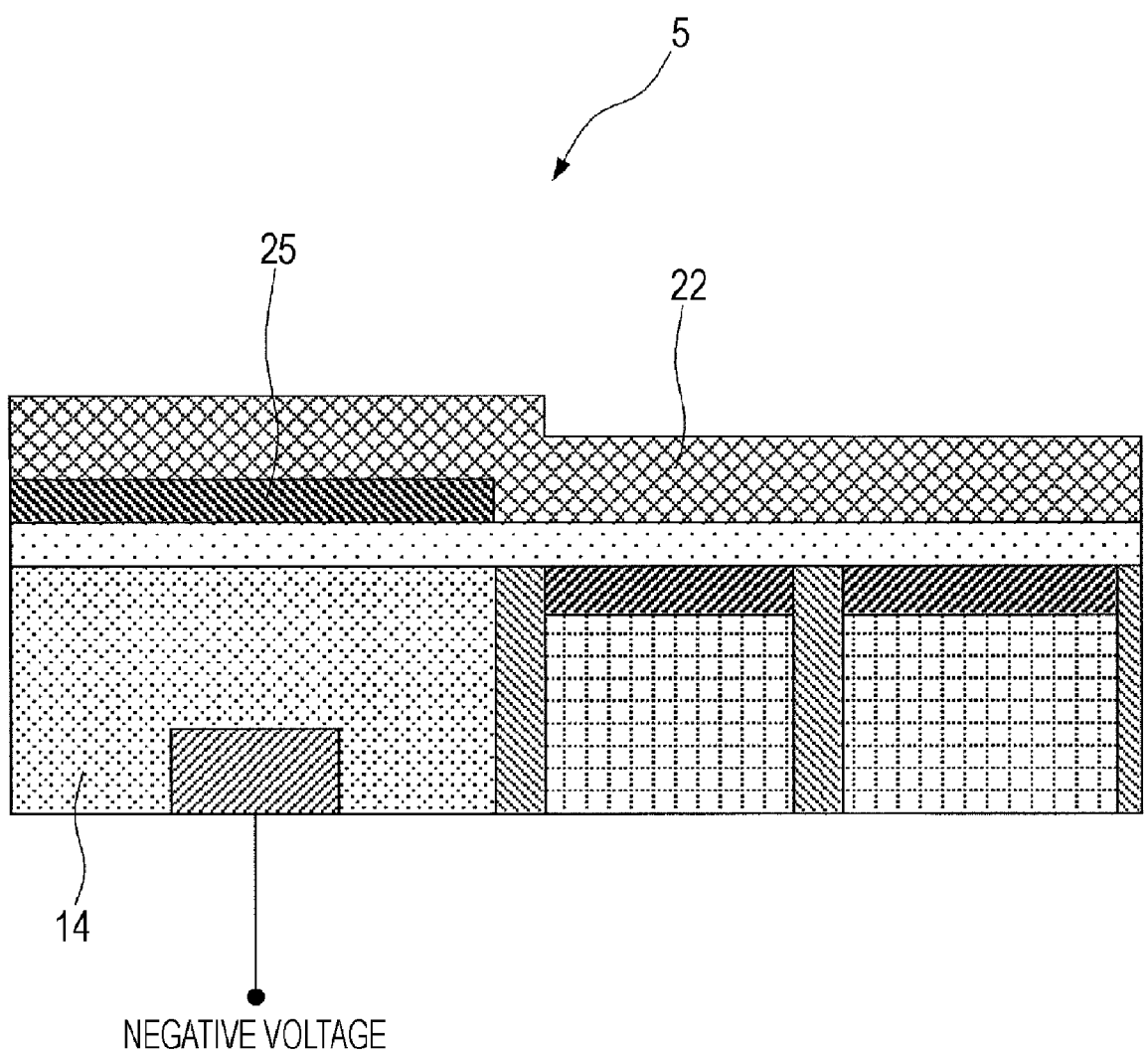
FIG. 7 is a key portion configuration sectional view showing an embodiment (third example) of the solid-state imaging device (first solid-state imaging device) according to the present invention.

As shown in FIG. 7, in the solid-state imaging device 5, a film 25 to increase the distance between the film, which has a negative fixed charge, and the light-receiving surface is disposed above the above-described peripheral circuit portion 14 and under the above-described film 22, which has a negative fixed charge, in the above-described solid-state imaging device 1. It is desirable that the above-described film 25 has a positive fixed charge to cancel the influence of the negative fixed charge, and it is preferable that silicon nitride is used.

As described above, the above-described film 25, which has a positive fixed charge, is disposed above the above-described peripheral circuit portion 14 and under the above-described film 22, which has a negative fixed charge. Therefore, the negative fixed charge of the film 22, which has a negative fixed charge, is reduced by the positive fixed charge in the above-described film 25, so that the influence of the electric field of a negative fixed charge in the film 22, which has the negative fixed charge, is not exerted on the peripheral circuit portion 14. Consequently, a malfunction of the peripheral circuit 14 due to the negative fixed charge can be prevented. The above-described configuration, in which the above-described film 25 having a positive fixed charge is disposed above the above-described peripheral circuit portion 14 and under the above-described film 22 having a negative fixed charge, can be applied to the above-described solid-state imaging devices 1, 2, 3, and 4, and the effects similar to those of the solid-state imaging device 5 can be obtained.

In the configuration on the film 22, which has a negative fixed charge, in the above-described solid-state imaging devices 4 and 5, the light-shield film to shield a part of the light-receiving portion 12 and the peripheral circuit portion 14 from light, the color filter layer to disperse the light incident on at least the light-receiving portion 12, the condenser lens to condense the incident light on the light-receiving portion 12, and the like are disposed. As an example of the configuration, any one of the configurations of the above-described solid-state imaging devices 1, 2, and 3 can also be applied.

Figure 10:
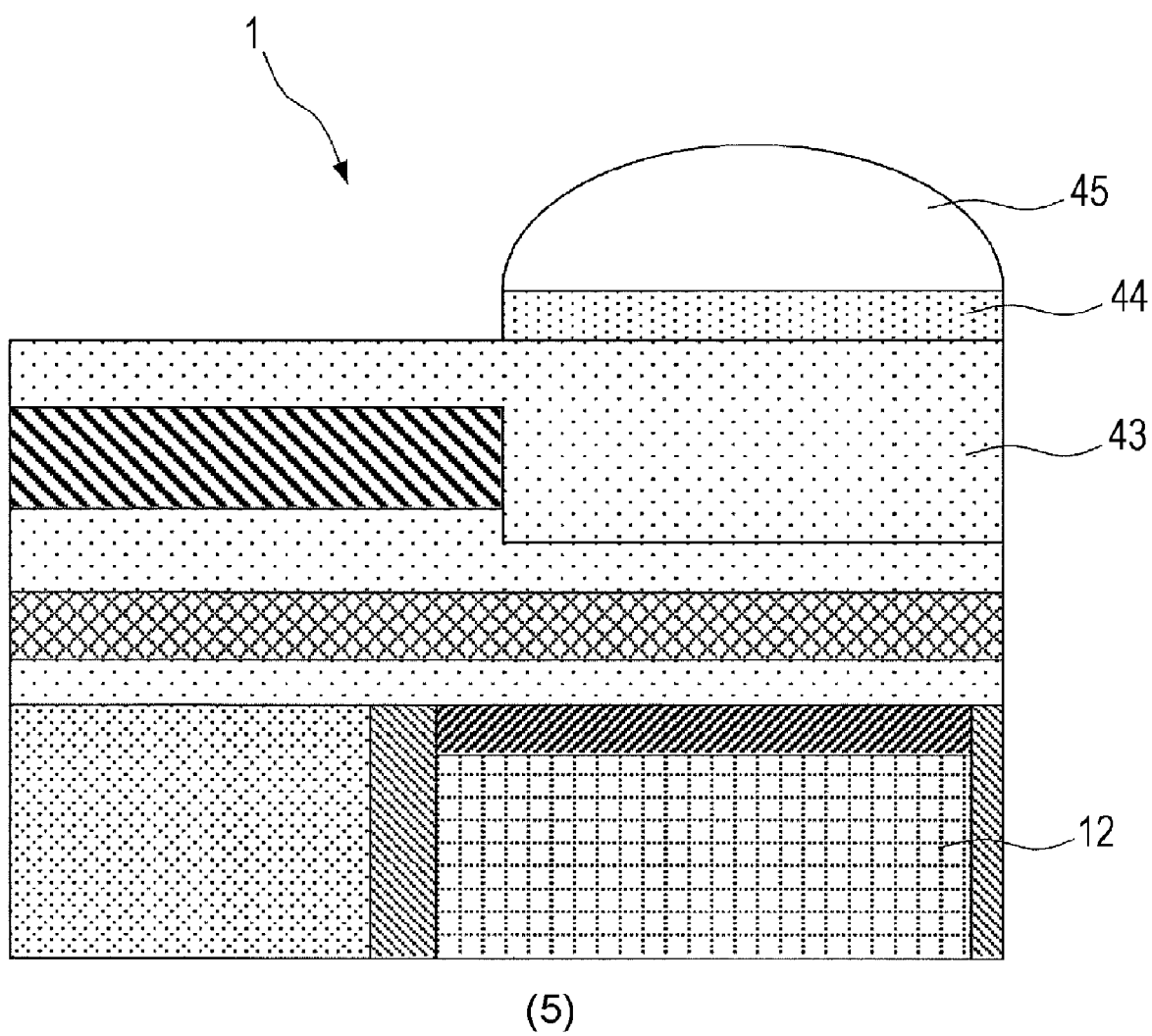
FIG. 10 is a production step sectional view showing an embodiment (first example) of the method for manufacturing a solid-state imaging device (first manufacturing method) according to the present invention.

Next, an embodiment (first example) of a method for manufacturing a solid-state imaging device (first manufacturing method) according to the present invention will be described with reference to production step sectional views of a key portion shown in FIG. 8 to FIG. 10. In FIG. 8 to FIG. 10, production steps of the above-described solid-state imaging device 1 are shown as an example.

As shown in FIG. 8 (1), the light-receiving portion 12, which photoelectrically converts incident light, the pixel isolation regions 13, which isolate the light-receiving portion 12, the peripheral circuit portion 14, in which a peripheral circuit (not specifically shown in the drawing) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used.

Subsequently, as shown in FIG. 8 (2), the film 21, which lowers an interface state, is formed on the light-receiving surface 12s of the above-described light-receiving portion 12, in actuality, on the above-described semiconductor substrate 11. This film 21, which lowers an interface state, is formed from, for example, a silicon oxide ($SiO_2$) film. Then, the film 22, which has a negative fixed charge, is formed on the above-described film 21, which lowers an interface state. The hole accumulation layer 23 is formed thereby on the light-receiving surface side of the above-described light-receiving portion 12. Therefore, at least on the light-receiving portion 12, it is necessary that the above-described film 21, which lowers an interface state, is formed having a film thickness to allow the hole accumulation layer 23 to be formed on the light-receiving surface 12s side of the above-described light-receiving portion 12 by the above-described film 22, which has a negative fixed charge. The film thickness thereof is specified to be, for example, 1 atomic layer or more, and 100 nm or less.

The above-described film 22, which has a negative fixed charge, is formed from, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described films of the types mentioned above have a track record in being used for gate insulating films or the like of insulated gate type field-effect transistors. Therefore, the film formation method has been established, and film formation can be conducted easily. As for the film formation method, for example, a chemical vapor deposition method, a sputtering method, and an atomic layer deposition method can be used. However, use of the atomic layer deposition method is favorable because about 1 nm of $SiO_2$ layer, which reduces an interface state, can be formed at the same time during film formation.

In this regard, examples of the usable materials other than those described above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Moreover, the above-described film 22, which has a negative fixed charge, can also be formed from a hafnium nitride film, an aluminum nitride film, a hafnium oxynitride film, or an aluminum oxynitride film. As for these films, for example, the chemical vapor deposition method, the sputtering method, the atomic layer deposition method, and the like can also be used.

Furthermore, regarding the above-described film 22, which has a negative fixed charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and the capability of preventing ion implantation during a process.

Moreover, in the case where the above-described film 22, which has a negative fixed charge, is formed from a hafnium oxide ($HfO_2$) film, since the refractive index of the hafnium oxide ($HfO_2$) film is about 2, it is possible to obtain an antireflection effect efficiently by adjusting the film thickness thereof. As a matter of course, regarding other types of films as well, it is possible to obtain the antireflection effect by optimizing the film thickness in accordance with the refractive index.

Subsequently, the insulating film 41 is formed on the above-described film 22, which has a negative fixed charge, and in addition, the light-shield film 42 is formed on the above-described insulating film 41. The above-described insulating film 41 is formed from, for example, a silicon oxide film. In this connection, the above-described light-shield film 42 is formed from, for example, a metal film having a light-shielding property. In the case where the light-shield film 42 is formed on the above-described film 22, which has a negative fixed charge, with the insulating film 41 therebetween, a reaction between the film 22, which is formed from a hafnium oxide film or the like and which has a negative fixed charge, and the metal in the light-shield film 42 can be prevented. In addition, since the insulating film 41 serves as an etching stopper when the light-shield film is etched, etching damage to the film 22, which has a negative fixed charge, can be prevented.

Next, as shown in FIG. 9 (3), a resist mask (not shown in the drawing) is formed on the above-described light-shield film 42 above a part of the above-described light-receiving portion 12 and the above-described peripheral circuit portion 14 through resist application and the lithography technology, and the above-described light-shield film 42 is worked through etching by using the resist mask, so that the light-shield film 42 is left on the above-described insulating film 41 above a part of the above-described light-receiving portion 12 and the above-described peripheral circuit portion 14. A region, into which no light enters, is formed in the light-receiving portion 12 by the resulting light-shield film 42, and a black level of the image is determined on the basis of an output of the light-receiving portion 12. Furthermore, since entrance of light into the peripheral circuit portion 14 is prevented, variations in characteristics due to entrance of light into the peripheral circuit portion are suppressed.

Subsequently, as shown in FIG. 9 (4), the insulating film 43 to reduce a height difference due to the above-described light-shield film 42 is formed on the above-described insulating film 41. It is preferable that the surface of this insulating film 43 is flattened. The insulating film 43 is formed from, for example, a coating insulating film.

Then, as shown in FIG. 10 (5), the color filter layer 44 is formed on the insulating film 43 above the above-described light-receiving portion 12 by a production technology in the public domain and, furthermore, the condenser lens 45 is formed on the color filter layer 44. At that time, a light-transmitting insulating film (not shown in the drawing) may be formed between the color filter layer 44 and the condenser lens 45 in order to prevent working damage to the color filter layer 44 during lens working. In this manner, the solid-state imaging device 1 is formed.

In the first example of the above-described method for manufacturing a solid-state imaging device (first manufacturing method), since the film 22, which has a negative fixed charge, is formed on the film 21, which lowers an interface state, the hole accumulation (hole accumulation) layer 23 is formed adequately at the interface on the light-receiving surface side of the light-receiving portion 12 by an electric field resulting from the negative fixed charge in the film 22, which has a negative fixed charge. Therefore, generation of electric charges (electrons) from the interface is suppressed and, in addition, even when electric charges (electrons) are generated, the electric charges do not flow into a charge storage portion serving as a potential well in the light-receiving portion 12, flow through the hole accumulation layer 23, in which many holes are present, and can be extinguished. Consequently, it can be prevented that a dark current due to the electric charges resulting from the interface is detected by the light-receiving portion and a dark current resulting from the interface state can be suppressed. Furthermore, since the film 21, which lowers the interface state, is disposed on the light-receiving surface of the light-receiving portion 12, generation of electrons resulting from the interface state is further suppressed, so that flowing of electrons, which serve as a dark current, resulting from the interface state into the light-receiving portion 12 is suppressed. Moreover, since the film 22, which has a negative fixed charge, is used, the HAD structure can be formed without conducting ion implantation and annealing.

Figure 13:
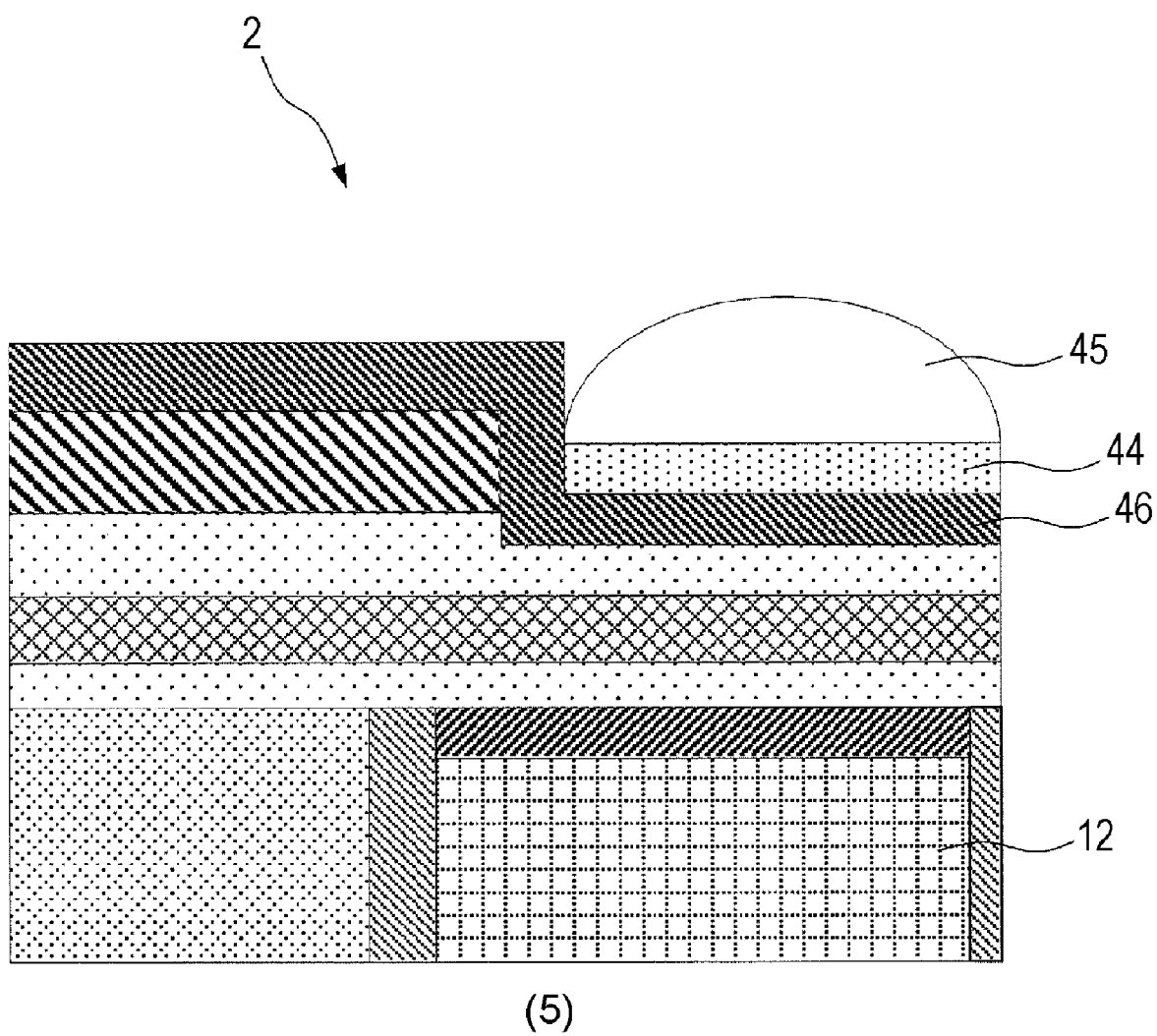
FIG. 13 is a production step sectional view showing an embodiment (second example) of the method for manufacturing a solid-state imaging device (first manufacturing method) according to the present invention.

Next, an embodiment (second example) of the method for manufacturing a solid-state imaging device (first manufacturing method) according to the present invention will be described with reference to production step sectional views of a key portion shown in FIG. 11 to FIG. 13. In FIG. 11 to FIG. 13, production steps of the above-described solid-state imaging device 2 are shown as an example.

As shown in FIG. 11 (1), the light-receiving portion 12, which photoelectrically converts incident light, the pixel isolation regions 13, which isolate the light-receiving portion 12, the peripheral circuit portion 14, in which a peripheral circuit (not specifically shown in the drawing) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used.

Subsequently, as shown in FIG. 11 (2), the film 21, which lowers an interface state, is formed on the light-receiving surface 12s of the above-described light-receiving portion 12, in actuality, on the above-described semiconductor substrate 11. This film 21, which lowers an interface state, is formed from, for example, a silicon oxide ($SiO_2$) film. Then, the film 22, which has a negative fixed charge, is formed on the above-described film 21, which lowers an interface state. The hole accumulation layer 23 is formed thereby on the light-receiving surface side of the above-described light-receiving portion 12. Therefore, at least on the light-receiving portion 12, it is necessary that the above-described film 21, which lowers an interface state, is formed having a film thickness to allow the hole accumulation layer 23 to be formed on the light-receiving surface 12s side of the above-described light-receiving portion 12 by the above-described film 22, which has a negative fixed charge. The film thickness thereof is specified to be, for example, 1 atomic layer or more, and 100 nm or less.

The above-described film 22, which has a negative fixed charge, is formed from, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described films of the types mentioned above have a track record in being used for gate insulating films or the like of insulated gate type field-effect transistors. Therefore, the film formation method has been established, and film formation can be conducted easily. As for the film formation method, for example, a chemical vapor deposition method, a sputtering method, and an atomic layer deposition method can be used.

In this regard, examples of the usable materials other than those described above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Moreover, the above-described film 22, which has a negative fixed charge, can also be formed from a hafnium nitride film, an aluminum nitride film, a hafnium oxynitride film, or an aluminum oxynitride film. As for these films, for example, the chemical vapor deposition method, the sputtering method, the atomic layer deposition method, and the like can also be used. However, use of the atomic layer deposition method is favorable because about 1 nm of $SiO_2$ layer, which reduces an interface state, can be formed at the same time during film formation.

Furthermore, regarding the above-described film 22, which has a negative fixed charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and the capability of preventing ion implantation during a process.

Moreover, in the case where the above-described film 22, which has a negative fixed charge, is formed from a hafnium oxide ($HfO_2$) film, since the refractive index of the hafnium oxide ($HfO_2$) film is about 2, it is possible to obtain an antireflection effect efficiently by adjusting the film thickness thereof. As a matter of course, regarding other types of films as well, it is possible to obtain the antireflection effect by optimizing the film thickness in accordance with the refractive index.

Subsequently, the insulating film 41 is formed on the above-described film 22, which has a negative fixed charge, and in addition, the light-shield film 42 is formed on the above-described insulating film 41. The above-described insulating film 41 is formed from, for example, a silicon oxide film. In this connection, the above-described light-shield film 42 is formed from, for example, a metal film having a light-shielding property. In the case where the light-shield film 42 is formed on the above-described film 22, which has a negative fixed charge, with the insulating film 41 therebetween, a reaction between the film 22, which is formed from a hafnium oxide film or the like and which has a negative fixed charge, and the metal in the light-shield film 42 can be prevented. In addition, since the insulating film 41 serves as an etching stopper when the light-shield film is etched, etching damage to the film 22, which has a negative fixed charge, can be prevented.

Next, as shown in FIG. 12 (3), a resist mask (not shown in the drawing) is formed on the above-described light-shield film 42 above a part of the above-described light-receiving portion 12 and the above-described peripheral circuit portion 14 through resist application and the lithography technology, and the above-described light-shield film 42 is worked through etching by using the resist mask, so that the light-shield film 42 is left on the above-described insulating film 41 above a part of the above-described light-receiving portion 12 and the above-described peripheral circuit portion 14. A region, into which no light enters, is formed in the light-receiving portion 12 by the resulting light-shield film 42, and a black level of the image is determined on the basis of an output of the light-receiving portion 12. Furthermore, since entrance of light into the peripheral circuit portion 14 is prevented, variations in characteristics due to entrance of light into the peripheral circuit portion are suppressed.

Then, as shown in FIG. 12 (4), the antireflection film 46 is formed on the above-described insulating film 41 in such a way as to cover the above-described light-shield film 42. This antireflection film 46 is formed from, for example, a silicon nitride film having a refractive index of about 2.

Subsequently, as shown in FIG. 13 (5), the color filter layer 44 is formed on the antireflection film 46 above the above-described light-receiving portion 12 and, furthermore, the condenser lens 45 is formed on the color filter layer 44. At that time, a light-transmitting insulating film (not shown in the drawing) may be formed between the color filter layer 44 and the condenser lens 45 in order to prevent working damage to the color filter layer 44 during lens working. In this manner, the solid-state imaging device 2 is formed.

According to the second example of the above-described method for manufacturing a solid-state imaging device (first manufacturing method), the effects similar to those of the above-described first example can be obtained. In addition, since the antireflection film 46 is formed, reflection before entrance into the light-receiving portion 12 can be reduced and, thereby, the amount of light incident on the light-receiving portion 12 can be increased, so that the sensitivity of the solid-state imaging device 2 can be improved.

Figure 16:
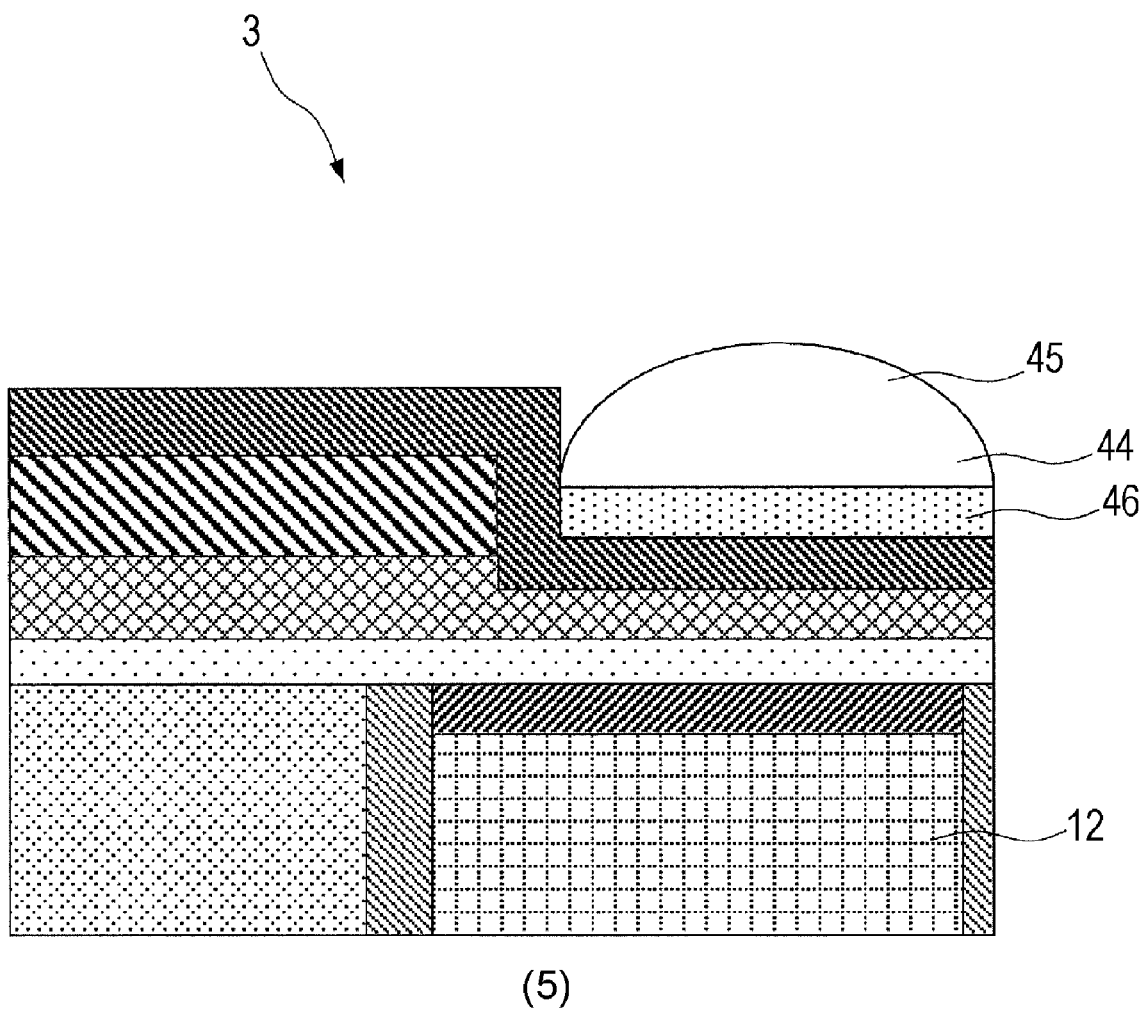
FIG. 16 is a production step sectional view showing an embodiment (third example) of the method for manufacturing a solid-state imaging device (first manufacturing method) according to the present invention.

Next, an embodiment (third example) of the method for manufacturing a solid-state imaging device (first manufacturing method) according to the present invention will be described with reference to production step sectional views of a key portion shown in FIG. 14 to FIG. 16. In FIG. 14 to FIG. 16, production steps of the above-described solid-state imaging device 3 are shown as an example.

As shown in FIG. 14 (1), the light-receiving portion 12, which photoelectrically converts incident light, the pixel isolation regions 13, which isolate the light-receiving portion 12, the peripheral circuit portion 14, in which a peripheral circuit (not specifically shown in the drawing) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used.

Subsequently, as shown in FIG. 14 (2), the film 21, which lowers an interface state, is formed on the light-receiving surface 12s of the above-described light-receiving portion 12, in actuality, on the above-described semiconductor substrate 11. This film 21, which lowers an interface state, is formed from, for example, a silicon oxide ($SiO_2$) film. Then, the film 22, which has a negative fixed charge, is formed on the above-described film 21, which lowers an interface state. The hole accumulation layer 23 is formed thereby on the light-receiving surface side of the above-described light-receiving portion 12. Therefore, at least on the light-receiving portion 12, it is necessary that the above-described film 21, which lowers an interface state, is formed having a film thickness to allow the hole accumulation layer 23 to be formed on the light-receiving surface 12s side of the above-described light-receiving portion 12 by the above-described film 22, which has a negative fixed charge. The film thickness thereof is specified to be, for example, 1 atomic layer or more, and 100 nm or less.

The above-described film 22, which has a negative fixed charge, is formed from, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described films of the types mentioned above have a track record in being used for gate insulating films or the like of insulated gate type field-effect transistors. Therefore, the film formation method has been established, and film formation can be conducted easily. As for the film formation method, for example, a chemical vapor deposition method, a sputtering method, and an atomic layer deposition method can be used. However, use of the atomic layer deposition method is favorable because about 1 nm of $SiO_2$ layer, which reduces an interface state, can be formed at the same time during film formation.

In this regard, examples of the usable materials other than those described above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Moreover, the above-described film 22, which has a negative fixed charge, can also be formed from a hafnium nitride film, an aluminum nitride film, a hafnium oxynitride film, or an aluminum oxynitride film. As for these films, for example, the chemical vapor deposition method, the sputtering method, the atomic layer deposition method, and the like can also be used.

Furthermore, regarding the above-described film 22, which has a negative fixed charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and the capability of preventing ion implantation during a process.

Moreover, in the case where the above-described film 22, which has a negative fixed charge, is formed from a hafnium oxide ($HfO_2$) film, it is possible to obtain an antireflection effect efficiently by adjusting the film thickness of the hafnium oxide ($HfO_2$) film. As a matter of course, regarding other types of films as well, it is possible to obtain the antireflection effect by optimizing the film thickness in accordance with the refractive index.

Then, the light-shield film 42 is formed on the above-described film 22, which has a negative fixed charge. The above-described light-shield film 42 is formed from, for example, a metal film having a light-shielding property. In the case where the light-shield film 42 is formed directly on the film 22, which has a negative fixed charge, as described above, the light-shield film 42 can be made close to the surface of the semiconductor substrate 11 and, thereby, the distance between the light-shield film 42 and the semiconductor substrate 11 is reduced, so that components of light incident slantingly from an upper layer of an adjacent photodiode, that is, optical color mixture components, can be reduced.

Next, as shown in FIG. 15 (3), a resist mask (not shown in the drawing) is formed on the above-described light-shield film 42 above a part of the above-described light-receiving portion 12 and the above-described peripheral circuit portion 14 through resist application and the lithography technology, and the above-described light-shield film 42 is worked through etching by using the resist mask, so that the light-shield film 42 is left on the above-described film 22, which has a negative fixed charge, above a part of the above-described light-receiving portion 12 and the above-described peripheral circuit portion 14. A region, into which no light enters, is formed in the light-receiving portion 12 by the resulting light-shield film 42, and a black level of the image is determined on the basis of an output of the light-receiving portion 12. Furthermore, since entrance of light into the peripheral circuit portion 14 is prevented, variations in characteristics due to entrance of light into the peripheral circuit portion are suppressed.

Thereafter, as shown in FIG. 15 (4), the antireflection film 46 is formed on the above-described film 22, which has a negative fixed charge, in such a way as to cover the above-described light-shield film 42. This antireflection film 46 is formed from, for example, a silicon nitride film having a refractive index of about 2.

Subsequently, as shown in FIG. 16 (5), the color filter layer 44 is formed on the antireflection film 46 above the above-described light-receiving portion 12 and, furthermore, the condenser lens 45 is formed on the color filter layer 44. At that time, a light-transmitting insulating film (not shown in the drawing) may be formed between the color filter layer 44 and the condenser lens 45 in order to prevent working damage to the color filter layer 44 during lens working. In this manner, the solid-state imaging device 3 is formed.

According to the third example of the above-described method for manufacturing a solid-state imaging device (first manufacturing method), the effects similar to those of the above-described first example can be obtained. In addition, since the light-shield film 42 is formed directly on the film 22, which has a negative fixed charge, the light-shield film 42 can be made close to the surface of the semiconductor substrate 11 and, thereby, the distance between the light-shield film 42 and the semiconductor substrate 11 is reduced, so that components of light incident slantingly from an upper layer of an adjacent photodiode, that is, optical color mixture components, can be reduced. Furthermore, since the antireflection film 46 is formed, the antireflection effect can be maximized in the case where the antireflection effect by only the film 22, which has a negative fixed charge, is inadequate.

Figure 19:
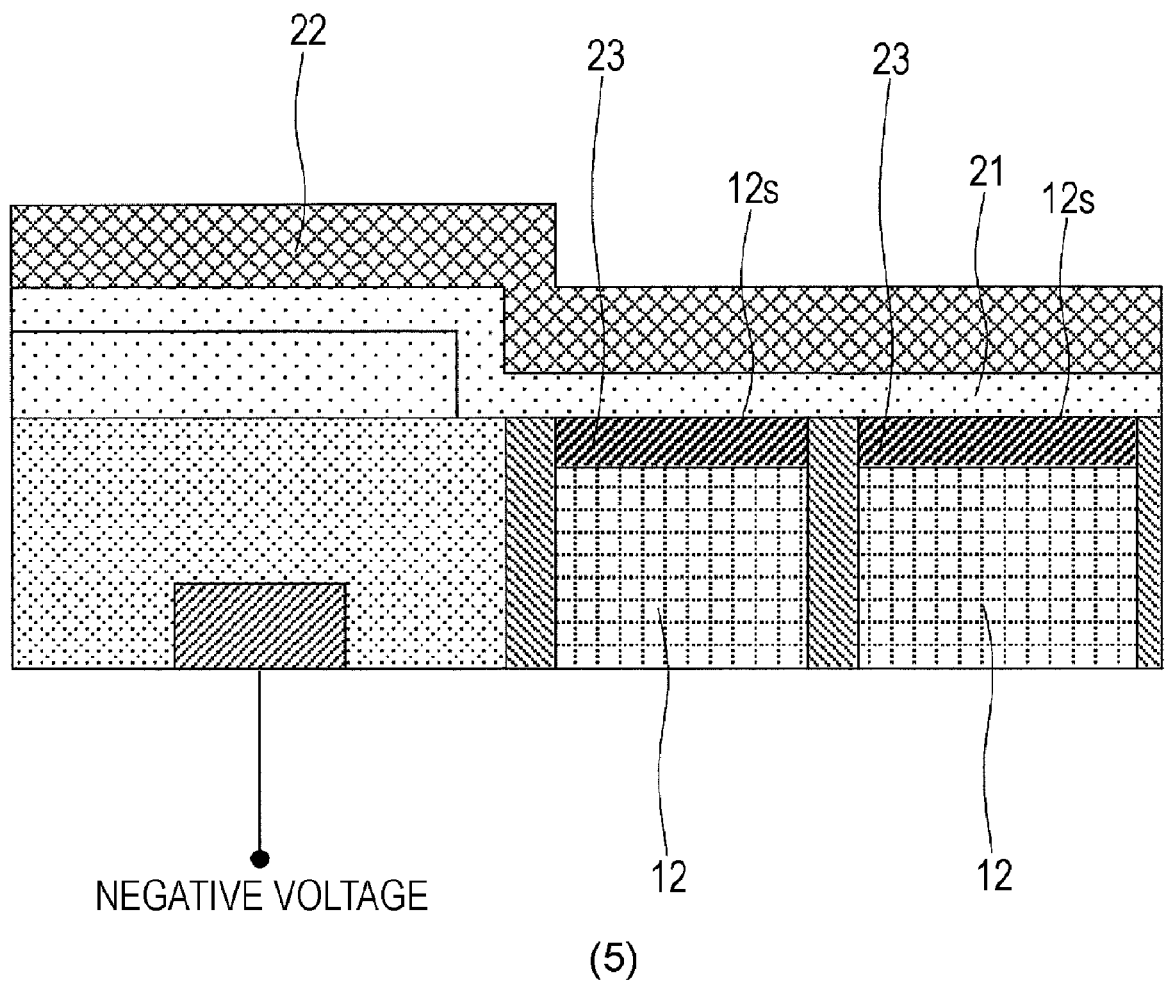
FIG. 19 is a production step sectional view showing an embodiment (fourth example) of the method for manufacturing a solid-state imaging device (first manufacturing method) according to the present invention.

Next, an embodiment (fourth example) of the method for manufacturing a solid-state imaging device (first manufacturing method) according to the present invention will be described with reference to production step sectional views of a key portion shown in FIG. 17 to FIG. 19. In FIG. 17 to FIG. 19, production steps of the above-described solid-state imaging device 4 are shown as an example.

As shown in FIG. 17 (1), the light-receiving portions 12, which photoelectrically convert incident light, the pixel isolation regions 13, which isolate the light-receiving portions 12, the peripheral circuit portion 14, in which a peripheral circuit (for example, a circuit 14C) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used. Subsequently, an insulating film 26, which has a light-transmitting property with respect to the above-described incident light, is formed. This insulating film 26 is formed from, for example, a silicon oxide film.

Then, as shown in FIG. 17 (2), a resist mask 51 is formed on the above-described insulating film 26 above the above-described peripheral circuit portion 14 through resist application and the lithography technology.

Thereafter, as shown in FIG. 18 (3), the above-described insulating film 26 is worked through etching by using the above-described resist mask 51 (refer to FIG. 17 (2) described above), so that the insulating film 26 is left on the above-described peripheral circuit portion 14. Subsequently, the above-described resist mask 51 is removed.

Next, as shown in FIG. 18 (4), the film 21, which covers the above-described insulating film 26 and which lowers an interface state, is formed on the light-receiving surface 12s of the above-described light-receiving portion 12, in actuality, on the above-described semiconductor substrate 11. This film 21, which lowers an interface state, is formed from, for example, a silicon oxide ($SiO_2$) film.

Then, as shown in FIG. 19 (5), the film 22, which has a negative fixed charge, is formed on the above-described film 21, which lowers an interface state. The hole accumulation layer 23 is formed thereby on the light-receiving surface side of the above-described light-receiving portion 12. Therefore, at least on the light-receiving portion 12, it is necessary that the above-described film 21, which lowers an interface state, is formed having a film thickness to allow the hole accumulation layer 23 to be formed on the light-receiving surface 12s side of the above-described light-receiving portion 12 by the above-described film 22, which has a negative fixed charge. The film thickness thereof is specified to be, for example, 1 atomic layer or more, and 100 nm or less.

The above-described film 22, which has a negative fixed charge, is formed from, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described films of the types mentioned above have a track record in being used for gate insulating films or the like of insulated gate type field-effect transistors. Therefore, the film formation method has been established, and film formation can be conducted easily. As for the film formation method, for example, a chemical vapor deposition method, a sputtering method, and an atomic layer deposition method can be used. However, use of the atomic layer deposition method is favorable because about 1 nm of $SiO_2$ layer, which reduces an interface state, can be formed at the same time during film formation.

In this regard, examples of the usable materials other than those described above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Moreover, the above-described film 22, which has a negative fixed charge, can also be formed from a hafnium nitride film, an aluminum nitride film, a hafnium oxynitride film, or an aluminum oxynitride film. As for these films, for example, the chemical vapor deposition method, the sputtering method, the atomic layer deposition method, and the like can also be used.

Furthermore, regarding the above-described film 22, which has a negative fixed charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and the capability of preventing ion implantation during a process.

Moreover, in the case where the above-described film 22, which has a negative fixed charge, is formed from a hafnium oxide ($HfO_2$) film, it is possible to obtain an antireflection effect efficiently by adjusting the film thickness thereof because the refractive index of the hafnium oxide ($HfO_2$) film is about 2. As a matter of course, regarding other types of films as well, it is possible to obtain the antireflection effect by optimizing the film thickness in accordance with the refractive index.

In the configuration on the film 22, which has a negative fixed charge, in the above-described solid-state imaging device 4, the light-shield film to shield a part of the light-receiving portion 12 and the peripheral circuit portion 14 from light, the color filter layer to disperse the light incident on at least the light-receiving portion 12, the condenser lens to condense the incident light on the light-receiving portion 12, and the like are disposed. As an example of the configuration, any one of the configurations of the above-described solid-state imaging devices 1, 2, and 3 can also be applied.

In the fourth example of the above-described method for manufacturing a solid-state imaging device (first manufacturing method), since the film 22, which has a negative fixed charge, is formed on the film 21, which lowers an interface state, the hole accumulation (hole accumulation) layer 23 is formed adequately at the interface on the light-receiving surface side of the light-receiving portion 12 by an electric field resulting from the negative fixed charge in the film 22, which has a negative fixed charge. Therefore, generation of electric charges (electrons) from the interface is suppressed and, in addition, even when electric charges (electrons) are generated, the electric charges do not flow into a charge storage portion serving as a potential well in the light-receiving portion 12, flow through the hole accumulation layer, in which many holes are present, and can be extinguished. Consequently, it can be prevented that a dark current due to the electric charges resulting from the interface is detected by the light-receiving portion and a dark current resulting from the interface state is suppressed. Furthermore, since the film 21, which lowers the interface state, is disposed on the light-receiving surface of the light-receiving portion 12, generation of electrons resulting from the interface state is further suppressed, so that flowing of electrons, which serve as a dark current, resulting from the interface state into the light-receiving portion 12 is suppressed. Moreover, since the film 22, which has a negative fixed charge, is used, the HAD structure can be formed without conducting ion implantation and annealing.

In addition, since the insulating film 26 is disposed on the peripheral circuit portion 14, the distance to the film 22, which has a negative fixed charge, on the peripheral circuit portion 14 becomes larger than the distance to the film, which has a negative fixed charge, on the light-receiving portion 12. Therefore, the negative electric field applied from the film 22, which has a negative fixed charge, to the peripheral circuit portion 14 is mitigated. That is, the influence of the film 22, which has a negative fixed charge, exerted on the peripheral circuit portion 14 is reduced. Consequently, a malfunction of the peripheral circuit portion 14 due to the negative electric field on the basis of the film 22, which has a negative fixed charge, is prevented.

Next, an embodiment (fifth example) of the method for manufacturing a solid-state imaging device (first manufacturing method) according to the present invention will be described with reference to production step sectional views of a key portion shown in FIG. 20 and FIG. 21. In FIG. 20 and FIG. 21, production steps of the above-described solid-state imaging device 5 are shown as an example.

As shown in FIG. 20 (1), the light-receiving portions 12, which photoelectrically convert incident light, the pixel isolation regions 13, which isolate the light-receiving portions 12, the peripheral circuit portion 14, in which a peripheral circuit (for example, a circuit 14C) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used. Subsequently, the film 21, which has a light-transmitting property with respect to the above-described incident light and which lowers the interface state, is formed. This film 21, which lowers the interface state, is formed from, for example, a silicon oxide film. Furthermore, a film 25 to keep the film, which has a negative fixed charge, away from the surface of the light-receiving surface is formed on the above-described film 21, which lowers the interface state. It is desirable that the above-described film 25 has a positive fixed charge to cancel the influence of the negative fixed charge, and it is preferable that silicon nitride is used.

At least on the light-receiving portion 12, it is necessary that the above-described film 21, which lowers an interface state, is formed having a film thickness to allow the hole accumulation layer 23, which will be described later, to be formed on the light-receiving surface 12s side of the above-described light-receiving portion 12 by the above-described film 22, which will be described later and which has a negative fixed charge. The film thickness thereof is specified to be, for example, 1 atomic layer or more, and 100 nm or less.

Then, as shown in FIG. 20 (2), a resist mask 52 is formed on the above-described film 25, which has a positive fixed charge, above the above-described peripheral circuit portion 14 through resist application and the lithography technology.

Thereafter, as shown in FIG. 21 (3), the above-described film 25, which has a positive fixed charge, is worked through etching by using the above-described resist mask 52 (refer to FIG. 20 (2) described above), so that the above-described film 25, which has a positive fixed charge, is left on the above-described peripheral circuit portion 14. Subsequently, the above-described resist mask 52 is removed.

Next, as shown in FIG. 21 (4), the film 22, which covers the above-described film 25 having a positive fixed charge and which has a negative fixed charge, is formed on the above-described film 21, which lowers the interface state.

The above-described film 22, which has a negative fixed charge, is formed from, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described films of the types mentioned above have a track record in being used for gate insulating films or the like of insulated gate type field-effect transistors. Therefore, the film formation method has been established, and film formation can be conducted easily. As for the film formation method, for example, a chemical vapor deposition method, a sputtering method, and an atomic layer deposition method can be used. However, use of the atomic layer deposition method is favorable because about 1 nm of $SiO_2$ layer, which reduces an interface state, can be formed at the same time during film formation.

In this regard, examples of the usable materials other than those described above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Moreover, the above-described film 22, which has a negative fixed charge, can also be formed from a hafnium nitride film, an aluminum nitride film, a hafnium oxynitride film, or an aluminum oxynitride film. As for these films, for example, the chemical vapor deposition method, the sputtering method, the atomic layer deposition method, and the like can also be used.

Furthermore, regarding the above-described film 22, which has a negative fixed charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and the capability of preventing ion implantation during a process.

Moreover, in the case where the above-described film 22, which has a negative fixed charge, is formed from a hafnium oxide ($HfO_2$) film, it is possible to obtain an antireflection effect efficiently by adjusting the film thickness of the hafnium oxide ($HfO_2$) film. As a matter of course, regarding other types of films as well, it is possible to obtain the antireflection effect by optimizing the film thickness in accordance with the refractive index.

In the configuration on the film 22, which has a negative fixed charge, in the above-described solid-state imaging device 5, the light-shield film to shield a part of the light-receiving portion 12 and the peripheral circuit portion 14 from light, the color filter layer to disperse the light incident on at least the light-receiving portion 12, the condenser lens to condense the incident light on the light-receiving portion 12, and the like are disposed. As an example of the configuration, any one of the configurations of the above-described solid-state imaging devices 1, 2, and 3 can also be applied. In the fifth example of the above-described method for manufacturing a solid-state imaging device (first manufacturing method), since the film 22, which has a negative fixed charge, is formed on the film 21, which lowers an interface state, the hole accumulation (hole accumulation) layer 23 is formed adequately at the interface on the light-receiving surface side of the light-receiving portion 12 by an electric field resulting from the negative fixed charge in the film 22, which has a negative fixed charge. Therefore, generation of electric charges (electrons) from the interface is suppressed and, in addition, even when electric charges (electrons) are generated, the electric charges do not flow into a charge storage portion serving as a potential well in the light-receiving portion 12, flow through the hole accumulation layer 23, in which many holes are present, and can be extinguished. Consequently, it can be prevented that a dark current due to the electric charges resulting from the interface is detected by the light-receiving portion and a dark current resulting from the interface state is suppressed. Furthermore, since the film 21, which lowers the interface state, is disposed on the light-receiving surface of the light-receiving portion 12, generation of electrons resulting from the interface state is further suppressed, so that flowing of electrons, which serve as a dark current, resulting from the interface state into the light-receiving portion 12 is suppressed. Moreover, since the film 22, which has a negative fixed charge, is used, the HAD structure can be formed without conducting ion implantation and annealing.

In addition, since the film 25, which has preferably a positive fixed charge and which keeps the film having a negative fixed charge away from the surface of the light-receiving surface, is disposed above the above-described peripheral circuit portion 14 and under the above-described film 22, which has a negative fixed charge, the negative fixed charge of the film 22, which has the negative charge, is reduced by the positive fixed charge in the film 25, which has the positive fixed charge, so that the influence due to the electric field of the negative fixed charge in the film 22, which has the negative fixed charge, is not exerted on the peripheral circuit portion 14. Consequently, a malfunction of the peripheral circuit portion 14 due to the negative fixed charge can be prevented.

Here, regarding a hafnium oxide ($HfO_2$) film as an example of the film, which has a negative fixed charge, data indicating the presence of the negative fixed charge will be described with reference to FIG. 22.

As for a first sample, MOS capacitors, in which a gate electrode was formed on a silicon substrate with a thermal silicon oxide ($SiO_2$) film therebetween, were prepared, where the film thicknesses of the above-described thermal silicon oxide films were changed.

As for a second sample, MOS capacitors, in which a gate electrode was formed on a silicon substrate with a CVD silicon oxide (CVD-$SiO_2$) film therebetween, were prepared, where the film thicknesses of the above-described CVD silicon oxide films were changed.

As for a third sample, MOS capacitors, in which a gate electrode was formed on a silicon substrate with a laminated film composed of sequentially laminated ozone silicon oxide ($O_3$—$SiO_2$) film, hafnium oxide ($HfO_2$) film, and CVD silicon oxide ($SiO_2$) film therebetween, were prepared, where the film thicknesses of the above-described CVD silicon oxide films were changed. In this regard, the film thicknesses of the $HfO_2$ film and the $O_3$—$SiO_2$ film were fixed.

In each of the above-described samples, the CVD-$SiO_2$ film is formed by a CVD method through the use of a mixed gas of monosilane ($SiH_4$) and oxygen ($O_2$), and the $HfO_2$ film is formed by an ALD method in which tetrakisethylmethyl-amino hafnium (tetrakisethylmethyl-amino hafnium: TEMAHf) and ozone ($O_3$) serve as raw materials. The $O_3$—$SiO_2$ film in the above-described third sample is an interfacial oxide film, which is formed between $HfO_2$ and the silicon substrate by the ALD method in the formation of the $HfO_2$ film and which has a thickness of about 1 nm. As for every gate electrode in the above-described individual samples, a structure, in which an aluminum (Al) film, a titanium nitride (TiN) film, and a titanium (Ti) film are laminated in that order from the upper layer, is employed.

In this connection, regarding the above-described sample structures, in the first sample and the second sample, the gate electrode is disposed immediately above the $SiO_2$ film, whereas only the third sample including the $HfO_2$ film has the structure, in which the CVD-$SiO_2$ film is laminated on the $HfO_2$ film. The reason therefor is that an occurrence of reaction between $HfO_2$ and the gate electrode at the interface is prevented by bringing $HfO_2$ into direct contact with the electrode.

Furthermore, in the laminated structure of the third sample, the $HfO_2$ film thickness was fixed at 10 nm, and the film thickness of the CVD-$SiO_2$ film serving as an upper layer was changed. The reason therefor is that $HfO_2$ has a large specific dielectric constant and, therefore, even when a film thickness at a level of 10 nm is formed, the film thickness in terms of oxide film is several nanometers. Consequently, it is difficult to observe changes in flat band voltage Vfb versus film thickness in terms of oxide film.

Regarding the above-described first sample, second sample, and third sample, the film thickness Tox in terms of oxide film versus the flat band voltage Vfb was examined. The results thereof are shown in FIG. 22.

Figure 22:
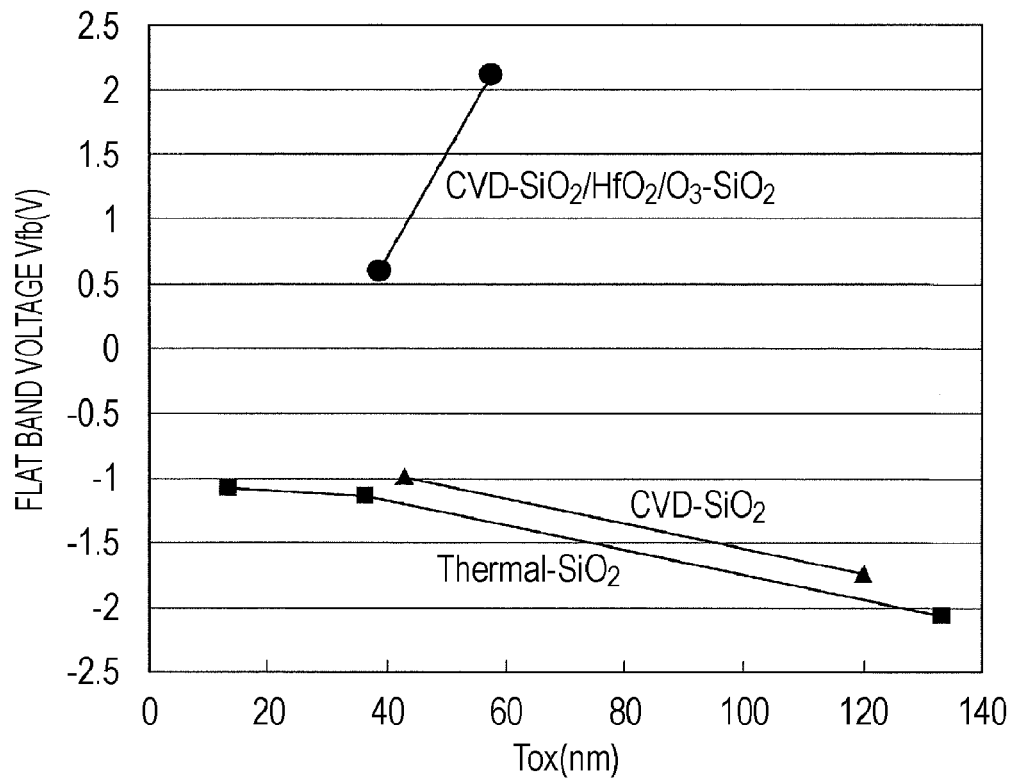
FIG. 22 is a relationship diagram between the flat band voltage and the film thickness in terms of oxide film showing that a negative fixed charge is present in a hafnium oxide ($HfO_2$) film.

As shown in FIG. 22, regarding the first sample including the thermal oxide (Thermal-$SiO_2$) film and the second sample including the CVD-$SiO_2$ film, the flat band voltage shifts in the negative direction along with an increase in film thickness. On the other hand, it is ascertained that regarding only the third sample including the $HfO_2$ film, the flat band voltage shifts in the positive direction along with an increase in film thickness. As is clear from this behavior of the flat band voltage, a negative charge is present in the film of the $HfO_2$ film. Moreover, it has been known that the above-described individual materials, which constitute the films having negative fixed charges, other than $HfO_2$ have negative fixed charges similarly to $HfO_2$.

Figure 23:
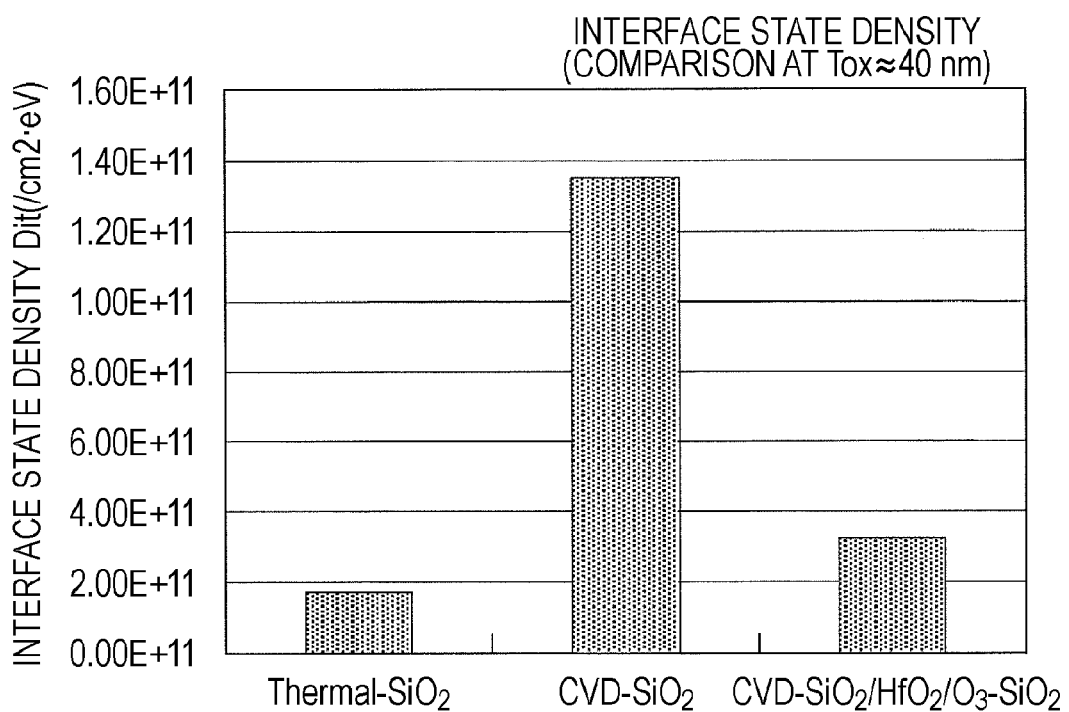
FIG. 23 is a comparison diagram between interface state densities showing that a negative fixed charge is present in a hafnium oxide ($HfO_2$) film.

In addition, the data of interface state densities of the above-described individual samples are shown in FIG. 23. In this FIG. 23, the interface state densities Dit are compared by using the first sample, the second sample, and the third sample, which had nearly equal Tox of about 40 nm in FIG. 22.

As a result, as shown in FIG. 23, the characteristic of the first sample including the thermal oxide (Thermal-$SiO_2$) film is 2E10 (/$cm^2 \cdot eV$), whereas the interface state of the second sample including the CVD-$SiO_2$ film shows an about an order of magnitude worse result. On the other hand, it is ascertained that the third sample including the $HfO_2$ film has a good interface of about 3E10/$cm^2 \cdot eV$ and is close to the thermal oxide film. Furthermore, it has been known that the above-described individual materials, which constitute the films having negative fixed charges, other than $HfO_2$ have good interface states close to the thermal oxide film similarly to $HfO_2$.

Next, the film thickness Tox in terms of oxide film versus the flat band voltage Vfb was examined in the case where the film 25, which had a positive fixed charge, was formed. The results thereof are shown in FIG. 24.

Figure 24:
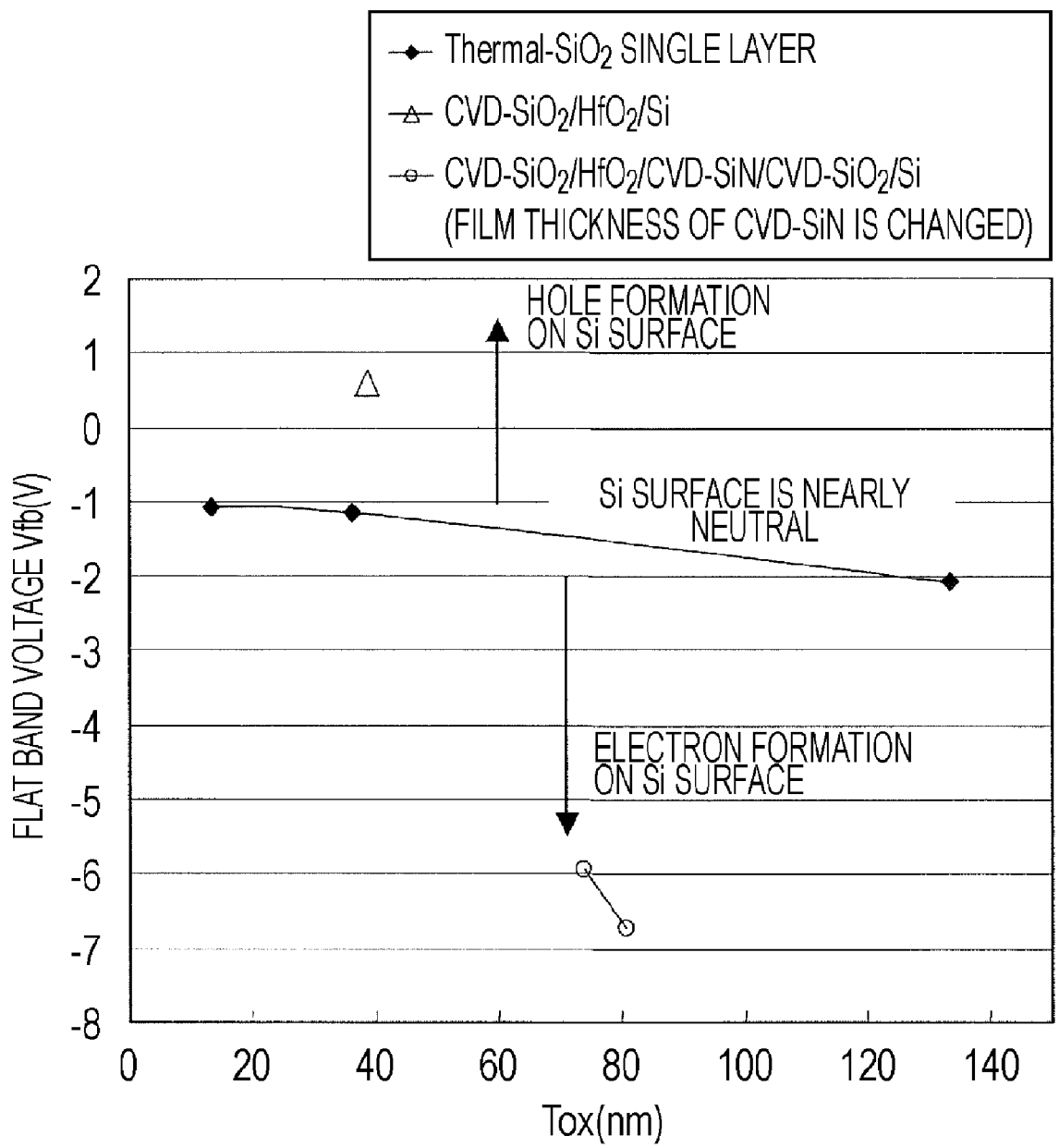
FIG. 24 is a relationship diagram between the flat band voltage and the film thickness in terms of oxide film for explaining formation of electrons (electrons) and formation of holes (holes) with reference to a thermal oxide film.

As shown in FIG. 24, in the case where the flat band voltage is larger than that of the thermal oxide film, there is a negative voltage in the film, and the silicon (Si) surface forms holes. Examples of such laminated films include a film in which a $HfO_2$ film and a CVD-$SiO_2$ film are laminated on a silicon (Si) substrate surface sequentially from a lower layer. On the other hand, in the case where the flat band voltage is smaller than that of the thermal oxide film, there is a positive voltage in the film, and the silicon (Si) surface forms electrons (electrons). Examples of such laminated films include a film in which a CVD-$SiO_2$ film, a CVD-SiN film, a $HfO_2$ film, and a CVD-$SiO_2$ film are laminated on a silicon (Si) substrate surface sequentially from a lower layer. Here, if the film thickness of the CVD-SiN film is increased, the flat band voltage shifts in the negative direction significantly as compared with that of the thermal oxide film. Furthermore, an influence of the positive charge in the CVD-SiN film cancels the negative charge of hafnium oxide ($HfO_2$).

Regarding the solid-state imaging device 1 to the solid-state imaging device 5 in the above-described individual examples, as described above, in the case where nitrogen (N) is contained in the film 22, which has a negative fixed charge, after the film 22, which has a negative fixed charge, is formed, nitrogen (N) can be contained by a nitriding treatment with high-frequency plasma or microwave plasma. Moreover, the above-described film 22, which has a negative fixed charge, is subjected to an electron beam curing treatment through electron beam irradiation after film formation and, thereby, the negative fixed charge in the film can be increased.

Next, an embodiment (first example) of a solid-state imaging device (second solid-state imaging device) according to the present invention will be described with reference to a key portion configuration sectional view shown in FIG. 25. In this regard, in FIG. 25, a light-shield film to shield a part of the light-receiving portion and the peripheral circuit portion from light, a color filter layer to disperse the light incident on the light-receiving portion, a condenser lens to condense the incident light on the light-receiving portion, and the like are not shown in the drawing.

Figure 25:
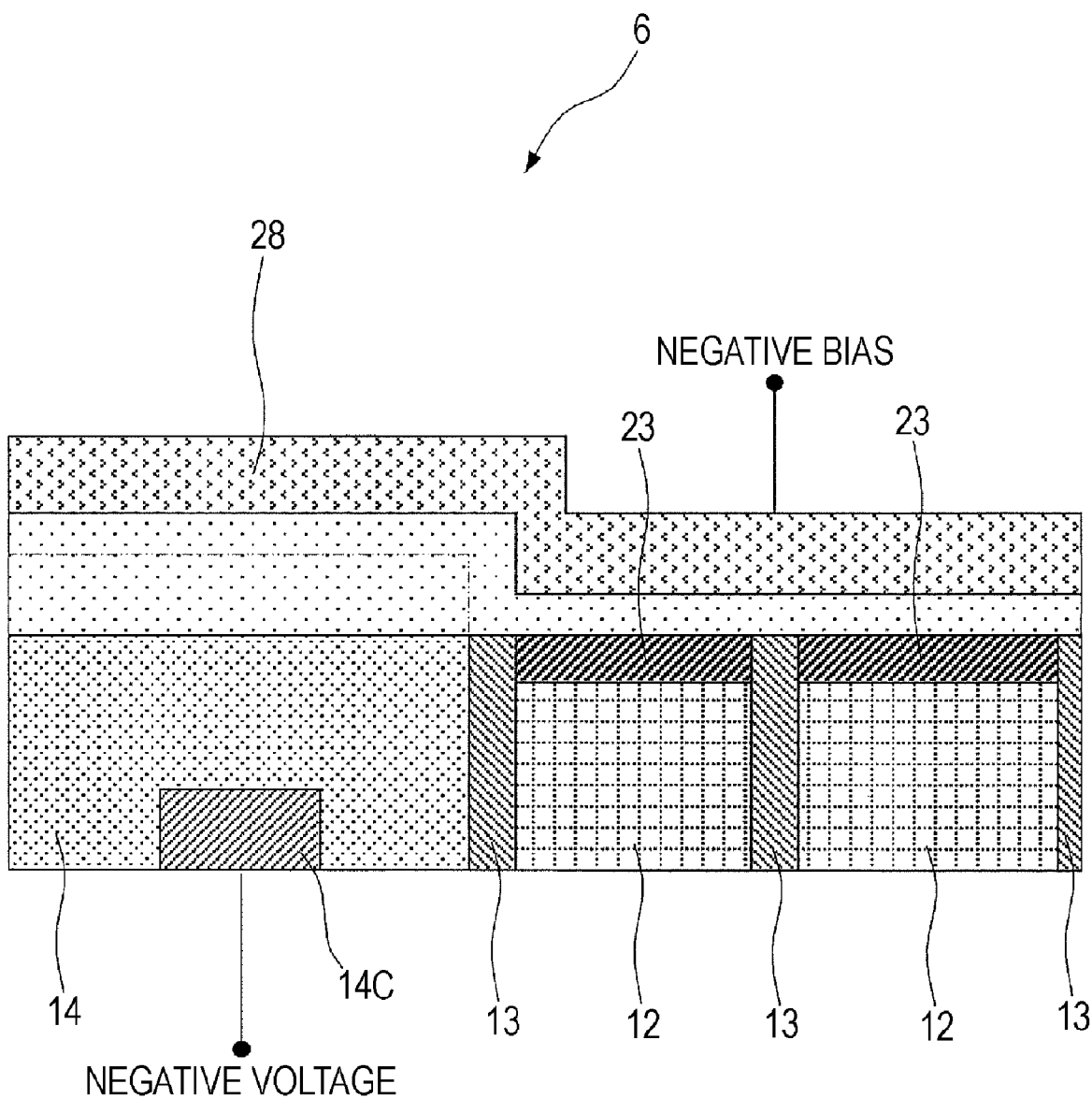
FIG. 25 is a key portion configuration sectional view showing an embodiment (first example) of a solid-state imaging device (second solid-state imaging device) according to the present invention.

As shown in FIG. 25, the solid-state imaging device 6 includes the light-receiving portions 12, which photoelectrically convert incident light, on the semiconductor substrate (or semiconductor layer) 11 and includes the peripheral circuit portion 14, in which a peripheral circuit (for example, a circuit 14C) is disposed on the portion beside the light-receiving portion 12 with the pixel isolation region 13 therebetween. An insulating film 27 is disposed on the light-receiving surface 12s of the above-described light-receiving portion (including a hole accumulation layer 23 described later) 12. This insulating film 27 is formed from, for example, a silicon oxide ($SiO_2$) film. A film 28, which applies a negative voltage, is disposed on the above-described insulating film 27.

In the drawing, the above-described insulating film 27 is disposed having a thickness above the peripheral circuit portion 14 larger than the thickness above the above-described light-receiving portion 12 in such a way that the distance of the above-described film 28, which applies a negative voltage, from the surface of the above-described peripheral circuit portion 14 becomes larger than the distance from the surface of the above-described light-receiving portion 12. Furthermore, in the case where the above-described insulating film 27 is formed from, for example, a silicon oxide film, this insulating film 27 has a function similar to that of the above-described film 21, which lowers a interface state, on the light-receiving portion 12. For that purpose, it is preferable that the above-described insulating film 27 on the above-described light-receiving portion 12 is disposed having a film thickness of, for example, 1 atomic layer or more, and 100 nm or less. Consequently, when a negative voltage is applied to the film 28, which applies a negative voltage, the hole accumulation layer 23 is formed on the light-receiving surface side of the above-described light-receiving portion 12.

In the case where the above-described solid-state imaging device 6 is a CMOS image sensor, examples of peripheral circuits of the above-described peripheral circuit portion 14 include pixel circuits composed of transistors, e.g., a transfer transistor, a reset transistor, an amplifying transistor, and a selection transistor. Furthermore, a drive circuit to effect an operation to read signals of lines to be read in a pixel array portion composed of a plurality of light-receiving portions 12, a vertical scanning circuit to transfer the signals read, a shift register or an address decoder, a horizontal scanning circuit, and the like are included.

Alternatively, in the case where the above-described solid-state imaging device 6 is a CCD image sensor, examples of peripheral circuits of the above-described peripheral circuit portion 14 include a read gate, which reads photoelectrically converted signal charges from the light-receiving portion to a vertical transfer gate, and a vertical charge transfer portion, which transfers read signal charges in the vertical direction. Furthermore, a horizontal charge transfer portion and the like are included.

The above-described film 28, which applies a negative voltage, is formed from, for example, a film, which is transparent with respect to the incident light and which has electrical conductivity, and is formed from, for example, an electrically conductive film transparent with respect to the visible light. As for such a film, an indium tin oxide film, an indium zinc oxide film, or an indium oxide film, a tin oxide film, a gallium zinc oxide film, or the like can be used.

Regarding the configuration on the film 28, which applies a negative voltage, in the above-described solid-state imaging device 6, the light-shield film to shield a part of the light-receiving portion 12 and the peripheral circuit portion 14 from light, the color filter layer to disperse the light incident on at least the light-receiving portion 12, the condenser lens to condense the incident light on the light-receiving portion 12, and the like are disposed. As an example of the configuration, any one of the configurations of the above-described solid-state imaging devices 1, 2, and 3 can also be applied.

In the above-described solid-state imaging device (second solid-state imaging device) 6, since the film 28, which applies a negative voltage, is disposed on the insulating film 27 disposed on the light-receiving surface 12s of the light-receiving portion 12, the hole accumulation (hole accumulation) layer is formed adequately at the interface on the light-receiving surface 12s side of the light-receiving portion 12 by an electric field generated through application of a negative voltage to the film 28, which applies a negative voltage. Therefore, generation of electric charges (electrons) from the interface is suppressed and, in addition, even when electric charges (electrons) are generated from the interface, the electric charges do not flow into a charge storage portion serving as a potential well in the light-receiving portion, flow through the hole accumulation layer 23, in which many holes are present, and can be extinguished. Consequently, it can be prevented that the electric charges resulting from the interface serve as a dark current and are detected by the light-receiving portion 12, and a dark current resulting from the interface state can be suppressed. Moreover, since the insulating film 27 serving as a film, which lowers the interface state, is disposed on the light-receiving surface 12s of the light-receiving portion 12, generation of electrons resulting from the interface state is further suppressed, so that flowing of electrons, which serve as a dark current and which result from the interface state, into the light-receiving portion 12 is suppressed.

In addition, as shown in the drawing, the distance of the above-described film 28, which applies a negative voltage, from the surface of the above-described peripheral circuit portion 14 is made to be larger than the distance from the surface of the above-described light-receiving portion 12 by the insulating film 27. Therefore, the influence exerted on the peripheral circuit portion 14 by the electric field generated when a negative charge is applied to the film 28, which applies a negative voltage, is reduced. Consequently, a malfunction of the circuit in the peripheral circuit portion 14 can be eliminated.

Next, an embodiment (second example) of the solid-state imaging device (second solid-state imaging device) will be described with reference to a key portion configuration sectional view shown in FIG. 26. In this regard, in FIG. 26, a light-shield film to shield a part of the light-receiving portion and the peripheral circuit portion from light, a color filter layer to disperse the light incident on the light-receiving portion, a condenser lens to condense the incident light on the light-receiving portion, and the like are not shown in the drawing.

Figure 26:
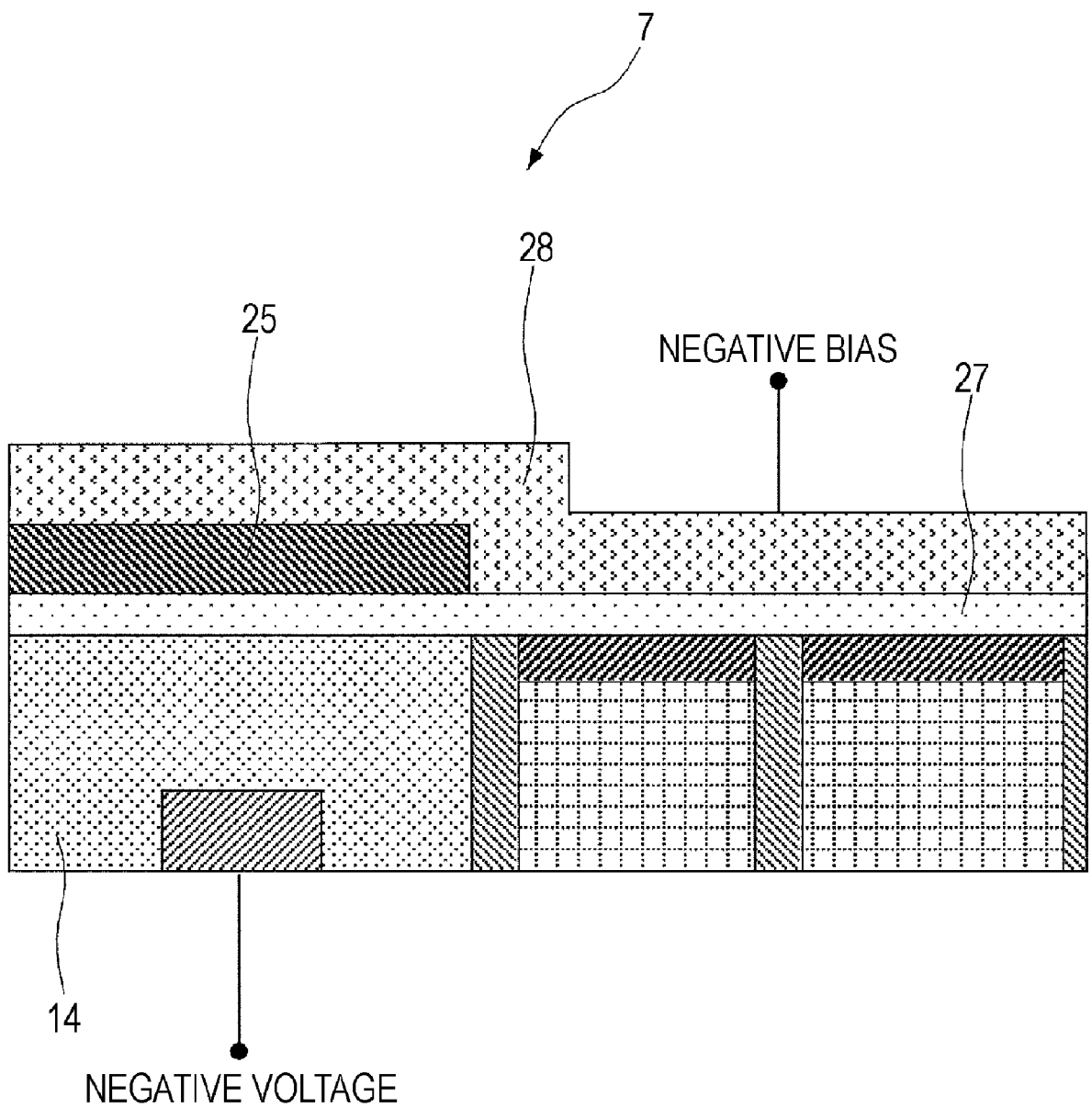
FIG. 26 is a key portion configuration sectional view showing an embodiment (second example) of the solid-state imaging device (second solid-state imaging device) according to the present invention.

As shown in FIG. 26, in the solid-state imaging device 7, a film 25 to keep the film, which applies a negative voltage, away from the surface of the light-receiving surface is disposed on the above-described peripheral circuit portion 14, in actuality, between the insulating film 27 and the above-described film 28, which applies a negative voltage, in the above-described solid-state imaging device 6. It is desirable that the above-described film 25 has a positive fixed charge to cancel the influence of the negative voltage. It is enough that the film 25, which has a positive fixed charge, is disposed above the above-described peripheral circuit portion 14 and under the above-described film 28, which applies a negative voltage, and it does not a matter whether on the above-described insulating film 27 or under the insulating film 27. Furthermore, the drawing shows the case where the insulating film 27 is formed from a film having a uniform thickness. However, the insulating film may have a thickness above the peripheral circuit portion 14 larger than the thickness above the light-receiving portion 12, as in the above-described solid-state imaging device 6.

An examples of the above-described film 25, which has a positive fixed charge, is a silicon nitride film.

As described above, since the film 25, which has a positive fixed charge, is disposed between the above-described peripheral circuit portion 14 and the above-described film 28, which applies a negative voltage, the negative electric field generated when a negative charge is applied to the film 28, which applies a negative voltage, is reduced by a positive fixed charge in the film 25, which has the positive fixed charge. Therefore, the influence due to this negative electric field is not exerted on the peripheral circuit portion 14. Consequently, a malfunction of the peripheral circuit portion 14 due to the negative electric field can be prevented and the reliability of the peripheral circuit portion 14 is enhanced. The above-described configuration in which the film 25, which has a positive fixed charge, is disposed above the above-described peripheral circuit portion 14 and under the above-described film 28, which applies a negative voltage, can also be applied to the above-described solid-state imaging device 6, and the effects similar to those of the solid-state imaging device 7 can be obtained.

Figure 29:
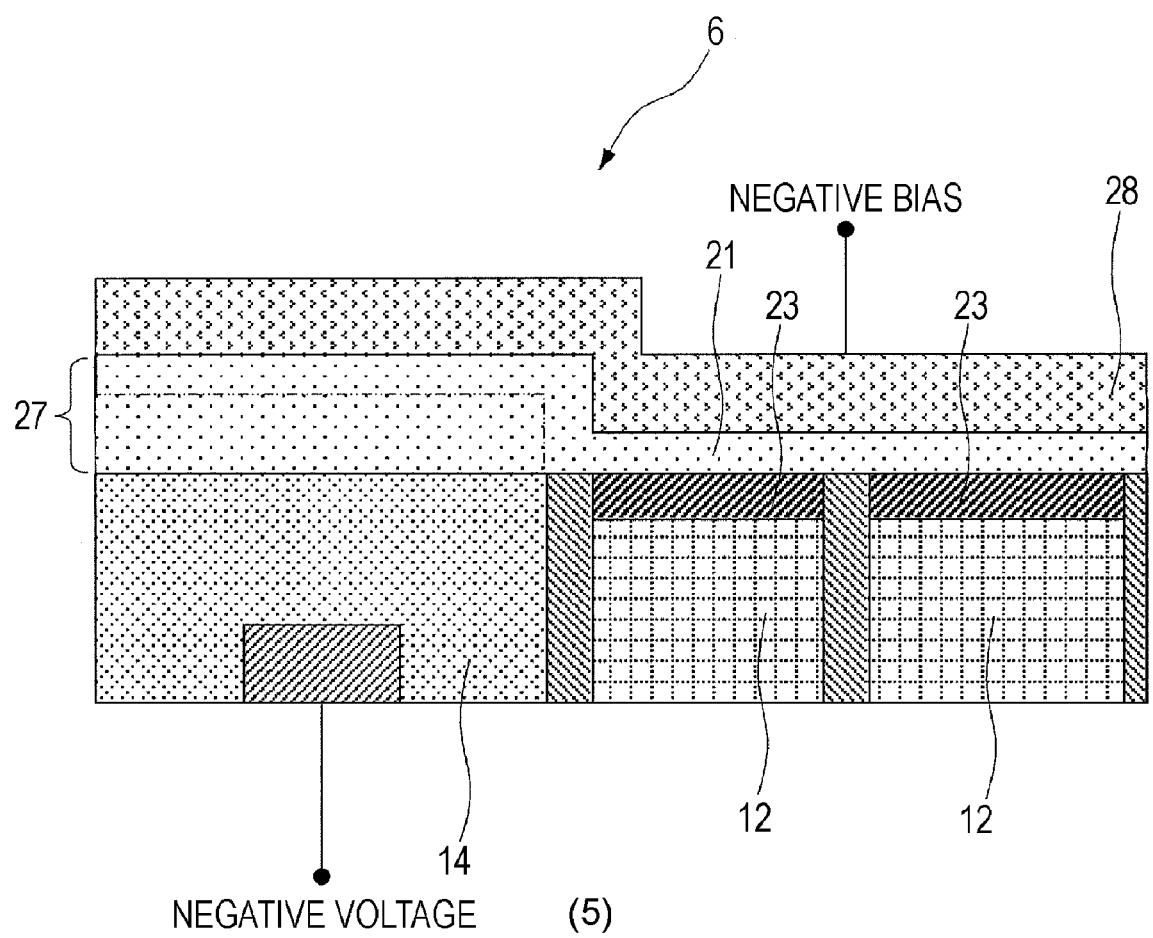
FIG. 29 is a production step sectional view showing an embodiment (first example) of the method for manufacturing a solid-state imaging device (second manufacturing method) according to the present invention.

Next, an embodiment (first example) of the method for manufacturing a solid-state imaging device (second manufacturing method) according to the present invention will be described with reference to production step sectional views of a key portion shown in FIG. 27 to FIG. 29. In FIG. 27 to FIG. 29, production steps of the above-described solid-state imaging device 4 are shown as an example.

As shown in FIG. 27 (1), the light-receiving portions 12, which photoelectrically convert incident light, the pixel isolation regions 13, which isolate the light-receiving portions 12, the peripheral circuit portion 14, in which a peripheral circuit (for example, a circuit 14C) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used. Subsequently, an insulating film 29, which has a light-transmitting property with respect to the above-described incident light, is formed. This insulating film 29 is formed from, for example, a silicon oxide film.

Then, as shown in FIG. 27 (2), a resist mask 53 is formed on the above-described insulating film 29 above the above-described peripheral circuit portion 14 through resist application and the lithography technology.

Thereafter, as shown in FIG. 28 (3), the above-described insulating film 29 is worked through etching by using the above-described resist mask 53 (refer to FIG. 27 (2) described above), so that the insulating film 29 is left on the above-described peripheral circuit portion 14. Subsequently, the above-described resist mask 53 is removed.

Next, as shown in FIG. 28 (4), the film 21, which covers the above-described insulating film 29 and which lowers an interface state, is formed on the light-receiving surface 12s of the above-described light-receiving portion 12, in actuality, on the above-described semiconductor substrate 11. This film 21, which lowers an interface state, is formed from, for example, a silicon oxide (SiO$_2$) film. In this manner, the insulating film 27 is formed from the above-described insulating film 29 and the above-described film 21, which lowers an interface state.

Then, as shown in FIG. 29 (5), the film 28, which applies a negative voltage, is formed on the above-described film 21, which lowers an interface state. The hole accumulation layer 23 is formed on the light-receiving surface side of the above-described light-receiving portion 12 by applying a negative voltage to this film 28, which applies a negative voltage. Therefore, at least on the light-receiving portion 12, it is necessary that the above-described film 21, which lowers an interface state, is formed having a film thickness to allow the hole accumulation layer 23 to be formed on the light-receiving surface 12s side of the above-described light-receiving portion 12 by the negative voltage applied to the above-described film 28, which applies a negative voltage. The film thickness thereof is specified to be, for example, 1 atomic layer or more, and 100 nm or less.

The above-described film 28, which applies a negative voltage, is formed from, for example, a film which is transparent with respect to the incident light and which has electrical conductivity, and is formed from, for example, an electrically conductive film transparent with respect to the visible light. As for such a film, an indium tin oxide film, an indium zinc oxide film, or an indium oxide film, a tin oxide film, a gallium zinc oxide film, or the like can be used.

In the above-described solid-state imaging device 6, the light-shield film to shield a part of the light-receiving portion 12 and the peripheral circuit portion 14 from light, the color filter layer to disperse the light incident on at least the light-receiving portion 12, the condenser lens to condense the incident light on the light-receiving portion 12, and the like are disposed on the film 28, which applies a negative voltage. As for a manufacturing method therefor, as an example, any one of the methods described in the individual examples of the above-described method for manufacturing a solid-state imaging device (first manufacturing method) can also be applied.

In the first example of the method for manufacturing the above-described solid-state imaging device 6 (second manufacturing method), since the film 28, which applies a negative voltage, is formed on the insulating film 27 disposed on the light-receiving surface 12s of the light-receiving portion 12, the hole accumulation (hole accumulation) layer is formed adequately at the interface on the light-receiving surface 12s side of the light-receiving portion 12 by an electric field generated through application of a negative voltage to the film 28, which applies a negative voltage. Therefore, generation of electric charges (electrons) from the interface is suppressed and, in addition, even when electric charges (electrons) are generated, the electric charges do not flow into a charge storage portion serving as a potential well in the light-receiving portion, flow through the hole accumulation layer 23, in which many holes are present, and can be extinguished. Consequently, it can be prevented that the electric charges resulting from the interface serve as a dark current and are detected by the light-receiving portion 12, and a dark current resulting from the interface state can be suppressed. Moreover, since the film 21, which lowers the interface state, is disposed on the light-receiving surface 12s of the light-receiving portion 12, generation of electrons resulting from the interface state is further suppressed, so that flowing of electrons, which serve as a dark current, resulting from the interface state into the light-receiving portion 12 is suppressed.

In addition, as shown in the drawing, the insulating film 27 is disposed having a thickness above the peripheral circuit portion 14 larger than the thickness of the insulating film 27 above the above-described light-receiving portion 12 in such a way that the distance of the above-described film 28, which applies a negative voltage, from the surface of the above-described peripheral circuit portion 14 becomes larger than the distance from the surface of the above-described light-receiving portion 12 by the insulating film 27. Therefore, the influence exerted by the electric field generated when a negative charge is applied to the film 28, which applies a negative voltage, on the peripheral circuit portion 14 is reduced. That is, the field strength is reduced, accumulation of holes on the surface of the peripheral circuit portion 14 is suppressed and, thereby, a malfunction of the circuit in the peripheral circuit portion 14 can be eliminated.

Next, an embodiment (second example) of the method for manufacturing a solid-state imaging device (second manufacturing method) according to the present invention will be described with reference to production step sectional views of a key portion shown in FIG. 30 and FIG. 31. In FIG. 30 and FIG. 31, production steps of the above-described solid-state imaging device 4 are shown as an example.

As shown in FIG. 30 (1), the light-receiving portions 12, which photoelectrically convert incident light, the pixel isolation regions 13, which isolate the light-receiving portions 12, the peripheral circuit portion 14, in which a peripheral circuit (for example, a circuit 14C) is disposed opposing to the light-receiving portion 12 with the pixel isolation region 13 therebetween, and the like are formed on the semiconductor substrate (or semiconductor layer) 11. As for this manufacturing method, a manufacturing method in the public domain is used. Subsequently, an insulating film 27, which has a light-transmitting property with respect to the above-described incident light, is formed. This insulating film 27 is formed from, for example, a silicon oxide film. Furthermore, the film 25, which has a positive fixed charge, is formed on the above-described insulating film 27. This film 25, which has a positive fixed charge, is formed from, for example, a silicon nitride film.

Then, as shown in FIG. 30 (2), a resist mask 54 is formed on the above-described film 25, which has a positive fixed charge, above the above-described peripheral circuit portion 14 through resist application and the lithography technology.

Thereafter, as shown in FIG. 31 (3), the above-described film 25, which has a positive fixed charge, is worked through etching by using the above-described resist mask 54 (refer to FIG. 30 (2) described above), so that the film 25, which has a positive fixed charge, is left on the above-described peripheral circuit portion 14. Subsequently, the above-described resist mask 54 is removed.

Next, as shown in FIG. 31 (4), the film 28, which applies a negative voltage, is formed on the above-described insulating film 27 and the above-described film 25, which has a positive fixed charge. The hole accumulation layer 23 is formed on the light-receiving surface side of the above-described light-receiving portion 12 through application of a negative voltage to this film 28, which applies a negative voltage. At that time, the above-described insulating film 27 is allowed to function as a film, which lowers an interface state. For that purpose, at least on the light-receiving portion 12, it is necessary that the above-described insulating film 27 is formed having a film thickness to allow the hole accumulation layer 23 to be formed on the light-receiving surface 12s side of the above-described light-receiving portion 12 by the negative voltage applied to the above-described film 28, which applies a negative voltage. The film thickness thereof is specified to be, for example, 1 atomic layer or more, and 100 nm or less.

The above-described film 28, which applies a negative voltage, is formed from, for example, a film which is transparent with respect to the incident light and which has electrical conductivity, and is formed from, for example, an electrically conductive film transparent with respect to the visible light. As for such a film, an indium tin oxide film, an indium zinc oxide film, or an indium oxide film, a tin oxide film, a gallium zinc oxide film, or the like can be used.

In the above-described solid-state imaging device 7, although not shown in the drawing, the light-shield film to shield a part of the light-receiving portion 12 and the peripheral circuit portion 14 from light, the color filter layer to disperse the light incident on at least the light-receiving portion 12, the condenser lens to condense the incident light on the light-receiving portion 12, and the like are disposed on the film 28 which applies a negative voltage. As for a manufacturing method therefor, as an example, any one of the methods described in the individual examples of the above-described method for manufacturing a solid-state imaging device (first manufacturing method) can also be applied.

In the second example of the above-described method for manufacturing the solid-state imaging device 7 (second manufacturing method), since the film 28, which applies a negative voltage, is formed on the insulating film 27 disposed on the light-receiving surface 12s of the light-receiving portion 12, the hole accumulation (hole accumulation) layer is formed adequately at the interface on the light-receiving surface 12s side of the light-receiving portion 12 by an electric field generated through application of a negative voltage to the film 28, which applies a negative voltage. Therefore, generation of electric charges (electrons) from the interface is suppressed and, in addition, even when electric charges (electrons) are generated from the interface, the electric charges do not flow into a charge storage portion serving as a potential well in the light-receiving portion, flow through the hole accumulation layer 23, in which many holes are present, and can be extinguished. Consequently, it can be prevented that the electric charges resulting from the interface serve as a dark current and are detected by the light-receiving portion 12, and a dark current resulting from the interface state can be suppressed. Moreover, since the film 21, which lowers the interface state, is disposed on the light-receiving surface 12s of the light-receiving portion 12, generation of electrons resulting from the interface state is further suppressed, so that flowing of electrons, which serve as a dark current, resulting from the interface state into the light-receiving portion 12 is suppressed.

In addition, since the film 25, which has a positive fixed charge, is disposed between the above-described peripheral circuit portion 14 and the above-described film 28, which applies a negative voltage, the negative electric field generated when a negative charge is applied to the film 28, which applies a negative voltage, is reduced by a positive fixed charge in the film 25 having the positive fixed charge. Therefore, the influence due to this negative electric field is not exerted on the peripheral circuit portion 14. Consequently, a malfunction of the peripheral circuit portion 14 due to the negative electric field can be prevented. The above-described configuration in which the film 25, which has a positive fixed charge, is disposed above the above-described peripheral circuit portion 14 and under the above-described film 28, which applies a negative voltage, can also be applied to the above-described solid-state imaging device 6, and the effects similar to those of the solid-state imaging device 7 can be obtained.

Next, an embodiment (example) of a solid-state imaging device (third solid-state imaging device) will be described with reference to a key portion configuration sectional view shown in FIG. 32. In this regard, in FIG. 32, the light-receiving portion is shown mainly, and the peripheral circuit portion, a wiring layer, a light-shield film to shield a part of the light-receiving portion and the peripheral circuit portion from light, a color filter layer to disperse the light incident on the light-receiving portion, a condenser lens to condense the incident light on the light-receiving portion, and the like are not shown in the drawing.

Figure 32:
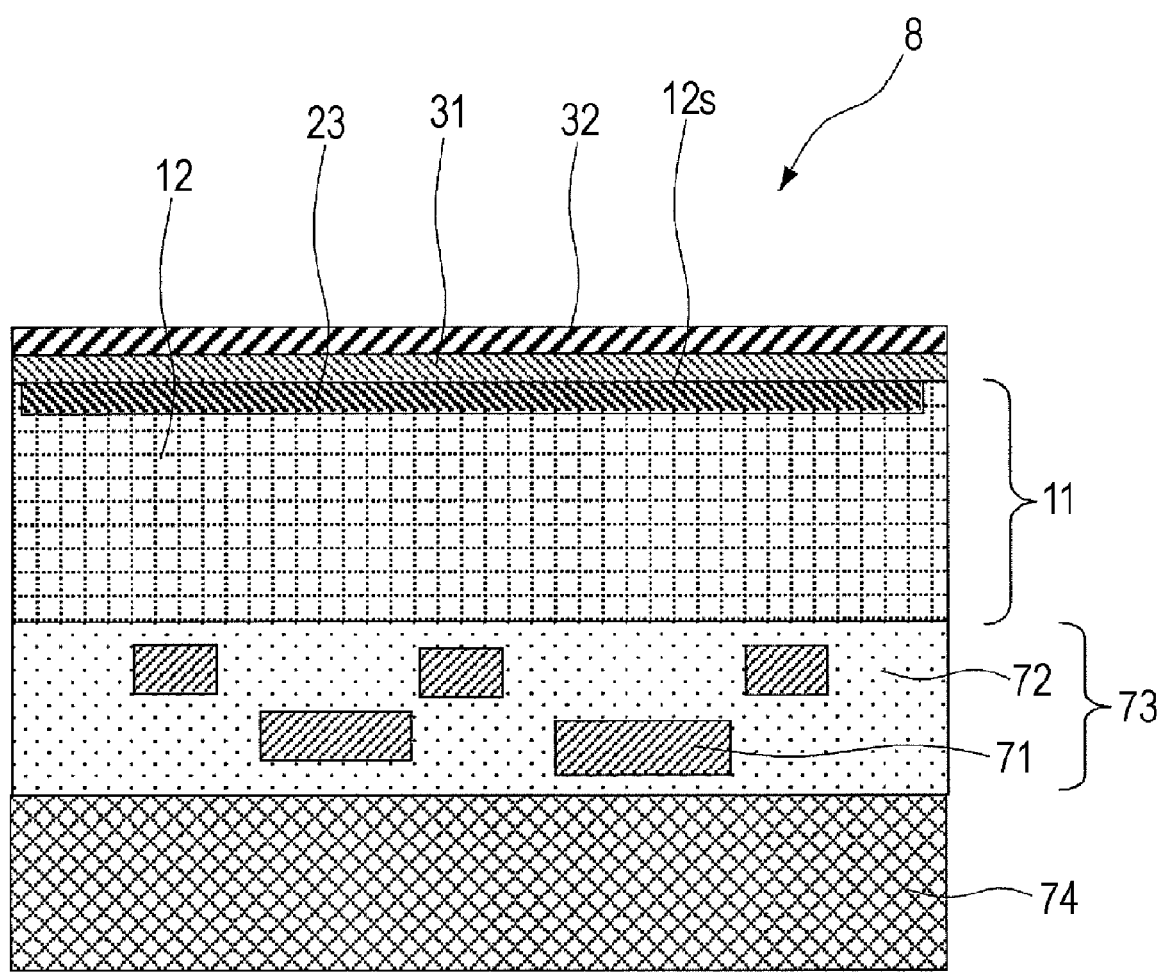
FIG. 32 is a key portion configuration sectional view showing an embodiment (example) of a solid-state imaging device (third solid-state imaging device) according to the present invention.

As shown in FIG. 32, a solid-state imaging device 8 includes the light-receiving portion 12, which photoelectrically converts incident light, on the semiconductor substrate (or semiconductor layer) 11. An insulating film 31 is disposed on the light-receiving surface 12s side of this light-receiving portion 12. This insulating film 31 is formed from, for example, silicon oxide ($SiO_2$) film. A film (hereafter referred to as a hole accumulation auxiliary film) 32, which has a value of work function larger than that of the interface on the light-receiving surface 12s side of the above-described light-receiving portion 12 to conduct photoelectric conversion, is disposed on the above-described insulating film 31. The hole accumulation layer 23 is formed on the basis of this difference in work function. This hole accumulation auxiliary film 32 is not necessarily electrically connected to other elements nor wirings and, therefore, may be an insulating film or a film, e.g., a metal film, having electrical conductivity.

Moreover, a wiring layer 73 composed of, for example, a plurality of wirings 71 and an insulating film 72 is disposed on the side opposite to the light incident side of the semiconductor substrate 11 provided with the above-described light-receiving portion 12. In addition, the wiring layer 73 is supported by a support substrate 74.

For example, since the hole accumulation layer 23 is formed from silicon (Si), the value of work function thereof is about 5.1 eV. Therefore, it is enough that the above-described hole accumulation auxiliary film 32 has the value of work function larger than 5.1.

For example, in the case where a metal film is used, according to Chronological Scientific Tables, the value of work function of an iridium (110) film is 5.42, the value of work function of an iridium (111) film is 5.76, the value of work function of a nickel film is 5.15, the value of work function of a palladium film is 5.55, the value of work function of an osmium film is 5.93, the value of work function of a gold (100) film is 5.47, the value of work function of a gold (110) film is 5.37, and the value of work function of a platinum film is 5.64. These films can be used as the above-described hole accumulation auxiliary film 32. Even films other than those described above can be used as the hole accumulation auxiliary film 32 insofar as the film is a metal film having a value of work function larger than that of the interface on the light-receiving surface 12s side of the light-receiving portion 12. In this connection, the value of work function of ITO ($In_2O_3$) used as a transparent electrode is assumed to be 4.8 eV. The work function of an oxide semiconductor can be controlled by a film formation method or impurity introduction.

The above-described hole accumulation auxiliary film 32 is disposed on the light incident side and, therefore, it is important to be formed having a film thickness suitable for transmitting the incident light. As for the incident light transmittance thereof, it is preferable to have as high transmittance as possible. For example, it is preferable that the transmittance of 95% or more is ensured.

Furthermore, it is enough that the hole accumulation auxiliary film 32 can make use of the difference in work function from that of the surface of the light-receiving portion 12, and there is no lower limit for the resistance value. Therefore, even in the case where, for example, an electrically conductive film is used, it is not necessary to form having a large film thickness. For example, when the incident light intensity is assumed to be $I_0$ and the absorption coefficient is assumed to be $\alpha$ (where $\alpha=(4\pi k)/\lambda$, k is a Boltzmann constant, and $\lambda$ is a wavelength of incident light), the light intensity at the position of depth z is represented by $I(z)=I_0\exp(-\alpha\cdot z)$. Consequently, the thickness at $I(z)/I_0=0.8$ is determined to be, for example 1.9 nm for the iridium film, 4.8 nm for the gold film, and 3.4 nm for the platinum film, although different depending on the type of film. However, it is clear that 2 nm or less is preferable.

Moreover, the above-described hole accumulation auxiliary film 32 may be an organic film. For example, polyethylenedioxythiophene (polyethylenedioxythiophene) can also be used. As described above, the above-described hole accumulation auxiliary film 32 may be an electrically conductive film, an insulating film, or a semiconductor film insofar as the film has the value of work function higher than the value of work function of the interface on the light-receiving surface 12s side of the light-receiving portion 12.

The above-described solid-state imaging device 8 includes the film (hole accumulation auxiliary film) 32, which has a value of work function larger than that of the interface on the light-receiving surface 12s side of the above-described light-receiving portion 12 on the insulating film 31 disposed on the light-receiving portion 12 and, thereby, the hole accumulation efficiency of the hole accumulation layer 23 is increased, so that the hole accumulation layer 23 disposed at the light-receiving side interface of the light-receiving portion 12 can accumulate adequate holes. Consequently, a dark current is reduced.

Figure 33:
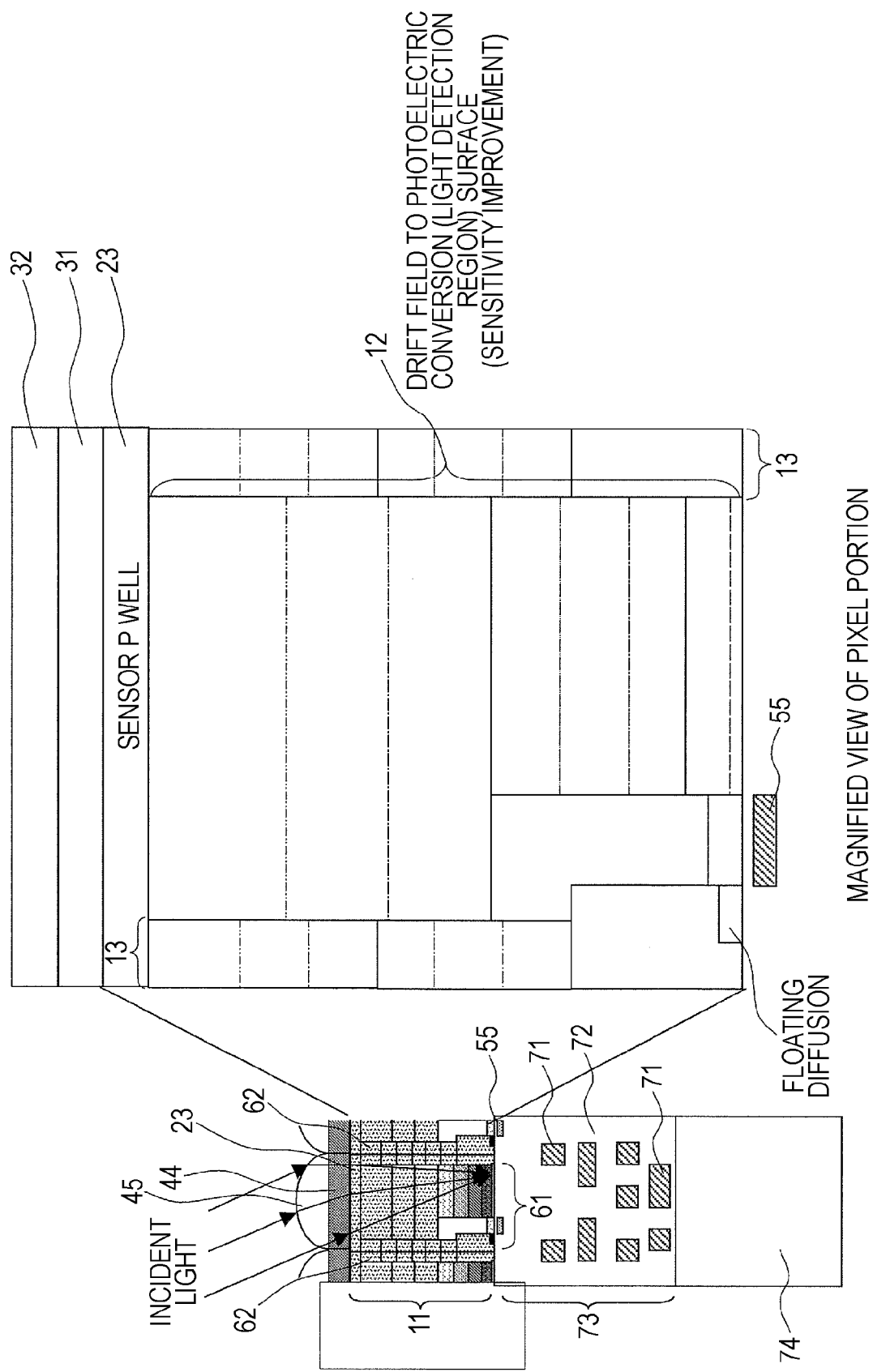
FIG. 33 is a key portion configuration sectional view showing an example of the configuration of a solid-state imaging device including a hole accumulation auxiliary film.

Next, an example of the configuration of a solid-state imaging device including the hole accumulation auxiliary film 32 will be described with reference to FIG. 33. FIG. 33 shows a CMOS image sensor.

As shown in FIG. 33, a plurality of pixel portions 61 including the light-receiving portion (for example, photodiode) 12 which converts the incident light to an electric signal, a transistor group 55 composed of transfer transistors, amplifying transistors, reset transistors, etc., (a part of them are shown in the drawing), and the like are disposed on the semiconductor substrate 11. As for the above-described semiconductor substrate 11, for example, a silicon substrate is used. Furthermore, a signal processing portion (not shown in the drawing) to process the signal charges read from the individual light-receiving portions 12 is disposed.

The element isolation regions 13 are disposed in a part of the circumference of the above-described pixel portion 61, for example, between the pixel portions 61 in the longitudinal direction or the transverse direction.

In addition, the wiring layer 73 is disposed on the surface side of the semiconductor substrate 11 (in the drawing, under the semiconductor substrate 11) provided with the above-described light-receiving portions 12. This wiring layer 73 is composed of the wirings 71 and the insulating film 72 covering the wirings 71. The above-described wiring layer 73 is provided with the support substrate 74. This support substrate 74 is formed from, for example, a silicon substrate.

Furthermore, in the above-described solid-state imaging device 8, the hole accumulation layer 23 is disposed on the back surface side of the semiconductor substrate 11, and the above-described hole accumulation auxiliary film 32 is disposed on the upper surface thereof with the insulating film 31 therebetween. Moreover, an organic color filter 44 is disposed thereon with an insulating film (not shown in the drawing) therebetween. This color filter 44 is disposed in accordance with the above-described light-receiving portion 12 and is formed by, for example, arranging blue (Blue), red (Red), and green (Green) organic color filters in a checkered pattern, for example. In addition, a condenser lens 45 to condense incident light on each light-receiving portion 12 is disposed on each organic color filter 44.

Figure 34:
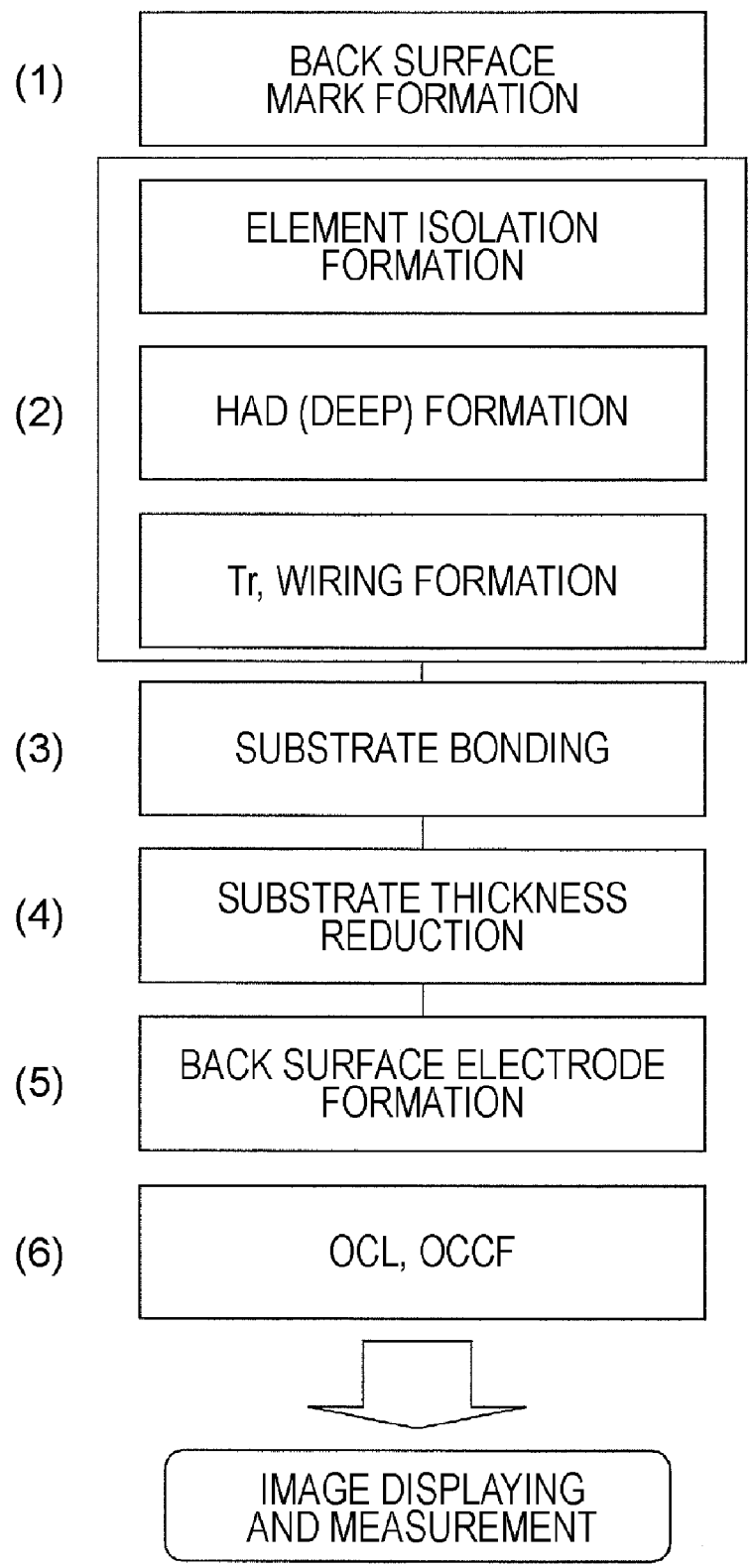
FIG. 34 is a flow chart showing an embodiment (third example) of a method for manufacturing a solid-state imaging device (third manufacturing method) according to the present invention.
Figure 35:
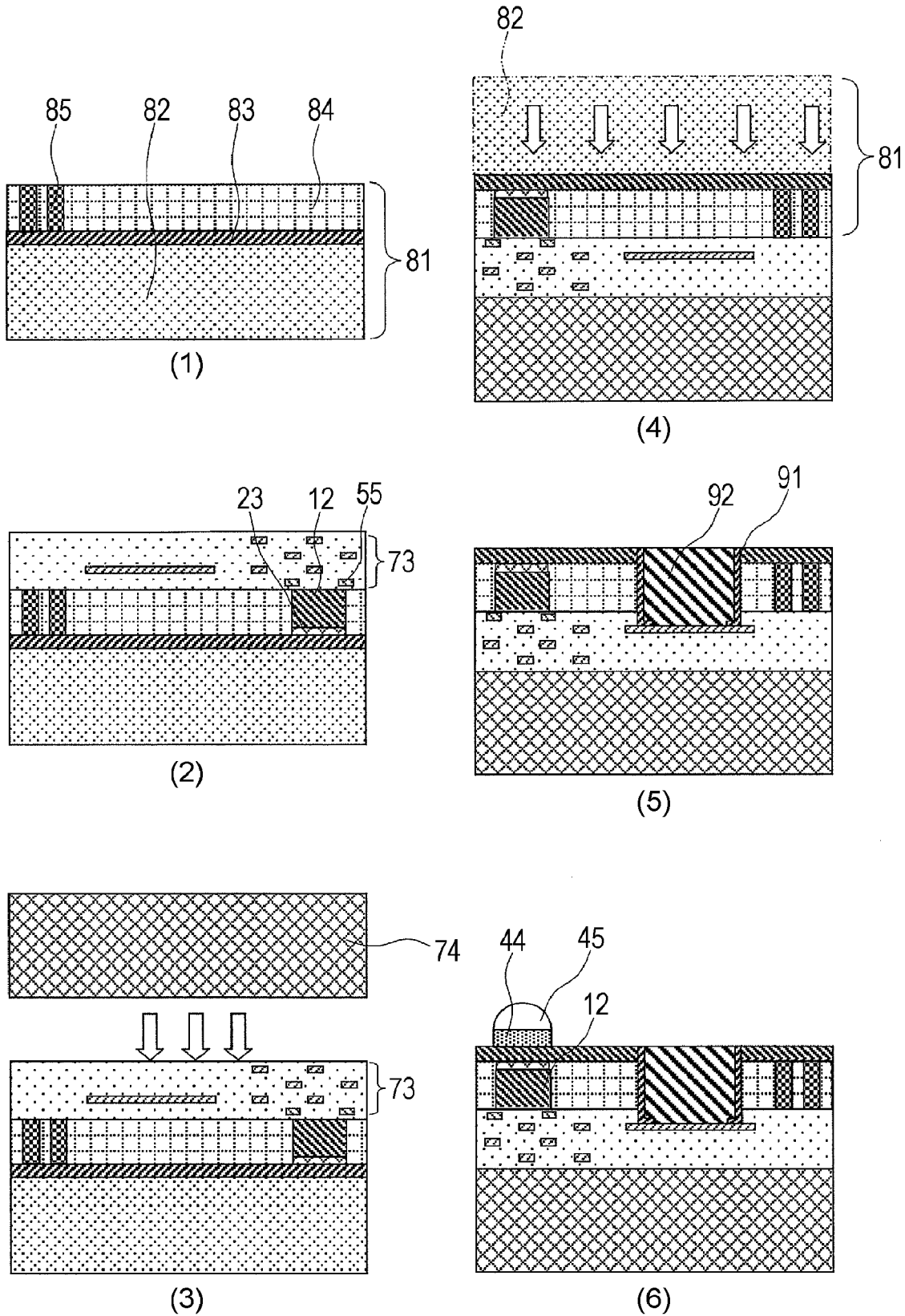
FIG. 35 is a production step sectional view showing an embodiment (third example) of the method for manufacturing a solid-state imaging device (third manufacturing method) according to the present invention.

Next, an embodiment (first example) of the method for manufacturing a solid-state imaging device (third manufacturing method) according to the present invention will be described with reference to a flow chart shown in FIG. 34, production step sectional views shown in FIG. 35, and production step sectional views of a key portion shown in FIG. 36. In FIG. 34 to FIG. 36, production steps of the above-described solid-state imaging device 8 are shown as an example.

As shown in FIG. 34 (1) and FIG. 35 (1), initially, an SOI substrate 81, in which a silicon layer 84 is disposed on a silicon substrate 82 with an insulating layer (for example, silicon oxide layer) 83 therebetween, is prepared, and a back surface mark 85 for alignment is formed in the silicon layer 84.

Subsequently, as shown in FIG. 34 (2) and FIG. 35 (2), formation of an element isolation region (not shown in the drawing), formation of the hole accumulation layer 23, formation of the light-receiving portion 12, formation of the transistor group 55, formation of the wiring layer 73, and the like are conducted on the silicon layer 84 of the SOI substrate 81. Among them, the hole accumulation layer 23 may be formed in a step after substrate thickness reduction in the downstream.

Then, as shown in FIG. 34 (3) and FIG. 35 (3), the wiring layer 73 and the support substrate 74 are bonded together.

Thereafter, as shown in FIG. 34 (4) and FIG. 35 (4), thickness reduction of the SOI substrate 81 is conducted. Here, the silicon substrate 82 is removed through, for example, grinding and polishing.

Although not shown in the drawing, the above-described hole accumulation layer 23 may be formed by forming a cap film (not shown in the drawing) after removal of the insulating layer 83 from the SOI substrate 81 and conducting impurity introduction and an activation treatment. As an example, a plasma-TEOS silicon oxide film having a thickness of 30 nm is formed as the cap film and the impurity introduction is conducted through ion implantation of boron. As for the ion implantation condition, for example, implantation energy is set at 20 keV, and the amount of dose is set at $1 \times 10^{13}/cm^2$. In this connection, it is preferable that activation is conducted through annealing at 400° C. or lower in such a way that bonding between the wiring layer 73 and the support substrate 74 is not broken. Subsequently, the above-described cap layer is removed through, for example, a dilute hydrofluoric acid treatment. At this time, the insulating layer 83 may be removed from the SOI substrate 81.

In this manner, as shown in FIG. 36 (1), the hole accumulation layer 23 is formed on the light-receiving portion 12.

Next, as shown in FIG. 36 (2), the insulating film 31 is formed on the hole accumulation layer 23 (light incident side). As an example, a plasma-TEOS silicon oxide film having a thickness of 30 nm is formed.

Then, as shown in FIG. 36 (3), the hole accumulation auxiliary film 32, which is a film having a value of work function larger than that of the interface (the value of work function is about 5.1 eV) on the light-receiving surface 12s side of the above-described light-receiving portion 12, is formed on the above-described insulating film 31 (light incident side). As an example, a platinum (Pt) film, which is a metal thin film and which has a value of work function of 5.6 eV, is formed having a thickness of 3 nm through sputtering. Examples of candidates for other metal thin films include iridium (Ir), rhenium (Re), nickel (Ni), palladium (Pd), cobalt (Co), ruthenium (Ru), rhodium (Rh), osmium (Os), and gold (Au). Alloys can be employed, as a matter of course.

In this connection, as for the material for the above-described hole accumulation auxiliary film 32 in this example, even ITO ($In_2O_3$) can also be employed because the value of work function of the interface on the light-receiving surface side of the light-receiving portion is about 5.1 eV. ITO can have a value of work function of 4.5 eV to 5.6 eV depending on the film formation process. Furthermore, as for other oxide semiconductors, since semiconductors, in which $RuO_2$, $SnO_2$, $IrO_2$, $OsO_2$, $ZnO$, $ReO_2$, $MoO_2$, and acceptor impurities are introduced, polyethylenedioxythiophene (polyethylenedioxythiophene: PEDOT), which is an organic material, and the like are allowed to have values of work function larger than 5.1 eV, they can serve as materials for the hole accumulation auxiliary film 32. Moreover, examples of film formation techniques include ALD, CVD, and vapor phase doping as film formation techniques at 400° C. or lower.

Subsequently, as shown in FIG. 34 (5) and FIG. 35 (5), a back surface electrode 92 is formed through the medium of barrier metal 91.

Then, as shown in FIG. 34 (6) and FIG. 35 (6), the color filter layer 44 is formed above the light-receiving portion 12 and, thereafter, the condenser lens 45 is formed. In this manner, the solid-state imaging device 8 is formed.

In the above-described method for manufacturing a solid-state imaging device (third manufacturing method), since the hole accumulation auxiliary film 32, which is a film having a value of work function larger than that of the interface on the light-receiving surface 12s side of the above-described light-receiving portion 12, is formed on the insulating film 31 disposed on the light-receiving portion 12, the hole accumulation efficiency of the hole accumulation layer 23 is increased, so that the hole accumulation layer 23 disposed at the light-receiving surface 12s side interface of the light-receiving portion 12 can accumulate adequate holes. Consequently, a dark current is reduced. In this connection, it is enough that the above-described hole accumulation auxiliary film 32 has the value of work function higher than the value of work function of the hole accumulation layer 23 and it is not necessary to pass a current. Therefore, an electrically conductive film, an insulating film, or a semiconductor film may be employed. Hence, a material exhibiting high resistance can be selected for the hole accumulation auxiliary film 32. In addition, there is a feature that an external signal input terminal is unnecessary for the hole accumulation auxiliary film 32.

The solid-state imaging devices 1 to 8 of the above-described individual examples are provided with a plurality of pixel portions including the light-receiving portions to convert the amounts of incident light to electric signals and wiring layers on one surface side of the semiconductor substrates including the individual pixel portions, and can be applied to a back-side illumination solid-state imaging device having a configuration in which the light incident from the side opposite to the surface provided with the wiring layer is received with the above-described individual light-receiving portions. As a matter of course, it is possible to apply to a surface illumination solid-state imaging device, wherein a wiring layer is disposed on the light-receiving surface side and an optical path of the incident light incident on the light-receiving portion is specified to be a region, in which the above-described wiring layer is not disposed, in order that the incident light incident on the light-receiving portion is not interfered.

Next, an embodiment (example) according to an imaging apparatus of the present invention will be described with reference to a block diagram shown in FIG. 37. Examples of this imaging apparatuses include video cameras, digital steel cameras, and cameras of cellular phones.

Figure 37:
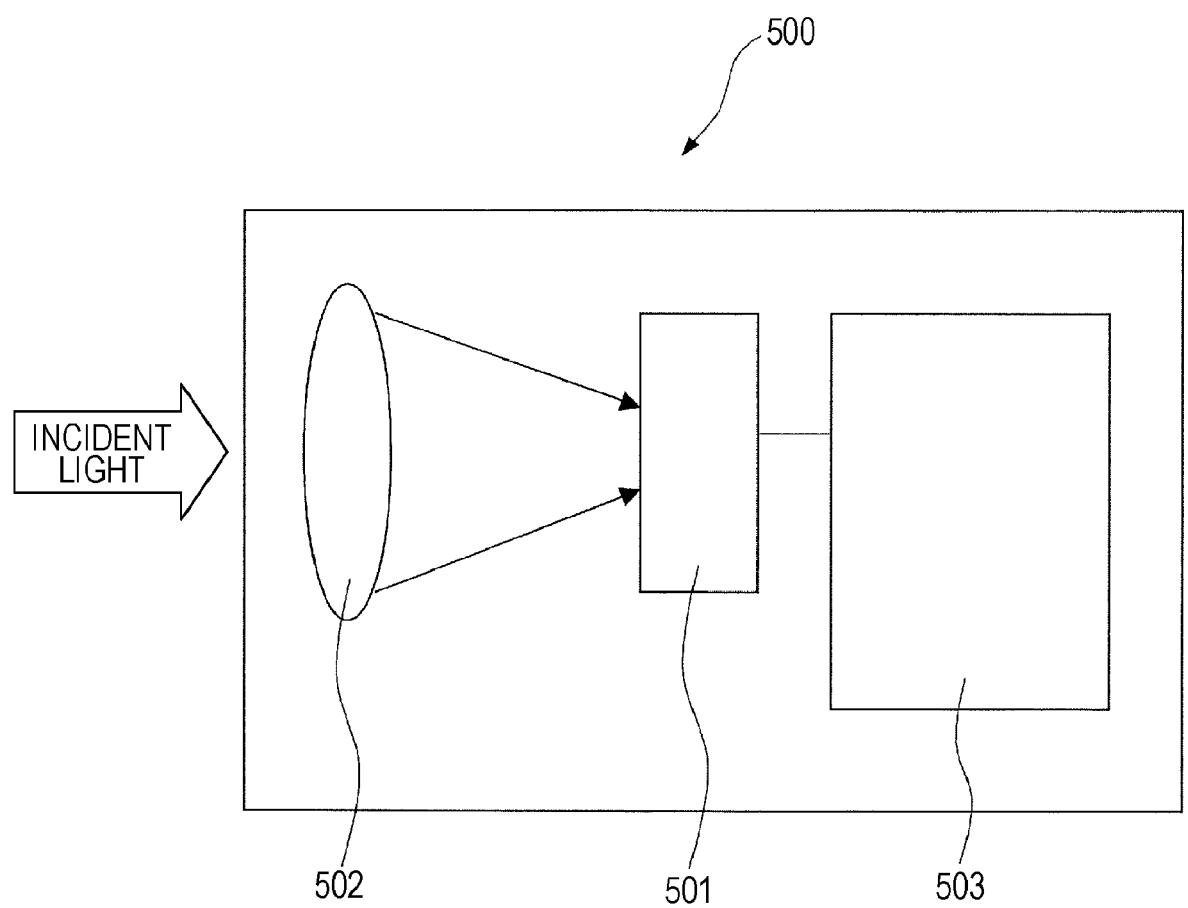
FIG. 37 is a block diagram showing an embodiment (example) of a imaging apparatus according to the present invention.

As shown in FIG. 37, an imaging apparatus 500 is provided with a solid-state imaging device (not shown in the drawing) in an imaging portion 501. An image-focusing optical portion 502 to form an image is provided on the light-condensing side of the imaging portion 501. Furthermore, the imaging portion 501 is connected to a drive circuit to drive it and a signal processing portion 503 including, for example, a signal processing circuit to process a signal, which is photoelectrically converted with the solid-state imaging device, to an image. Moreover, an image signal processed with the above-described signal processing portion can be stored in an image storage portion (not shown in the drawing). In the above-described imaging apparatus 500, the solid-state imaging device 1 to the solid-state imaging device 8 explained in the above-described embodiments can be used for the above-described solid-state imaging device.

The solid-state imaging device 1 or the solid-state imaging device 2 according to the present invention or the solid-state imaging device having the configuration shown in FIG. 4, described above, in which the reflection film is disposed and the condenser lens is included, is used for the imaging apparatus 500 according to the present invention. Therefore, in a manner similar to that described above, since the solid-state imaging device capable of enhancing the color reproducibility and the resolution is used, there is an advantage that a high-quality image can be recorded.

Incidentally, the imaging apparatus 500 according to the present invention is not limited to the above-described configuration, but can be applied to an imaging apparatus having any configuration including the solid-state imaging device.

The above-described solid-state imaging device 1 to the solid-state imaging device 8 and the like may be made in the form of one chip or in the form of a module, in which an imaging portion and a signal processing portion or an optical system are integrally packaged and which has an imaging function. In addition, the present invention can be applied to not only solid-state imaging devices, but also imaging apparatuses. In this case, as for the imaging apparatus, an effect of improving image quality is obtained. Here, the imaging apparatus refers to, for example, a portable apparatus having a camera or an imaging function. In this regard, "imaging" includes not only picking up of image in usual photo shooting with a camera, but also fingerprint detection and the like in a broad sense.

The invention claimed is:

1. A solid-state imaging device comprising a light-receiving portion operative to photoelectrically convert incident light includes:
 a first film over a light-receiving surface of the light-receiving portion, the first film formed by a material selected from the group consisting of a hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide, yttrium oxide, hafnium nitride, aluminum nitride, hafnium oxide nitride, and aluminum oxide nitride;
 a second film of approximately 1 nm thickness between the light-receiving surface and the first film; and
 a hole accumulation layer at the light-receiving surface side of the light-receiving portion, the hole accumulation layer created due to the existence of the first film.

2. The solid-state imaging device according to claim 1, wherein the second film is a silicon oxide layer.

3. The solid-state imaging device according to claim 1, wherein the first film is formed by atomic layer deposition.

4. The solid-state imaging device according to claim 1, wherein the first film is formed by atomic layer deposition and the first and second films are formed simultaneously.

5. The solid-state imaging device according to claim 1, comprising a fourth layer over the second layer.

6. The solid-state imaging device according to claim 5, wherein the fourth layer is a silicon dioxide layer.

7. An imaging apparatus characterized by comprising:
 a light-condensing optical portion which condenses incident light;
 a solid-state imaging device, operative to receive and photoelectrically convert the incident light condensed in the light-condensing optical portion into a signal charge; and
 a signal processing portion, operative to process the signal charge,
 wherein the solid-state imaging device includes
  (a) a first film on or over a light-receiving surface of the light-receiving portion, the first film formed by a material selected from the group consisting of a hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide, yttrium oxide, hafnium nitride, aluminum nitride, hafnium oxide nitride, and aluminum oxide nitride;
  (b) a second film of approximately 1 nm thickness between the light-receiving surface and the first film; and
  (c) a hole accumulation layer at the light-receiving surface side of the light-receiving portion, the hole accumulation layer created due to the existence of the first film.

8. The imaging apparatus of claim 7, wherein the second film is a silicon oxide layer.

9. The imaging apparatus of claim 7, wherein the first film is formed by atomic layer deposition.

10. The imaging apparatus of claim 7, wherein the first film is formed by atomic layer deposition and the first and second films are formed.

11. The imaging apparatus of claim 7 comprising a fourth layer over the second layer.

12. The imaging apparatus of claim 11, wherein the fourth layer is a silicon dioxide layer.

13. A method for manufacturing a solid-state imaging device having a light-receiving portion operative to photoelectrically convert incident light comprising:
 using atomic layer deposition, forming a first film on or over a light-receiving surface of the light-receiving portion; and
 while forming the first film, forming a second film between the light-receiving surface and the first film,
 wherein,
  a hole accumulation layer is formed at the light-receiving surface of the light-receiving portion due to the existence of the first film, and
  the first film is formed by a material selected from the group consisting of a hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide, yttrium oxide, hafnium nitride, aluminum nitride, hafnium oxide nitride, and aluminum oxide nitride.

14. The method of claim 13, wherein the second film is a silicon oxide layer.

15. The method of claim 13, comprising forming a fourth layer over the second layer.

16. The method of claim 15, wherein the fourth layer is a silicon dioxide layer.

* * * * *